(12) United States Patent
Potega

(10) Patent No.: US 6,634,896 B1
(45) Date of Patent: Oct. 21, 2003

(54) METHOD AND APPARATUS FOR TRANSFERRING ELECTRICAL SIGNALS AMONG ELECTRICAL DEVICES

(76) Inventor: Patrick Potega, 7021 Vicky Ave., West Hills, CA (US) 91307-2314

( * ) Notice: Subject to any disclaimer, the term of this patent is extended or adjusted under 35 U.S.C. 154(b) by 0 days.

(21) Appl. No.: 09/378,781

(22) Filed: Aug. 23, 1999

Related U.S. Application Data

(63) Continuation-in-part of application No. 09/193,790, filed on Nov. 17, 1998, now Pat. No. 6,459,175, and a continuation-in-part of application No. 09/105,489, filed on Jun. 26, 1998, now Pat. No. 6,152,597.
(60) Provisional application No. 60/114,412, filed on Dec. 31, 1998, provisional application No. 60/114,398, filed on Dec. 31, 1998, provisional application No. 60/055,883, filed on Aug. 15, 1998, and provisional application No. 60/051,035, filed on Jul. 27, 1997.

(51) Int. Cl.[7] .............................................. H01R 27/00
(52) U.S. Cl. ........................................ 439/218; 439/669
(58) Field of Search ................................. 439/218, 669, 439/221–224, 217

(56) References Cited

U.S. PATENT DOCUMENTS

| | | | | |
|---|---|---|---|---|
| 3,289,149 A | * | 11/1966 | Pawloski | .................. 439/669 |
| 3,772,545 A | * | 11/1973 | Hatschek et al. | ........... 439/669 |
| 3,829,814 A | * | 8/1974 | Straus | ......................... 439/669 |
| 4,158,472 A | * | 6/1979 | Seiden et al. | ................ 439/669 |
| 4,420,216 A | * | 12/1983 | Motoyama et al. | .......... 439/669 |
| 4,487,466 A | * | 12/1984 | Petit et al. | ................... 439/222 |
| 4,934,367 A | * | 6/1990 | Daglow et al. | .............. 439/527 |
| 5,475,626 A | * | 12/1995 | Viletto | ...................... 364/708.1 |
| 6,146,210 A | * | 11/2000 | Cha et al. | .................... 439/680 |

* cited by examiner

Primary Examiner—Lynn D. Feild
Assistant Examiner—Hae Moon Hyeon

(57) ABSTRACT

An apparatus for a power and/or data I/O port, comprised of a connector assembly (400 in FIG. 21A) which has male plug (433) with conductors (437, 435, 439, and 441), insulators (443, 438), and a female receptacle (414) with conductors (417, 419, and 421), and related elements (423) that create different electrical paths than had previously been present in electrical and electronic host devices. These newly-created electrical paths enable host devices and peripherals—such as a battery pack (450) and its battery power source (413), as well as one or more external power sources—to perform power and/or data functions in ways they could not without such an apparatus. By locating a connector assembly (400) in replaceable modules, such as a battery pack (450), users can upgrade and enhance the functionality of a multiplicity of existing (and future) electronic and electrical goods.

42 Claims, 24 Drawing Sheets

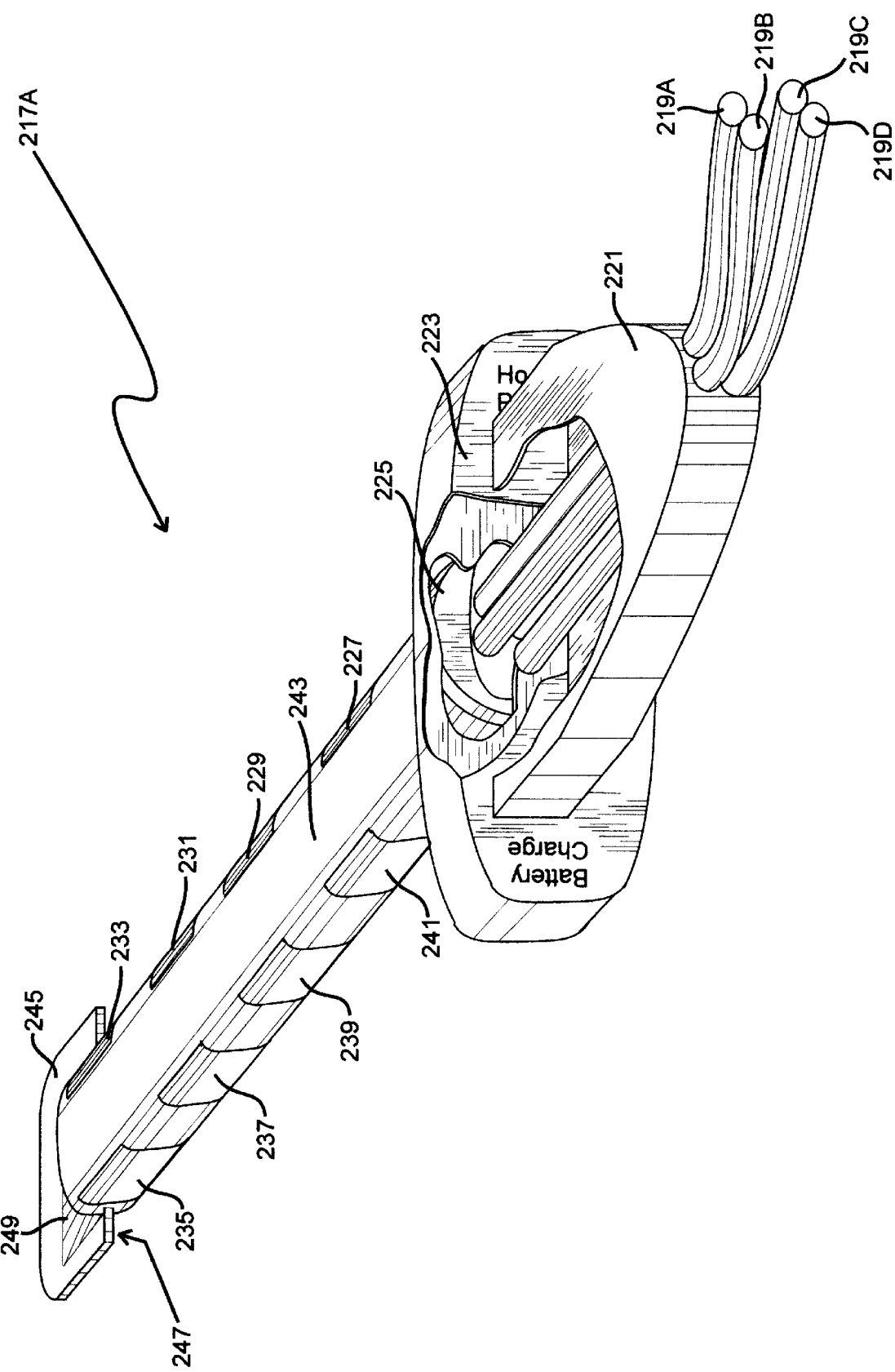

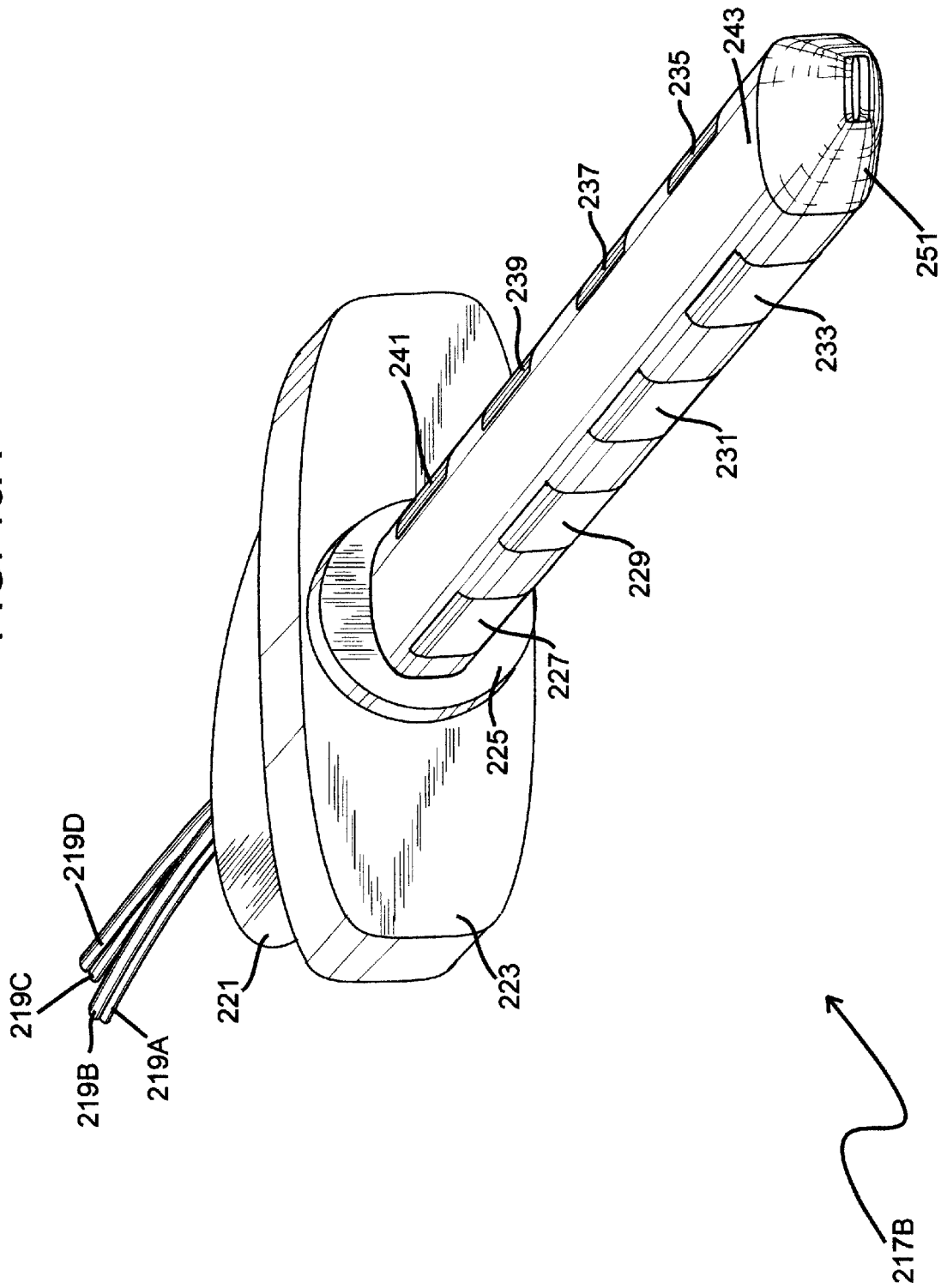

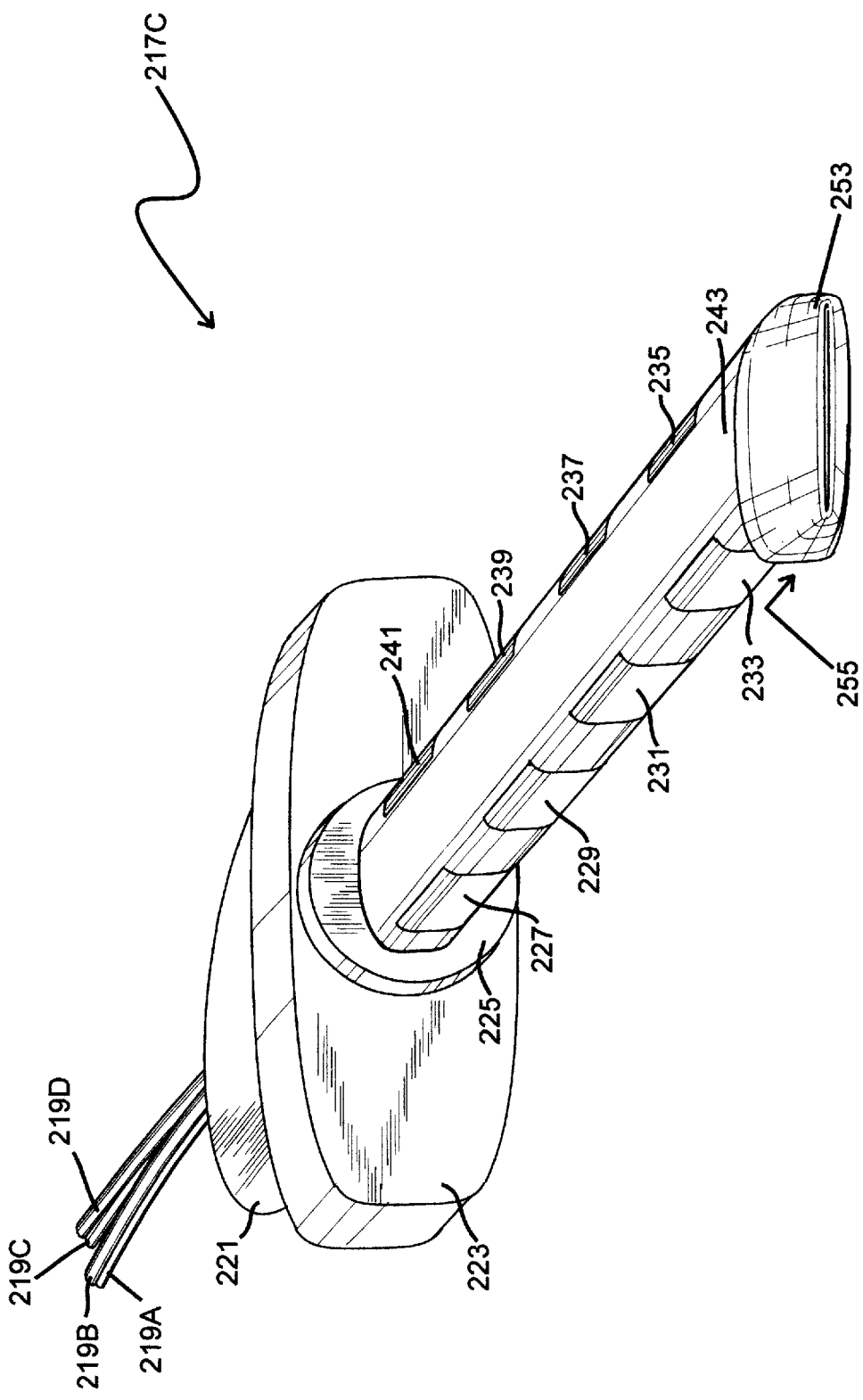

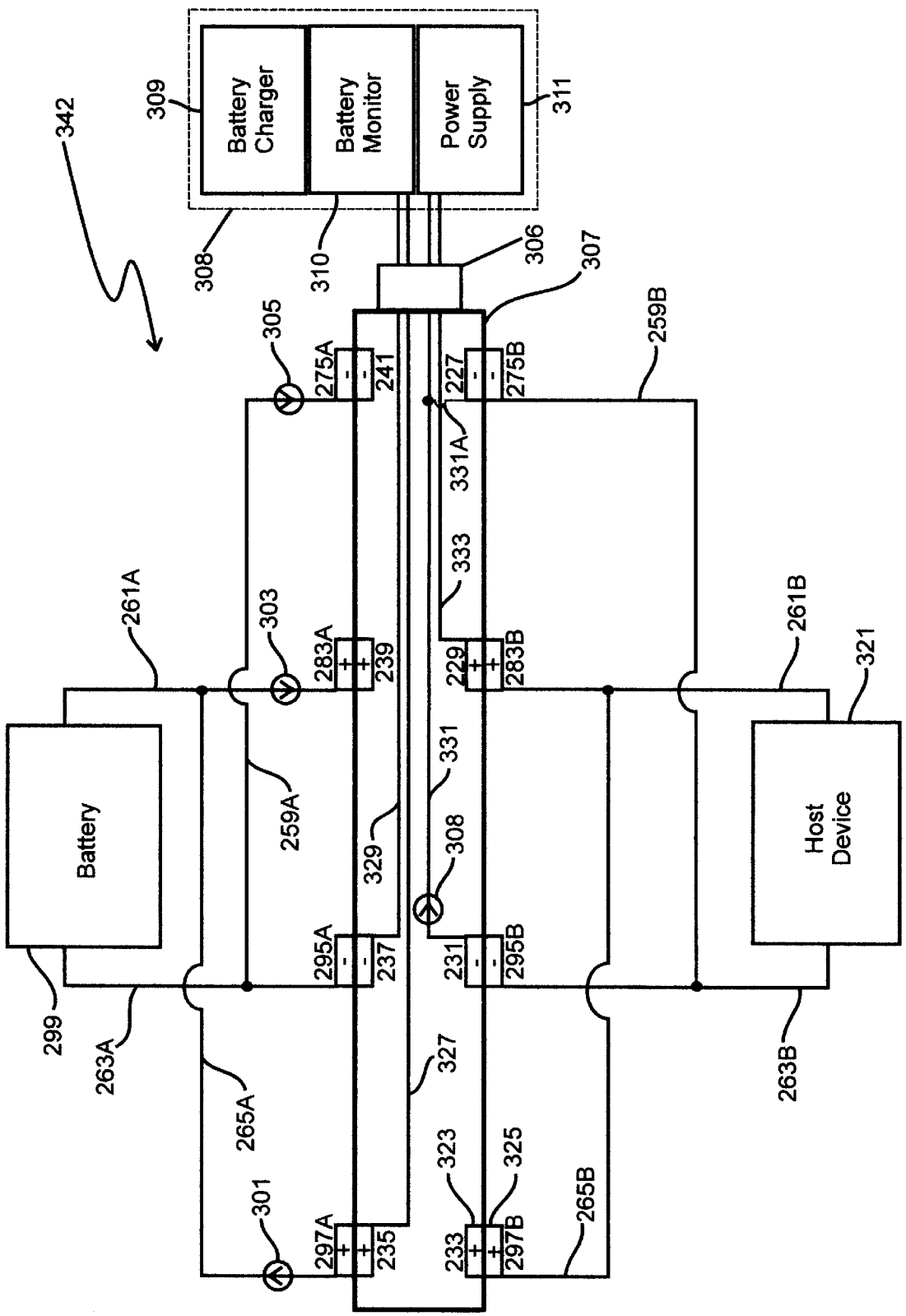

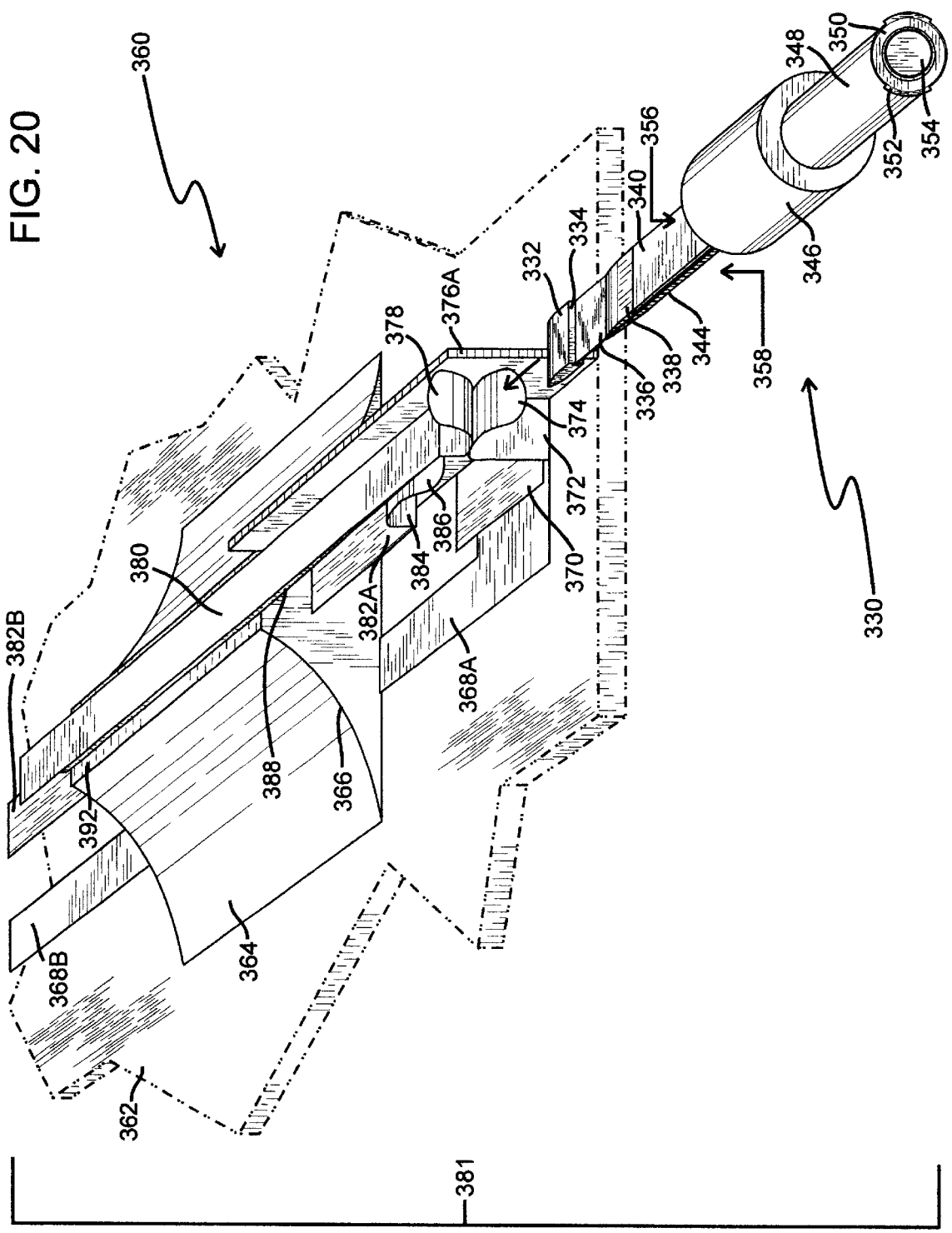

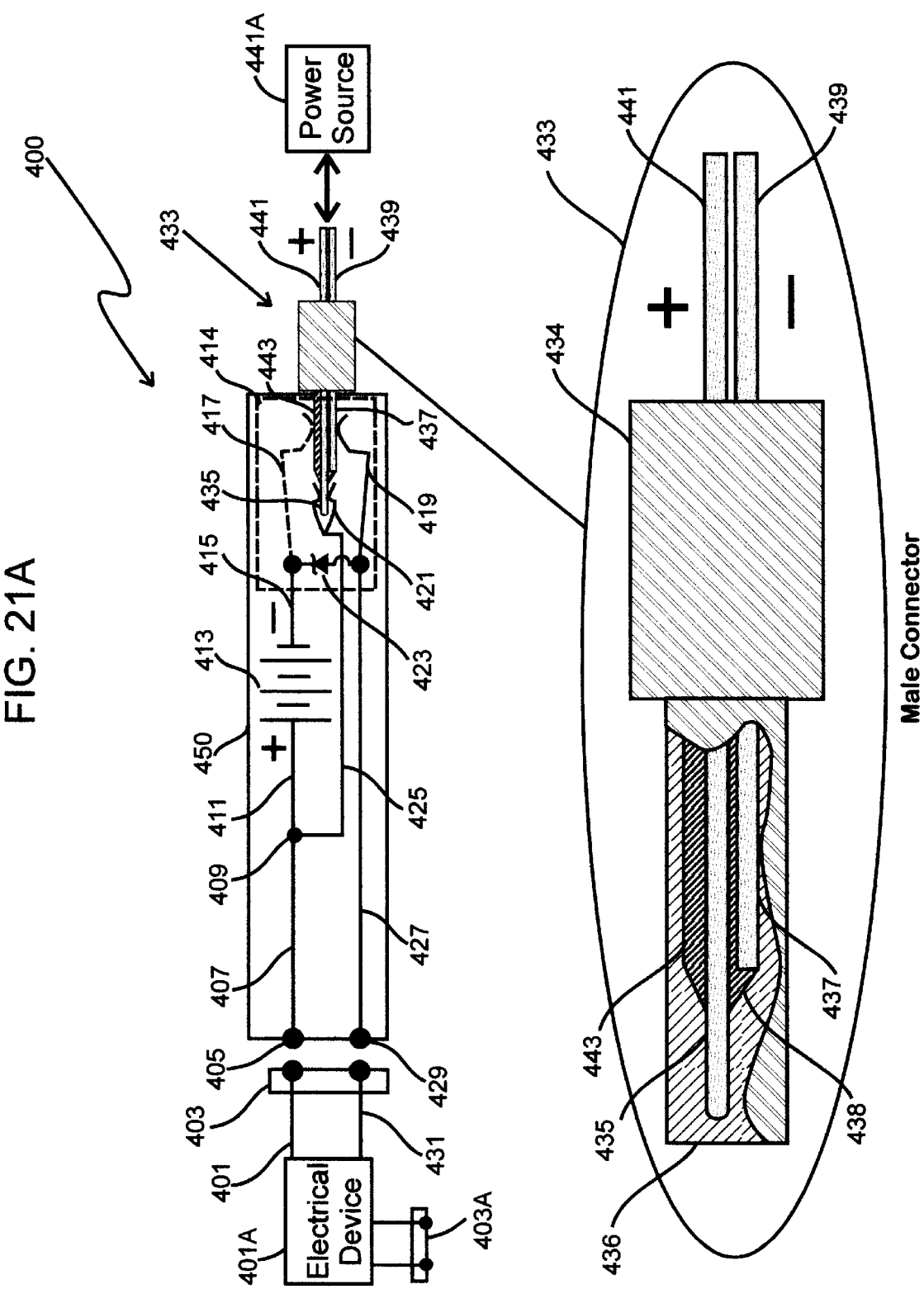

METHOD AND APPARATUS FOR TRANSFERRING ELECTRICAL SIGNALS AMONG ELECTRICAL DEVICES

CROSS-REFERENCE TO RELATED APPLICATIONS

This application is a CIP of "Apparatus for Monitoring Temperature of a Power Source," filed previously as U.S. patent application Ser. No. 09/105,489, dated Jun. 26, 1998, and subsequently as U.S. Pat. No. 6,152,597 issued Nov. 28, 2000; and claims the benefit of previously filed U.S. Provisional Patent Application No. 60/051,035, dated Jun. 27, 1997, and "A Resistive Ink-Based Thermistor," U.S. Provisional Patent Application No. 60/055,883, dated Aug. 15, 1997, as well as International Patent Application No. PCT/US98/12807, dated Jun. 26, 1998; and further claims the benefit of "Apparatus for a Power and/or Data I/O," U.S. Provisional Patent Application No. 60/097,748, filed Aug. 24, 1998; "Hardware to Configure Battery and Power Delivery Software," U.S. Provisional Patent Application No. 60/114,412, dated Dec. 31, 1998; "Software to Configure Battery and Power Delivery Hardware," U.S. Provisional Patent Application No. 60/114,398, dated Dec. 31, 1998; and a continuation-in-part "Universal Power Supply," U.S. patent application Ser. No. 09/193,790, dated Nov. 17, 1998 (also as International Patent Application No. PCT/US98/24403, dated Nov. 17, 1998), now U.S. Pat. No. 6,459,175, which claims benefit of U.S. Provisional Patent Application No. 60/065,773, dated Nov. 17, 1997.

BACKGROUND OF THE INVENTION

Devices that have removable battery packs, such as laptop computers, personal audio and video players, etc., most often have two power input jacks. The first power-input port is obvious . . . it is where the connector from the external wall adapter, AC/DC power-conversion adapter, DC/DC automotive cigarette-lighter adapter, external battery charger, etc., is plugged in.

The second power-input port is not so obvious . . . it is where a removable battery pack connects to its associated host device. Usually, this is a power (or mixed-signal power and data) connector hidden in a battery bay, or expressed as a cord and connector inside a battery compartment, such as is found in some cordless phones. The connector between a battery pack and its associated host device may simply be a group of spring contacts and a mating set of contact pads. This second power port is not used for external power (a host's removable battery power source is usually not classified as "external" power). The battery power port is so unrecognized that even supplemental external "extended run-time" battery packs, as are available from companies like Portable Energy Products, Inc. (Scotts Valley, Calif.), connect to the same traditional power jack to which the external power supply does.

The connector assembly herein exploits this un-utilized battery-to-host interface in a number of ways. As will be seen, a battery pack's power port is, in many ways, a far more logical power interface than the traditional power-input jack. By using a flexible and scaleable connector that is small enough to be enclosed within a battery pack housing, and providing sufficient connector contacts to handle power, the usefulness of external power devices and the battery pack itself can be enhanced.

Also, "smart" battery packs support connectors that are mixed signal, i.e., both power and data, therefore external power devices can data communicate with host devices and smart batteries, often facilitating device configuration, operation and power monitoring.

Some of the reasons why the battery-contact interface isn't used are that it's often inaccessible. In laptop computers, for example, the battery-to-host-device connector is often buried deep in a battery bay. The connector assembly described in this document is built into the battery pack itself, at a location where easy access to a connector is available. Where appropriate, conductors from a non-removable battery are routed to an accessible location on the host device. Even when the location of the connector assembly is remote from the battery pack, the interface addressed is that between the battery pack and its associated connector on the host device.

Another reason for the lack of attention to the battery's power connector is that the type of connector used between a battery and its host device is not usually of the design and style that would easily lend itself to being attached to the end of a power cord. A good example of how awkward such battery access connectors can be is the "empty" battery housing with power cord that is popular with camcorders. The camcorder's "faux" battery pack shell snaps into the normal battery pack mount, and there is usually a hardwired cord to a power-conversion adapter. This makes for a considerable amount of bulky goods to transport. That is the case with cellular phones, as well, with "empty" battery housings that plug into an automotive cigarette lighter, or a battery pack with an integrated charger. These are often bulkier than the battery pack they replace and, almost always, one must have a unique assembly—complete with cords—dedicated to a specific make or model of cellular phone.

The connector assemblies shown in the various figures, and described herein, are designed to be of the look and style normally associated with power and or data cords. Barrel-style connectors, and segmented-pin-types are common connector styles. By defining new barrel connectors that feature segmented contacts, or using segmented pin connectors in wiring schemes that create new connectivity paths, hitherto unknown ways of dealing with safety through power subsystem configurations are achieved. No bulky external add-ons are used. Instead, miniaturized connectors that can be embedded within an existing battery pack define new ways of powering battery-powered devices.

The battery packs discussed here are not empty battery enclosures, with only pass-through wiring. The original battery cells, circuit boards, fuses, etc., are all present and the connectors shown herein provide means to have a battery pack operate normally when the male plugs are removed (or replaced).

Battery Pack Removal

Another reason a battery port connector is not used is that to access this unexploited power port would require removing the battery pack, which would result in the loss of available battery power. Some host devices require that a battery pack be present, as the battery may be serial-wired. Also, host devices are known that use the battery pack as a "bridge" battery that keeps CMOS, clocks, etc., functioning. Battery removal could negatively impact such devices. Removing a battery pack also results in even more bulky things to carry around, which hardly fits the travel needs of someone carrying a laptop or other mobile device.

By embedding connectors in the battery pack, no circuits are created within the host devices. This is useful because battery packs are virtually always removable and replaceable. Instead of having to pre-plan and design-in new power and data paths into a host device, the replaceable battery pack contains these power and data paths. Simply replacing a battery pack upgrades any host device. By placing the technology in a fully-functional battery pack, it is not necessary to remove the battery pack during connector operations . . . instead, keeping the battery pack in its host device, where it belongs, is essential.

Devices that use external power-conversion adapters invariably are designed to always charge the device's removable battery pack every time the external adapter is used. It seems logical that keeping the battery capacity at 100% is a sound practice. However, certain rechargeable battery chemistries don't offer the charge/recharge cycle life that was available with "older" battery technologies. Lithium-Ion (Li-Ion) batteries, for example, can last for only 300 cycles, and sometimes even less than that. In average use, an Li-Ion battery can have a useful life (full run-time, as a function of capacity) of less than a year, and nine months isn't uncommon. Constantly "topping-off" a Lithium-Ion battery only degrades useful battery life.

Being able to elect when to charge the battery, independent of powering the host device, would prolong the life of expensive batteries. By delivering power from external power adapters and chargers through connectors at a newly-defined battery power port, a user need only perform a simple act, such as rotating a connector to select a battery-charge mode, a host-power only mode, or both.

Battery Charging Risks

Battery charging is a destructive process in other ways than repeated unnecessary battery charging sessions. Low-impedance batteries, such as Lithium-Ion, generate heat during the charging process. This is especially true if a cell-voltage imbalance occurs for, as resistance increases, the entire battery pack can overheat. Lithium-ion cells have a reputation for volatility. For example, an article in the Apr. 2, 1998, edition of *The Wall Street Journal* reported on the potentials of fire, smoke and possible explosion of Li-Ion batteries on commercial aircraft (Andy Pasztor, "Is Recharging Laptop in Flight a Safety Risk?", The Wall Street Journal, Apr. 2, 1998, pp. B1, B12).

To be able to easily disengage a volatile battery cell cluster from its integrated, hardwired battery charging circuit has obvious safety benefits. Several of the modalities of the connector assemblies discussed herein lend themselves to a simple battery bypass circuit within the battery pack, so that a host device can be powered from an external power source such as an aircraft seat-power system, without charging the battery. This function is achievable by simply replacing an existing battery pack with one that incorporates the connector assembly. This is a cost-effective, simple and convenient solution to an important safety concern. Because the connector assembly is a modification to an existing battery pack, and battery products already have a well-established and wide distribution network, availability of this safety device is widespread. No entirely new devices are required to be designed and fabricated, since the connector assembly is essentially an upgrade modification.

Power-Conversion Adapters

Battery flammability and explosive volatility are related to inappropriate power devices upstream of the battery pack. Connecting a power-conversion adapter that has an output voltage not matched to the input voltage of a host device is an easy mistake to make. Laptop computer input voltages, for example, can range from 7.2 VDC, to 24 VDC. Within that voltage range are a significant number of AC/DC and DC/DC adapters that are power-connector-fit compatible, but which output incompatible voltages. A count of notebook computer power-conversion adapters available from one mail order company numbered over 250 discrete products (iGo, Reno, Nev., www.iGoCorp.com). The probability of a voltage mismatch indicates a serious concern.

Compared to the multiplicity of vast and diverse input voltages battery-powered host devices require, input voltages at battery power ports are not only limited, but more flexible. Since battery output voltages are a function of an individual cell voltage, multiplied by the number of cells wired in series or parallel, there are a limited number of output voltages for battery packs. For example, Lithium-Ion cylindrical cells are manufactured at only 3.6-volts (some are 4.2-volt cells). Thus, virtually every Li-Ion battery pack made outputs either 10.8, or 14.4 volts (with some relatively rare 12.6-volt cell clusters). If an external power-conversion adapter was designed to provide power to a notebook computer host device through the host device's battery port, it is possible that only two output voltages would be required, since the external adapter would electrically "look" to a host device as a battery pack. This adds value to a connector assembly that can eliminate the problem of there being some 42 different types of existing laptop power connectors.

Furthermore, battery pack output voltages vary as a function of charge state. A fully charged battery rated at 10.8-volts actually outputs voltages in a range from about 10-volts, through 14.0-volts (with transient voltages up to 16 volts), depending on the battery's state of charge or discharge. This same host device may be able to accept input voltages at its usual external power-adapter input port within a narrow voltage range of +/−1-volt. Thus, host devices have a far greater tolerance for potential voltage mismatches at their battery power ports, as compared to at the traditional power jack. By providing a power connector that uses the battery's power port, the number of external power devices is significantly reduced, and the overall risk of damaging a host device by a voltage mismatch is minimized.

The heat dissipation from charging a Lithium-Ion battery pack is compounded by the heat being generated by advanced high-speed CPUs. With computer processors running so hot in portable devices that heat sinks, fans, heat pipes, etc., are required, the additional heat from charging a battery only intensifies the thermal issues.

The connector assembly described herein, by disengaging battery charging, extends the life of a host device's components and circuits that otherwise may be compromised or stressed by extended hours of exposure to heat. This is especially valid for host devices like laptop computers, since a number of these products are not used for travel, but instead spend almost all of their useful lives permanently plugged into the AC wall outlet in a home or office, serving as a desktop substitute. In such device applications, the need to repeatedly charge the laptop's battery has no practicality. By using a connector assembly that can be selectively put into a mode of battery charging only when necessary, the working life expectancy of these host devices can be extended by eliminating unnecessary overheating.

Energy Conservation

There's a less obvious reason to not charge batteries on commercial aircraft. Some commercial passenger aircraft provide power systems with power outlets at the passenger seat. The head-end aircraft power source is a generator, so the total amount of energy to power all of the aircraft's electrical system is limited. The Airbus A319, for example, has only sufficient generator capacity to provide seat power for less than 40 passengers' laptop computers (Airbus Service Information Letter (SIL), dated Jan. 8, 1999). A laptop computer being powered from an external power-conversion adapter uses 20–40% of the external power to charge its battery pack, which translates to about 15–30 Watts. Generating sufficient power to charge 200+ laptop batteries puts a considerable drain on the aircraft's electrical system.

Disabling battery charging by employing a connector assembly described herein is a cost-effective means of lowering an airline's operating costs, by minimizing the total load schedule of the cabin power grid. The airline saves the cost of the fuel required to operate the generator at a higher power capacity.

Airline operators have policies and in-flight rules that prohibit the types of passenger electronic devices that can legally operate on the plane. The use of RF devices, such as cellular phones, and radio-controlled toys, is banned on every commercial aircraft. Passengers may be confused on aircraft operated by American Airlines, for example, since selected passenger seats have power systems for laptop use. This airline's seat power outlet is a standard automotive cigarette-lighter port. An unsuspecting passenger, mistakenly assuming that the cigarette-lighter port was for cellular phones, could easily plug in and turn on a cell phone.

Because there are a number of modalities to the connector assembly described in this document, airlines can elect to use a specific connector style, shape or wiring scheme that is reserved for passenger seat-power. By limiting the use of a female receptacle to battery packs for laptops, and not allowing the connector to be used in cellular phone battery packs, for example, an airline can control the types of passenger devices it allows to be connected to its cabin power system.

Battery-Only-Powered Devices

There is also a variety of battery-powered devices that does not have an external power-supply power input jack. Cordless power tools, flashlights, and other devices meant to run strictly on removable and/or externally rechargeable batteries may not have been manufactured with an alternative means of power. If the battery of a cordless drill goes dead, for example, the only recourse is usually to remove the battery and recharge it in its external charger. This is frustrating to anyone who has had to stop in the middle of a project to wait for a battery to recharge.

By integrating a new connector assembly, such as the ones shown in the figures and text herein, circuits can be created that use a host device's battery-power-port interface as a power connector through which power can be delivered from an external power source. A user can elect, when a power outlet is available, to operate devices such as battery-powered drills, saws, etc., from external power, simply by attaching a compliant external power adapter into the connector interface on an exposed face of the battery pack. With some modalities of the connector assembly that is the invention, an external charger can be connected as well, allowing simultaneous equipment use and battery charging in products that hitherto did not have these capabilities.

Devices with holders for individual battery cells fall into this same category of not having an external power port. If the device does have an external port, it is not wired to provide simultaneous battery charging. Not being able to charge replaceable battery cells in a battery holder that is inside the host device lessens the usefulness of rechargeable alkalines, for example.

It is more convenient to leave individually replaceable battery cells in their battery holder while charging, and a number of the modalities of the connector assembly discussed herein allow for that. The added convenience of being able to operate a host device instead of draining its rechargeable alkalines (these battery types typically can only be recharged 10–20 times, then must be discarded), reduces operating costs. The use of the connector assembly saves time, since the user doesn't have to take the time to remove each individual cell and place it in a special charger.

Operational Advantages

Given the above, a number of operational advantages of the connector assembly of the invention become apparent:

(a). A simple, low-cost connector can be used to electrically separate two devices, or a host device and its power system.

(b). By isolating the battery source, or a peripheral, from the original host device, new circuits are created that allow external power sources or battery chargers to perform more safely because the battery voltage can be verified before that external power is applied to a host device.

(c). Because a male plug can function as a rotating selector switch that has more than one position, additional circuits or wiring configurations can be created to perform specialty functions or operations.

(d). As a "key," part of a male connector can be removable and interchangeable at the end of a power or data cord, to afford access control to equipment or electronic devices.

(e). With its very small form factors, a female connector can be embedded inside a battery pack, to make it a self-contained device that has a special power or data interface to external power or charging devices, or monitoring equipment. This can be accomplished without having to rewire or otherwise modify a host device. By replacing the existing battery pack with one configured with a connector assembly that is the invention, the functionality of both a battery and its host device is enhanced, without permanent reconfigurations to either the battery pack or host device.

(f). The connector assembly can be used as a replacement for an existing input power jack, with minimal modifications or rewiring.

(g). Problems with the existing multiplicity of connectors on electronic devices that allow incompatible external adapter output voltages are eliminated. Instead, the female receptacle is simply wired in a different configuration, and a new male plug is used to differentiate the two incompatible external adapters. Any fear of possible mismatched voltages between external power adapters and host devices is eliminated.

(h). In certain embodiments of the connector assembly that use a female connector that self-closes to reinstate a circuit, the need for an ON/OFF power switch in conjunction with a power input jack is eliminated. A male plug is now defined that is configurable to turn the host device on when the plug is inserted into the female receptacle.

(i). Certain embodiments of the connector assembly can be equipped with a latching mechanism that secures the male and female assemblies, an important feature for devices like laptops that are often moved around the local area in industrial or service applications.

(j). In certain environments, host devices that automatically charge their batteries when external power is applied can be easily modified by inserting a battery pack that has been upgraded to the connector assembly in this invention. Thus configured, the host device is rendered safety compliant.

(k). Simultaneous battery monitoring and power delivery from an external device can be done without modifying the internal circuitry of the host device.

(l). By installing a switch that responds to applied power signals, and locating that switch in either the male or female assemblies of the connector, battery monitoring and power delivery can occur with a two-conductor cable that shares more than two contacts in a connector assembly.

(m). Monitoring battery charging can be done by an external device attached to a connector assembly such as those defined herein, which may be capable of power, data, or both.

Applications

An upgraded battery pack that creates different electrical paths for power, data, or both when a male plug is inserted or removed may, for example, include applications such as (but not limited to) the following:

1) Diminish the need to be charging a battery pack when an external power source is available. By not charging a battery every time a host device is connected to an external source of power, the life expectancy of the battery is increased. Since most rechargeable battery-powered electronic devices automatically charge their batteries when external power is connected, the use of a connector that disables the battery charge function increases the useful life of the battery, thus reducing total operating cost.

2) Some locations may not find battery charging practical. Battery charging can consume 20–40% of the entire load schedule of a host device's power requirements. If a car's battery is low, operating a host device such as a laptop for an extended time from the dashboard outlet could result in a stranded motorist.

3) Some transportation locations may not be suitable for battery charging. There is some risk in charging batteries, especially high-density Lithium-Ion batteries. An airline, or cruise ship operator, for example, may wish to limit the risk of an onboard battery-related fire or explosion. A simple and cost effective method would be to use battery packs and power cords that have a connector which disables the charge function, while still allowing an external power supply to power the host device only.

4) Extended-run-time external battery packs can be used to supplement a host-device's associated battery. These extra-high-capacity battery packs connect to a host device's existing power input jack. So configured, the external battery pack most likely is dedicating some of its stored energy to charging the host device's battery. This occurs because host systems are designed to charge the associated battery whenever external power is available.

As a power source, a host device usually does not distinguish an external battery from an AC/DC wall adapter, for example, so the extended-run-time battery loses its effectiveness by having to relinquish some amount of its stored energy to charging the host's battery. By using a connector as defined herein, the external battery pack can be routed through the host device's existing battery pack and, by doing so, the charging circuits with the host device are temporarily disabled while the external battery source is in use. This enhances the run-time of the external battery pack, and also eliminates inefficient energy transfers between the two batteries.

These non-limiting examples of applications for connector assemblies such as those described in this document show some practical real-world uses.

Design Parameters

Some of the design parameters required to achieve these uses may be:

1) Small package size, especially for the female receptacle, since available space within battery packs is limited.
2) Straightforward way to integrate a female connector into an existing battery pack, or to install the receptacle in a new battery pack design in a way that doesn't require an inordinate amount of extra tooling or assembly.
3) Inexpensive
4) Simplicity of use

SUMMARY OF THE INVENTION

This invention relates to an apparatus for a power and/or data I/O port, specifically connector assemblies which have conductors, insulators and related elements that create different electrical paths than had previously been present in electrical and electronic devices. These newly-created electrical paths enable devices and peripherals to perform power and/or data functions in ways they could not without such an apparatus. By locating a connector assembly of the invention in replaceable modules, such as battery packs, users can upgrade and enhance the functionality of a multiplicity of existing (and future) electronic and electrical goods.

DESCRIPTION OF THE DRAWINGS

FIG. 14 is a second view of the male plug shown in FIGS. 12, and 13, detailing its interface with a multi-conductor cord.

FIG. 15A depicts a multi-contact male plug similar to that in FIGS. 13, and 14, showing a different tip configuration.

FIG. 15B shows a different tip configuration for a multi-contact male plug similar to that shown in FIGS. 13, 14, and 15.

FIG. 18B is a generic block diagram depicting a male plug in a second position, related to a male plug in a first position in FIG. 18A, to show the different power paths.

FIG. 20 shows a two-conductor male plug as in FIG. 19, with its mating female receptacle, the receptacle having spring-loaded contacts that cause various circuits to exist through a single connector assembly.

FIG. 21A is a generic diagram that depicts the conductive paths a connector assembly illustrated in FIG. 20 causes to be available, depending on the orientation of a male plug and the use of external power-related devices.

DETAILED DESCRIPTION OF THE INVENTION

Figure 1:
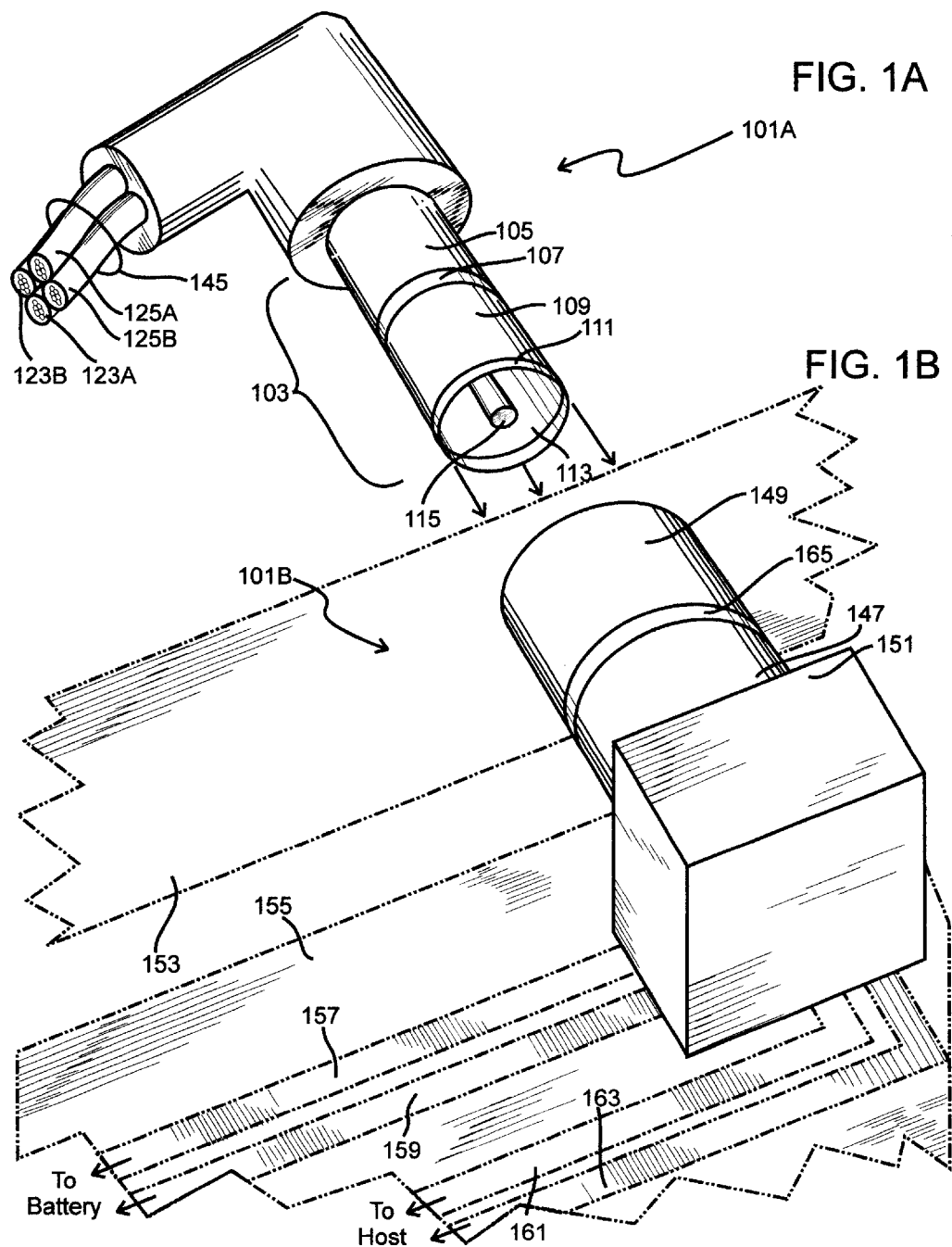
FIGS. 1A and 1B depict a barrel-style connector assembly with configurable segments, that may be mounted internally to a host device, or within a power source such as a battery pack.

The invention provides a method and apparatus for transferring electrical signals including power and input/output information among multiple electrical devices and their components. In the following description, numerous specific details are set forth in order to provide a more thorough understanding of the present invention. It will be apparent, however, to one skilled in the art that the present invention may be practiced without these specific details. However, in order not to unnecessarily obscure the invention, all various implementations or alternate embodiments including well-known features of the invention may have not been described in detail herein.

Principles of Operation

The principles of operation of a connector assembly that is the invention are important to defining individual implementations of the mechanical and physical connector of the present invention.

A non-limiting purpose of an embodiment of a rotatable male connector with multiple contact pads—and its mating female receptacle—is to provide a means of reconfiguring electrical (power and/or data) circuits so that devices external to a host system can perform functions as if they were embedded in the host system. Also, electrical signals from external devices may address specific host sub-systems which, without such a connector assembly, would be inaccessible. A rotating male plug (or an non-rotating multi-contact plug) and its associated female may create an operational "Y-connector" that temporarily disrupts and reconfigures a host device's original internal circuits. Such a Y-connector can be used, for example, to monitor one or more activities of a host device or its sub-systems by isolating and redirecting the I/O of that sub-system for such purposes as monitoring, powering, or sending/receiving data.

An example of a specific connector assembly function is to disrupt the power circuit between a host device and its internal battery. This disruption may be necessary because battery charging is not deemed appropriate at the time, or in a specific location, yet external power to the host system is needed. Perhaps an external power supply is input-side limited, because it is generator driven (or being powered by a car battery while the engine isn't running). It may not be prudent to deliver sufficient power to adequately run a host device, and simultaneously charge the host's internal battery. By being able to only power a host device, and not charge its battery, power-limited resources are conserved.

Upgrade Paths

The capabilities of multi-segmented, and/or rotatable connectors, allow multiple simultaneous functions to be performed with a host device and its sub-systems (or peripherals) without numerous complex interfaces. One connector assembly can deliver significant upgrades to electrical or electronic equipment for functions that were not originally designed into the device. Upgradability can be achieved simply and cost effectively by locating the connector assembly and related wiring in a removable (or easily field-replaceable) module. For example, since rechargeable battery packs are user-removable, incorporating a connector in a replaceable battery housing provides a convenient means of modifying electrical circuits, both in the battery and, as a consequence, the battery's host device.

Figures 10A, 10B:
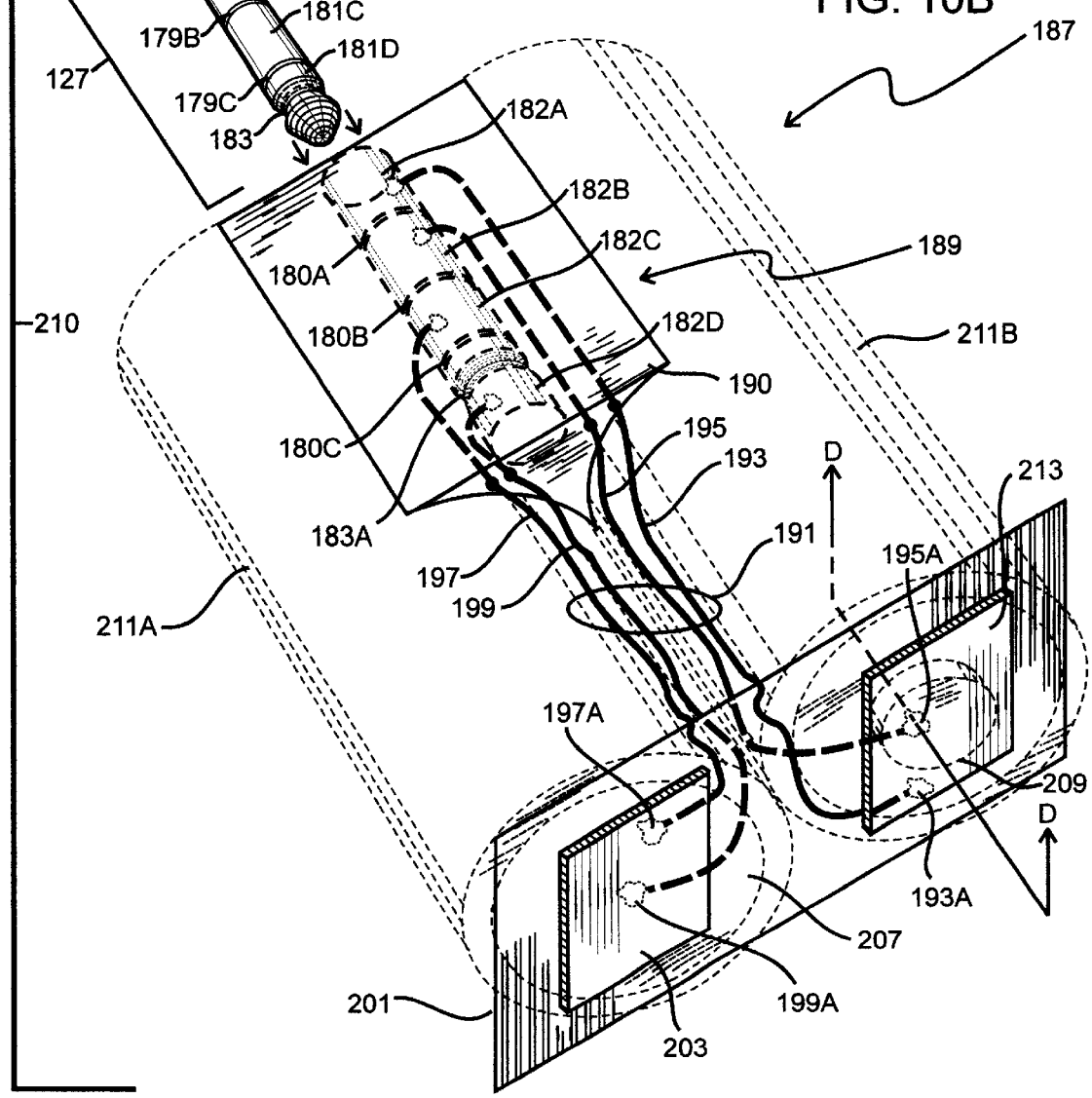
FIGS. 10A and 10B show a multi-segmented pin-style male connector, as in FIG. 9, and its associated female receptacle installed and wired to a simple battery cell cluster, with the various electrical paths that have been created.

A battery pack is shown in several of the examples herein, such as FIG. 10B. A host-device manufacturer can upgrade an end user's battery pack, replacing it with a battery pack having a female receptacle 189 installed. FIG. 20 shows how such a connector upgrade is installed in a battery pack. but other removable sub-systems or modules, such as the external AC/DC power adapter normally purchased with a host device, also afford upgrade opportunities as locations where such a connector-assembly may reside.

Connector assemblies of the invention may be integrated into a host device at the time of manufacture. FIGS. 1A and B show a multi-segmented host device's power-input jack 101B that is installed in a host device.

Upgrades to install a connector 101B (FIG. 1B), or an equivalent, in an already manufactured host device can be done by qualified field service technicians. Electrical traces 157, 159, 161, and 163 would not be in place if the host device was being upgraded, so supplemental wires would be installed, or the circuit board would be replaced. However, the intent of connector assemblies discussed herein is to not have to modify existing host devices, but instead to install the preferred modalities as a female connector in a suitable replaceable module, such as a battery pack.

Connector assemblies discussed in this document, as well as non-limiting referenced alternative modalities, are capable of establishing a "Y-connector" circuit that may interrupt an existing electrical mode of operation. "Key"-type male plugs and their mating female receptacles (reference FIGS. 16 and 17, as a non-limiting example) provide an automatic reconfiguration of the original circuits when the male plug is removed. Other embodiments include barrel-style or pin-type connector assemblies (reference FIGS. 1A–10B) which use of a "jumper" male plug to return a host device (and its peripherals) to the original "as-manufactured" electrical configuration.

Most connector assembly embodiments herein allow for additional features, such as "hot insertions." By the location of a male plug's contact pads, or the selection of segments in a barrel- or pin-style plug, staging the electrical contacts is achieved, so that one contact is electrically active prior to a second contact. Strategic placement of insulators in male and female elements of a connector assembly provide circuit disruption, rerouting of electrical paths, and the creation of Y-connector-style electrical branches within circuits.

Multiple operating modes (achieved by rotating the male plug to at least one more position) create operations similar to a multi-selector switch. Monitoring a host device's subsystem can be done by rotating a male plug to a selectable position, for example. Each branch of a Y-connector (or both together) can be used as either data or power paths, or as combined mixed-signal circuits.

A Multi-Segmented Barrel-Type Connector Assembly

A connector assembly, as the elements in one embodiment of the present invention, are illustrated in FIGS. 1A and 1B. Barrel-connector male plug 101A is comprised of a conductive center pin 115, conductive barrel interior 113, and external conductive barrel segments 105 and 109. Mating barrel-connector female receptacle 101B is comprised of internal conductive segments 149 and 147, which match and electrically connect to male plug 101A's barrel segments 105 and 109, respectively. Not shown are mating conductive surfaces of female receptacle 101B that correspond to male plug's conductive elements 113 and 115. These are detailed in FIGS. 2 and 3.

Male plug 101A in FIG. 1A is wired internally so that each of the four conductive wires 145 is attached to a dedicated conductive segment of barrel assembly 103. For example, conductive wire 123A delivers its power or data signal to barrel connector segment 109. Conductive wire 123B is connected to barrel connector center pin 115. Center pin 115 may be segmented, but is shown here as a single contiguous conductor. Conductive wires 123A and 123B are, for purposes of an example, positive (+) and negative (-) power leads. By separating conductive surfaces for power 105 and 113, one being internal to barrel assembly 103, and the other external, the possibility of an inadvertent short is minimized. Likewise, conductive wires 125A and 125B are attached to barrel connector segments 109 (external), and center pin 115. This example of a typical wiring scheme is not limited to this configuration, and separation is only necessary to ensure that any mating conductive segments 105, 109, 113 and 115 are so wired as to not create shorts as barrel assembly 103 is inserted into mating female receptacle 101B.

External Devices

It is not essential to the proper operation of connector subassemblies 101A and 101B (FIGS. 1A and 1B) that all conductive segments 105, 109, 113 and 115 be attached to conductive wires 123A and B, and 125A and B. Connector elements 101A and B, in such a four-wired configuration, can provide simultaneous data and power to both a host device (not shown) and a peripheral (such as a host device's rechargeable battery, not shown).

For example, a power signal from an external power source (not shown) along wires 123A and B in FIG. 1 is delivered at conductive segments 105 and 113 of male plug 101A. When mated to female receptacle 101B, the power signal passes from conductive element 105, onto corresponding outer spring contact 139A in FIG. 2. The power signal at internal sleeve 113 of connector 101A passes to a conductive element 130 (see FIG. 2). From outer spring contact 139A and middle plug barrel 130, the power signal is then routed to connectors 161 and 163 (FIG. 1). Conductive traces 161 and 163 are, for purposes of this non-limiting example, attached to a powered host device (not shown). Thus, a powered host device is capable of being powered by two of the four conductors of a connector assembly 101A and 101B.

Conductive wires 125A and B in FIGS. 1A and 1B, in this example, are attached to an external battery charger (not shown). A charging power signal travels to barrel segments 109 and center pin 115. When male plug 101A is mated to female receptacle 101B, the charging signal passes from barrel segment 109 to outer spring contact 139B (see FIG. 2). Center pin conductor 115 in male connector 101A electrically mates to inner barrel sleeve 127 (FIG. 2) of female connector 101B. The charging signal is then delivered to conductive traces 157 and 159, that terminate at the electrical contacts of a host device's rechargeable battery pack (not shown). Thus, both a host device and its associated battery pack can be both powered and charged simultaneously through one connector. (Reference FIGS. 10A and B, 11, 18A and B, as well as FIGS. 19 and 20, and their related text.)

It is not necessary that there be two external devices, nor need there be both a peripheral (a rechargeable battery, in this example) and a host device available in order to achieve functionality from connector elements 101A and 101B in FIGS. 1A and 1B. As configured in FIGS. 1A and 1B, a connector assembly 101A (male) and 101B (female) can use two conductors for data, instead of power. For example, conductive lines 123A and B, and their respective conductive segments 105 and 113 on barrel assembly 103, can serve as data lines. As such, a data signal from a host device (not shown) such as information as to the voltage of the host device's battery pack, can be transferred to an external monitoring device (not shown) along conductive wires 123A and B.

Figure 2:
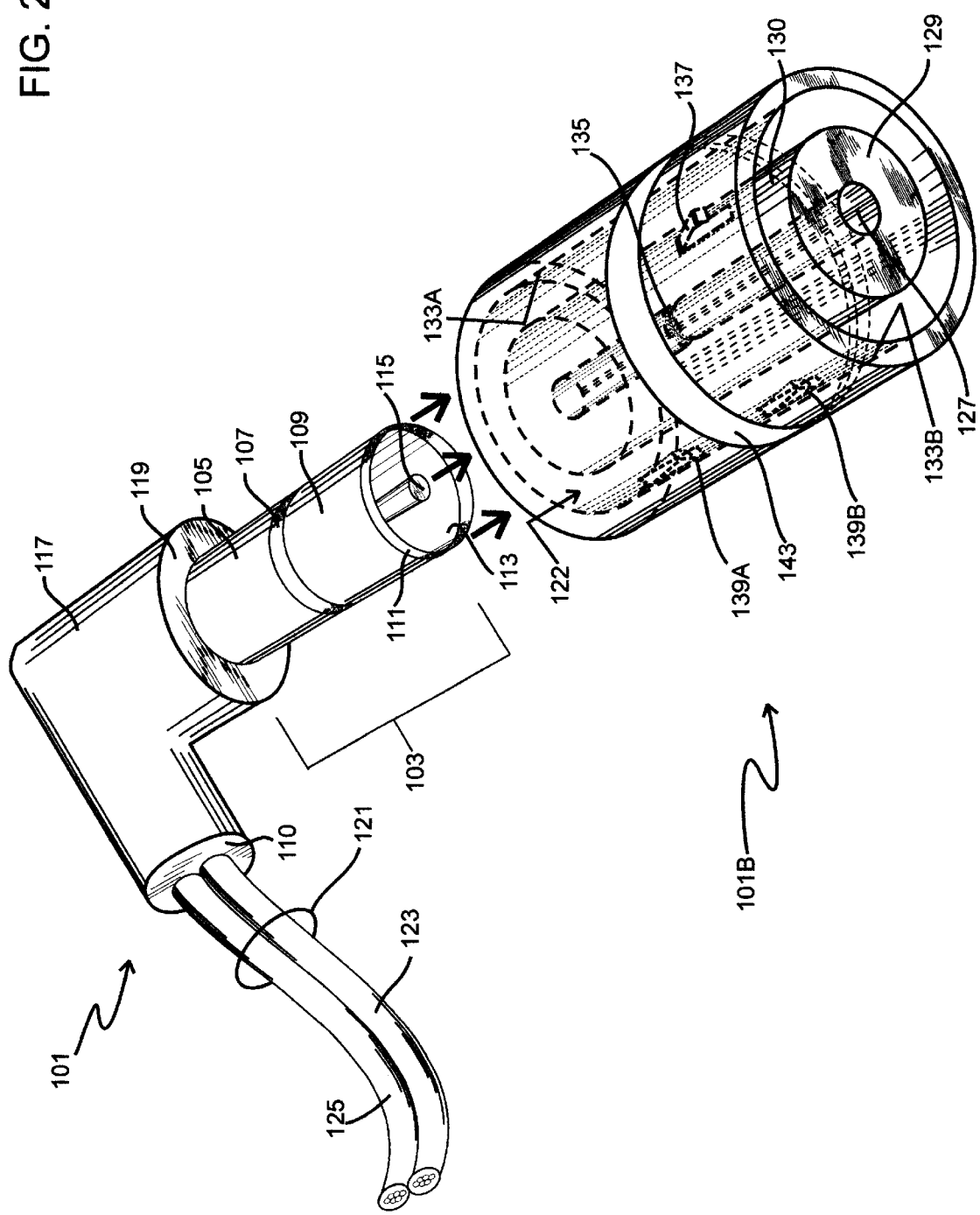
FIG. 2 details a barrel-style connector assembly as illustrated in FIGS. 1A and 1B, showing the inter-connectivity of segmented mating male and female elements.

In FIGS. 1A and B, conductive wires 125A and B, and their respective conductive segments 109 and 115 on barrel assembly 103, can then respond to the acquired battery voltage value at the external monitoring device, in this example, by delivering that voltage to the host device along a path consisting of conductive lines 125A and B, barrel segments 109 and 115, then to outer spring contacts 139B and inner spring contact 137 (FIG. 2). This affords an efficient and simple way for an external, adjustable-voltage power source to automatically match the correct input voltage of a host device. By sampling the host device's battery voltage, then delivering that voltage back to the host device, automatic power configuring is achieved. The battery circuit is isolated by the connector assembly so that no power signal is delivered to the battery, but only to its host device.

Two-Conductor Version

FIG. 2 shows male plug 101 with a two-conductor cord 121. Conductive wire 123 is attached to conductive segment 105, and conductive wire 125 is attached to internal barrel conductive surface 113. Note that internal conductive surface 113 is continuous along the length of barrel assembly 103, and is not segmented, as are two external segments 105 and 109. Internal conductive surface 113 can be so segmented, but the modality shown here does not require it. Any of the four conductive surfaces 105, 109, 113 and pin 115 can be electrically attached to conductive wires 125 and 123.

Since only two of conductive surfaces 105, 109, 113 and pin 115 are required with two-conductor cable 121 in FIG. 2—as compared to four-conductor cable 145 in FIGS. 1A and 1B—two non-attached conductive surfaces on barrel 103 are not active. For example, conductive surfaces 109 and 115 may not be active. These conductors can be jumpered together to create a loop. With conductive surfaces 109 and 115 electrically tied together, the insertion of a male connector 101 into its mating female 101B creates a conductive path between female connector 101B's outer spring contact 139B and sleeve 127. Such a path created by the mating of male connector 101 to female 101B could serve, for example, as a ground sensor line used to indicate that the male and female connectors are engaged, and power (or data) can be initiated.

Figure 3:
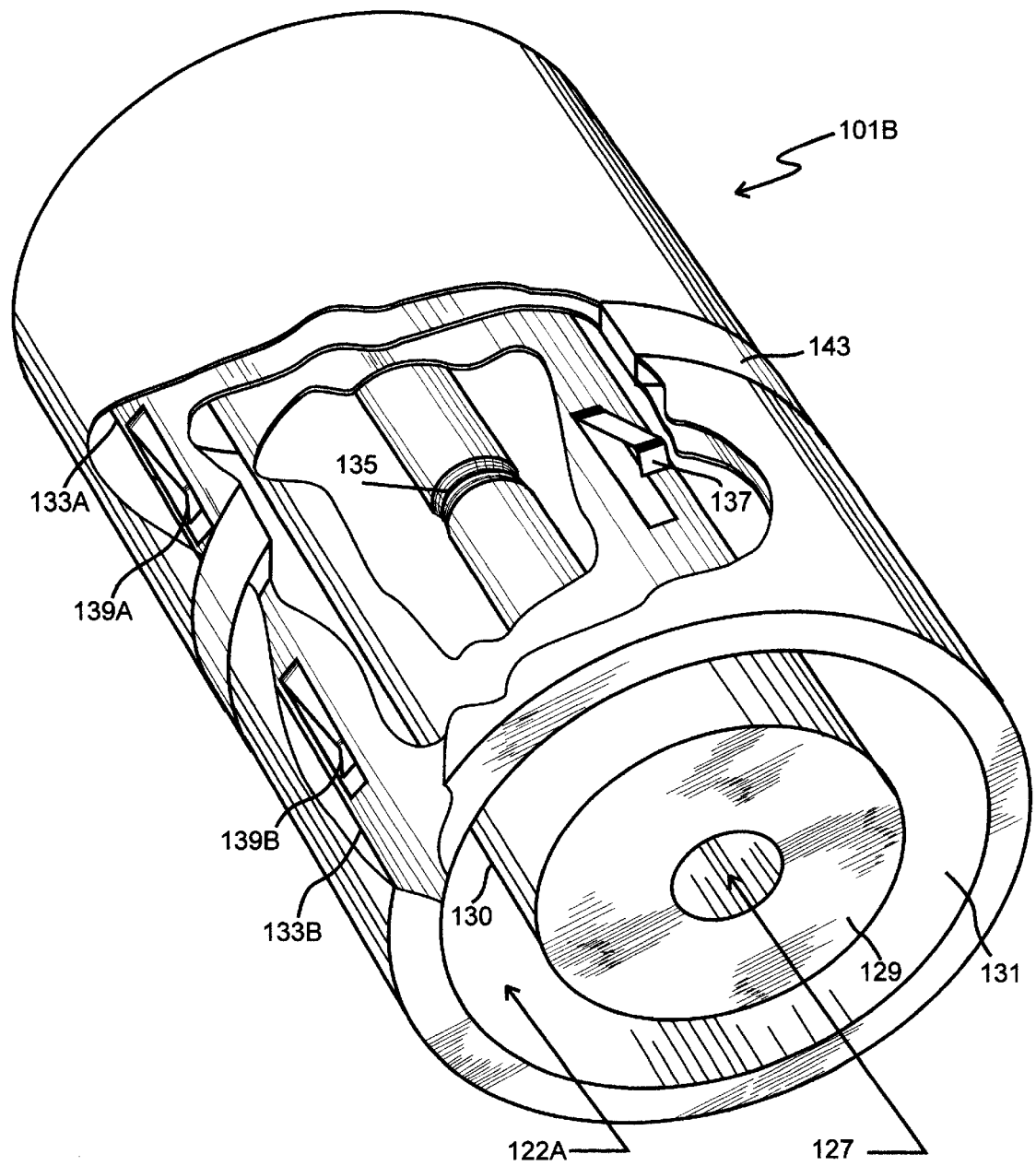
FIG. 3 is an enlarged view of a female receptacle of a barrel-style connector assembly, as in FIGS. 1A, 1B, and 2, showing various electrical contacts and the arrangement of elements.

The composition and elements of female receptacle 101B are shown in FIG. 2, and are detailed in FIG. 3. In FIG. 3, central conductive tube 127 captures center pin 115 of male plug 101 in FIGS. 1 and 2. A smaller diameter restrictor ring 135 ensures conductivity, and provides a friction fit for center pin 115. The pressure of restrictor ring 135 is not essential to the operation of the connector. Insulator ring 143 electrically separates conductive segment 133A from 133B. Spacer 129 is comprised of non-conductive material, electrically insulating outer conductive surface 130 from inner conductive sleeve 127. Outer conductive surface 130 mates to conductive surface 113 of barrel assembly 103 in male plug 101 of FIG. 2. Conductive tab 137 provides positive electrical contact with outer conductive surface 130 and its mating surface 113. Tab 137 also causes friction in order to keep male 101 and female 101A sub-assemblies together (in FIG. 2). Similar outer spring contacts 139A and 139B are employed on conductive segments 133A and 133B, except that they point inward, while conductive tab 137 points outward. None of these conductive tabs is essential to the proper operation of the connector, and may be eliminated if there is sufficient friction fit and electrical contact to all mating surfaces.

Figure 4:
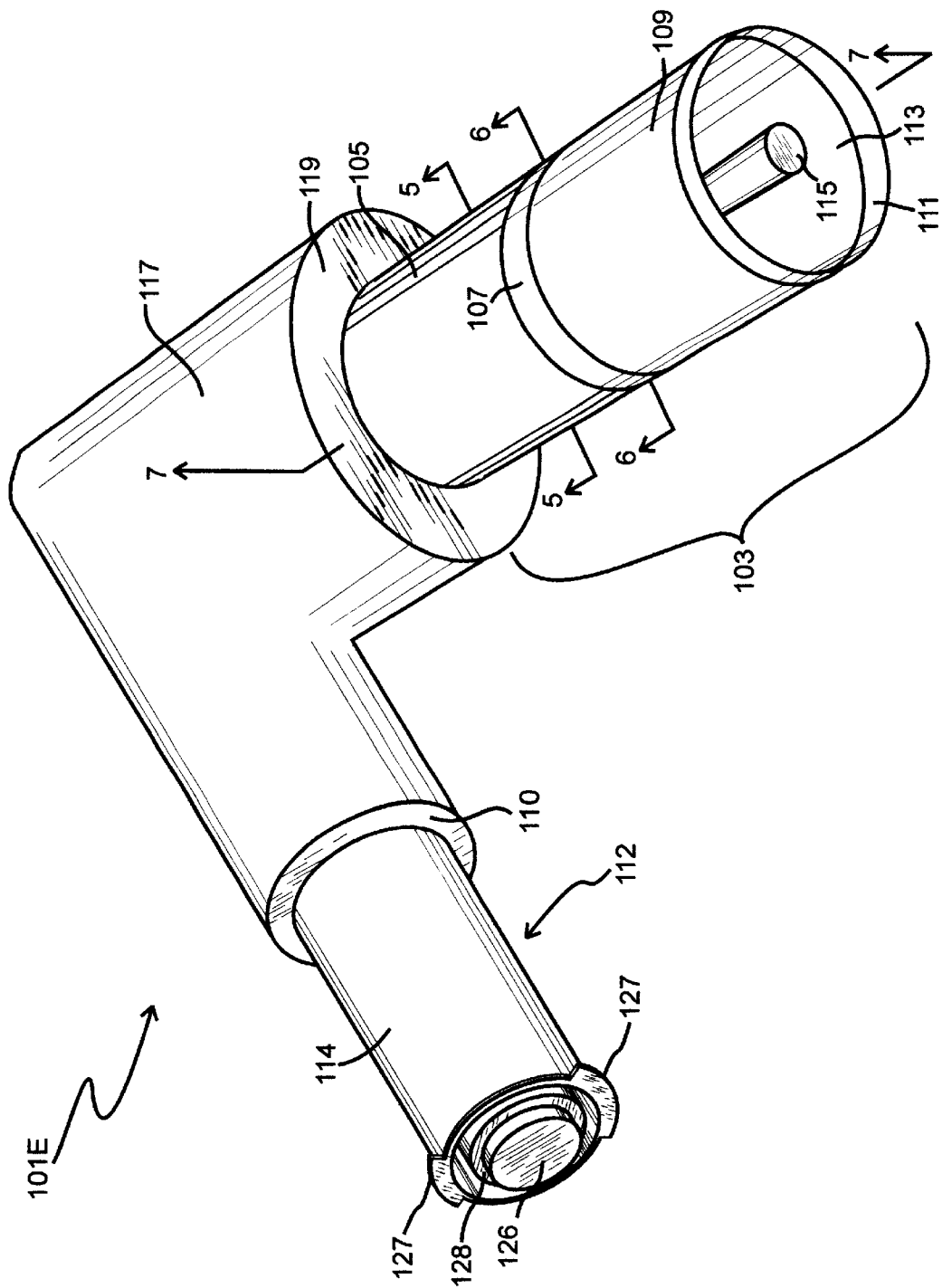
FIG. 4 depicts a male connector element that has segmented barrel and pin electrical contact elements, as in FIGS. 1A, 1B, and 2, as well as a simple means of making such connector plugs removable and replaceable on a cord.

Male plug 101 in FIG. 4 details the elements of a connector comparable to that of FIG. 2. Insulated boot 117 is shown as a 90-degree angled piece, but the boot can be configured in any style or shape that allows for convenient insertion and removal of male plug 101. Insulator 111 provides a non-conductive tip to barrel assembly 103, as is typical of most barrel-connector-style male plugs.

Interchangeable and Replaceable

Male plug 101 in FIG. 4 features a "twist and lock" base 112 that affords easy removal and replacement. Cylindrical base 112 has outer conductive shell 114, and inner conductive post 126, for transferring power or data signals from segments on barrel assembly 103. An insulator layer 128 prevents shorting. The assembly 128 and 126 may be spring loaded to extend slightly past the aft edge of outer barrel 114. Two flanges 128 provide a twist lock attachment to a mating receptacle (not shown). By making male connector 101 removable, other such units can be configured with unique wiring and contacts to accommodate various applications. Since host devices often employ proprietary connectors, properly-matched male plugs can be quickly attached.

Internal Views

Cross-sectional views A—A (FIG. 5), B—B (FIG. 6), and C—C (FIG. 7) of barrel assembly 103 in FIG. 4 shows a typical construct of insulator layers and conductive surfaces.

Figure 5:
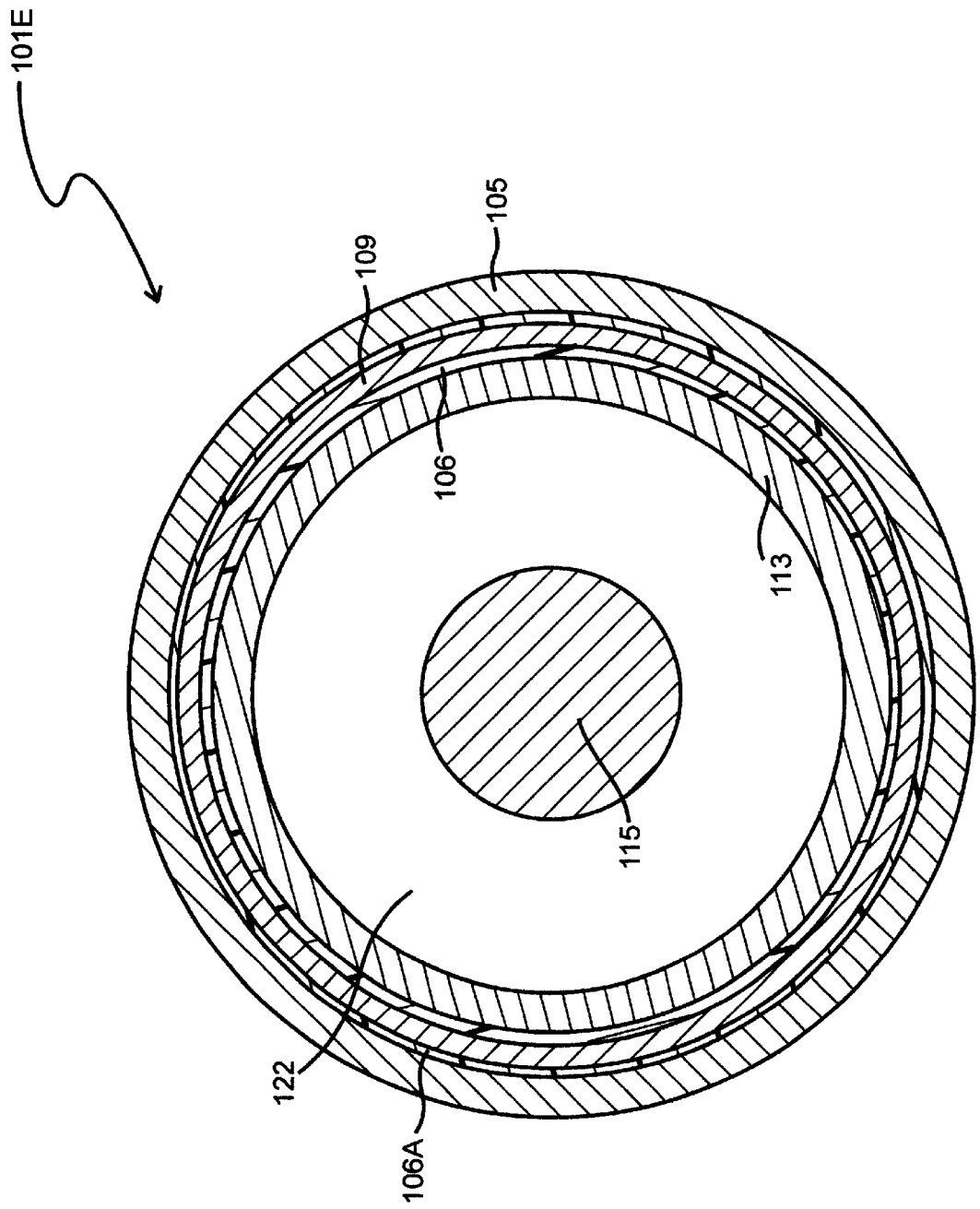
FIG. 5 is a cross-sectional end view of the conductor and insulator elements of a segmented barrel-style male plug, as in FIGS. 1A, 1B, 2, and 4, showing their interrelationship.

Barrel assembly 103 of male plug 101 in FIG. 4 is shown in cross-sectional view A—A in FIG. 5. Conductive center pin 115 is surrounded by open area 122. This open area is occupied by a female mating spacer 129 and conductive surface 130 in FIG. 3. Internal conductive surface 113 in FIG. 4 runs the length of barrel assembly 103. Conductive surface 113 is electrically isolated from conductive layer 109 by insulator layer 106 in this cross-sectional view. It should be noted that insulator 106 is not continuously expressed at this thickness along the entire length of barrel assembly 103.

Figure 6:
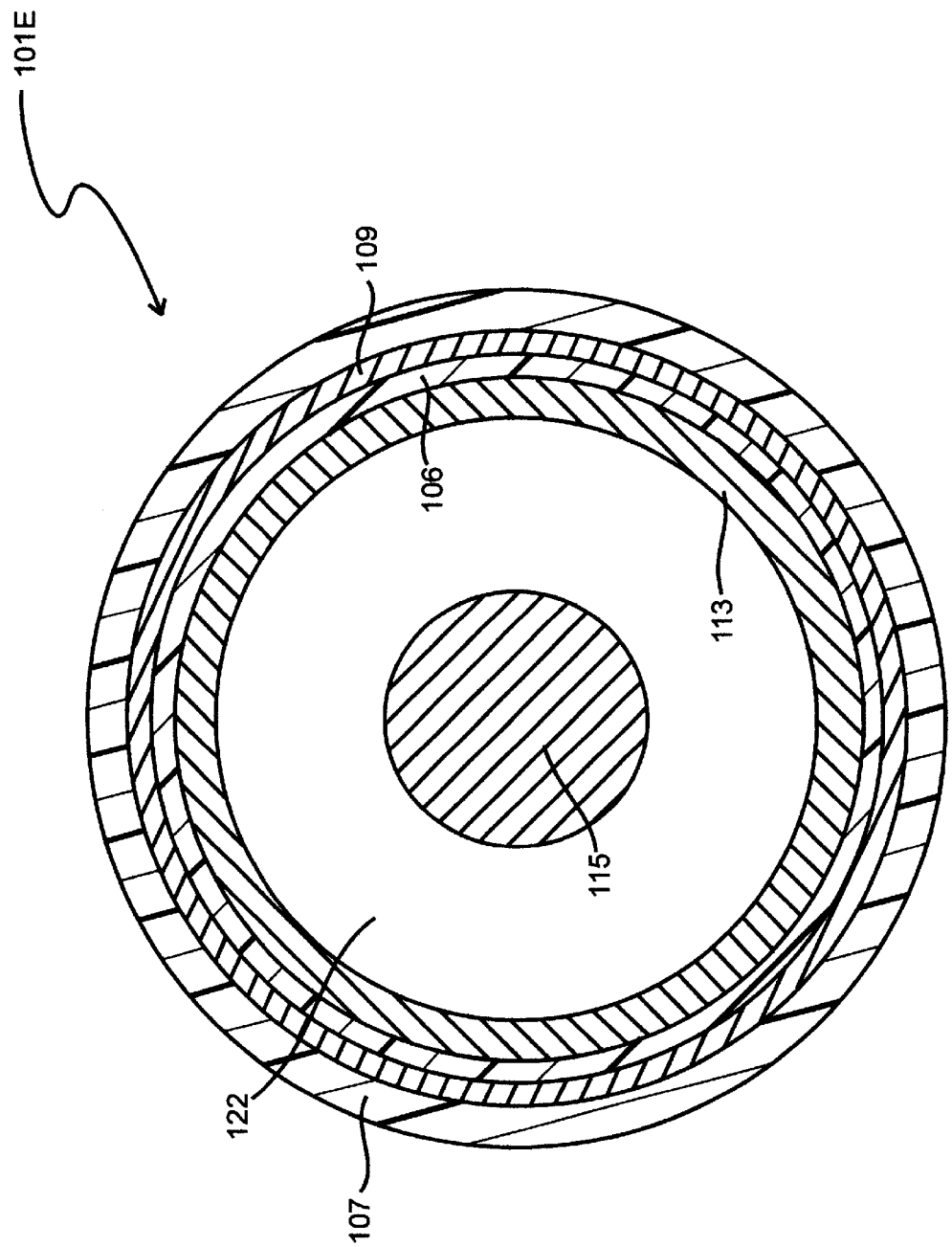
FIG. 6 is a second cross-sectional end view of the conductor and insulator elements of a segmented barrel-style male plug, as in FIGS. 1A, 1B, 2, 4, and 5, showing their interrelationship.
Figure 7:
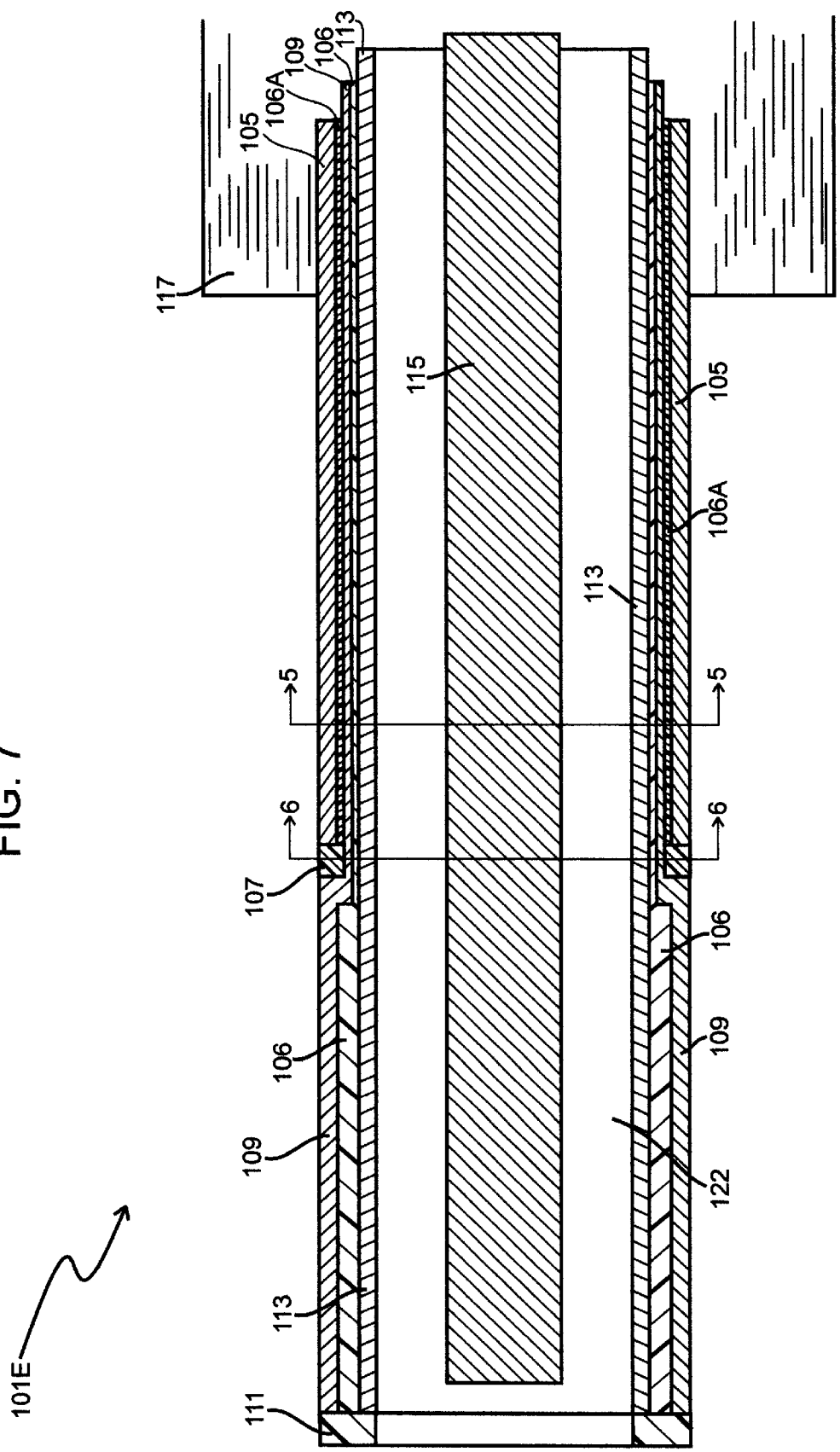
FIG. 7 depicts a cross-sectional side view of the conductor and insulator elements of a segmented barrel-style male plug, as in FIGS. 1A, 1B, 2, 4, and 5, showing the interrelationship of the elements.

Cross-sectional view C—C in FIG. 7 illustrates the transition of insulator layer 106 that insulates external conductive layer 109 from internal conductive layer 113. Insulator 106 becomes thinner insulator at the insulated separator band 107. Conductive layer 109 also reduces its outer diameter at the location of non-conductive separator band 107, to provide space for the thickness of conductive segment 105. Insulator 106A, separates conductive segment 105 electrically from conductive layer 109. Thus, two outer conductive segments 109 and 105 maintain a uniform diameter along the length of barrel connector IO1A in FIG. 7. FIG. 6 shows a cross-section B—B of barrel assembly 103 in FIG. 4. Separator band 107, and its relationship to conductor 109, insulator 106, and internal conductive layer 113 are indicated.

Terminator

Figure 8:
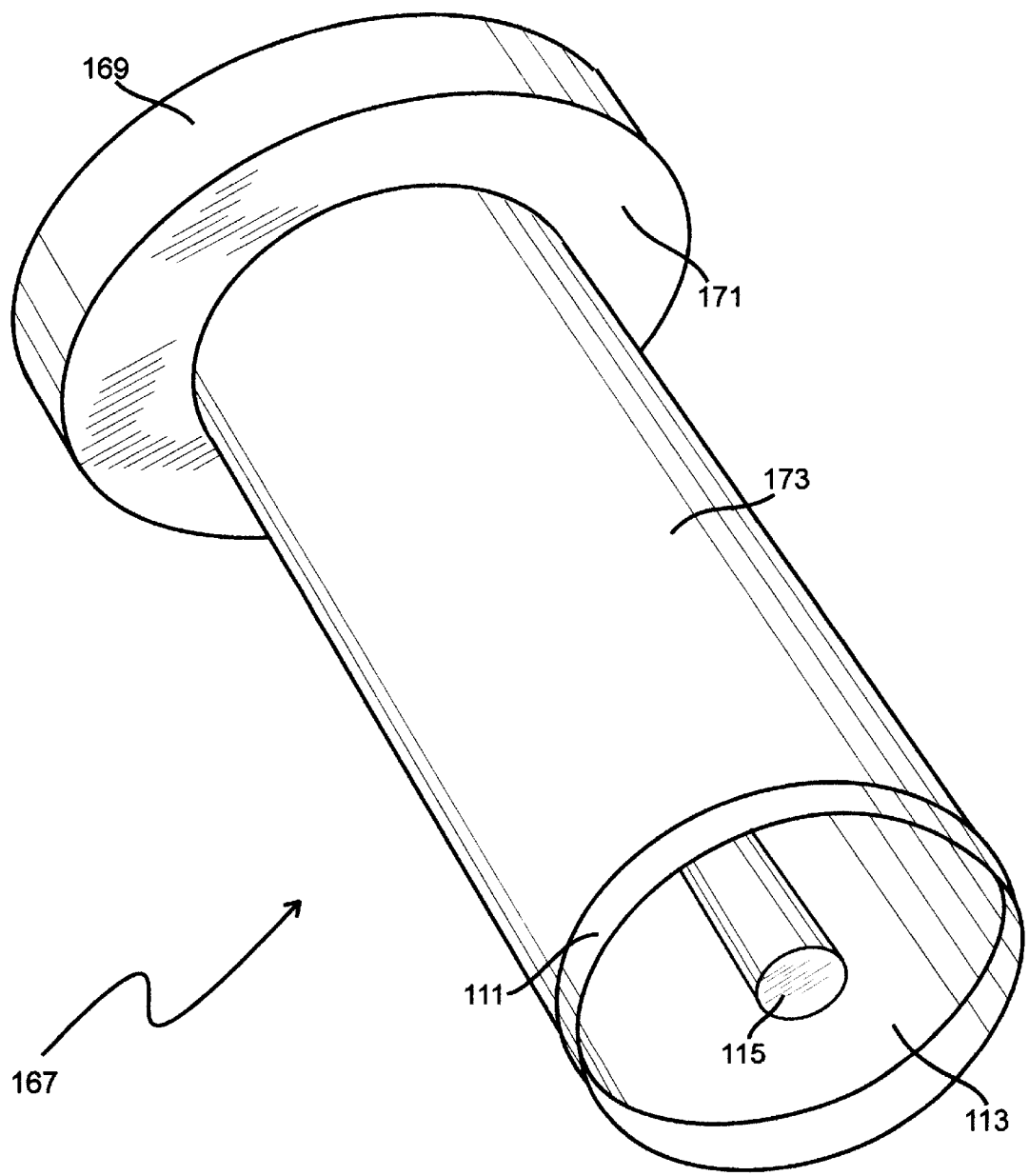
FIG. 8 shows a simple "jumper" male plug that serves to re-establish electrical and/or data paths when a segmented male plug, as shown in FIGS. 1A, 1B, 2, 4, 5, and 7, is removed.

FIG. 8 shows a "jumper" male plug 167 that serves to reconnect the wired circuits at female receptacle 101B in FIG. 1, and 101A in FIGS. 2 and 3. Male plug 167 has no external wires, but is internally "jumpered" so that the interrupted circuits 161-to-163, or 157-to-159 in FIG. 1B, are reconfigured by the insertion of a male plug 167. For example, male plug 101A in FIG. 1A, with its four-conductor wiring 145, conductive wires 123A and 125A are both of the same polarity in a power circuit. Conductive segments 105 and 109 in FIG. 1A are polarity matched by being connected each to positive conductive wires 123A and 125A. Conductive wires 123B and 125B are also polarity matched, and are each respectively connected at inner conductive surface 113 and center pin 115.

In this example, "jumper" male plug 167 in FIG. 7 has a contiguous external conductive surface 173 which connects the two previously-noted positive conductive surfaces 105 and 109 in FIG. 1A. Referencing mating female receptacle 101B in FIG. 1A, continuously conductive surface 173 of male plug 167 in FIG. 8 essentially jumpers conductive segments 105 and 109. Male plug 167 also internally jumpers center pin 115 and inner conductive surface 113. Thus, when inserted into female receptacle 101B in FIG. 3, a circuit is established between inner conductive tube 127 and outer conductive surface 130 of spacer 129. When inserted into a female receptacle wired to be compatible with the polarities indicated above, jumpered plug 167 renders a female receptacle such as that shown as 101A in FIG. 3 electrically "invisible." Thus, for a modality wherein a connector 101B's outer spring contact 139A and middle plug barrel 130 are directed to a host device, while the remaining two outer spring contact 139B and sleeve 127 are directed to a rechargeable battery within the host device, the battery can be charged on its own circuit (outer spring contact 139B and sleeve 127), while the host device is being powered on its dedicated circuit (outer spring contact 139A and middle plug barrel 130). This modality assumes an external power supply for the host device, and a separate external charger for the battery pack.

Once the external power supply and charger are disconnected, inserting a male "jumper" plug 167 (FIG. 8) reestablishes the electrical circuit between the host device and its internal battery.

While not shown, affixing a male jumper plug 167 in FIG. 8 to the molded backshell 117 of a male connector 101 in FIG. 4, for example, would make the jumper plug conveniently available, and eliminate the risk of losing this device.

Multi-Segmented Pin-Style Connector

Figure 9:
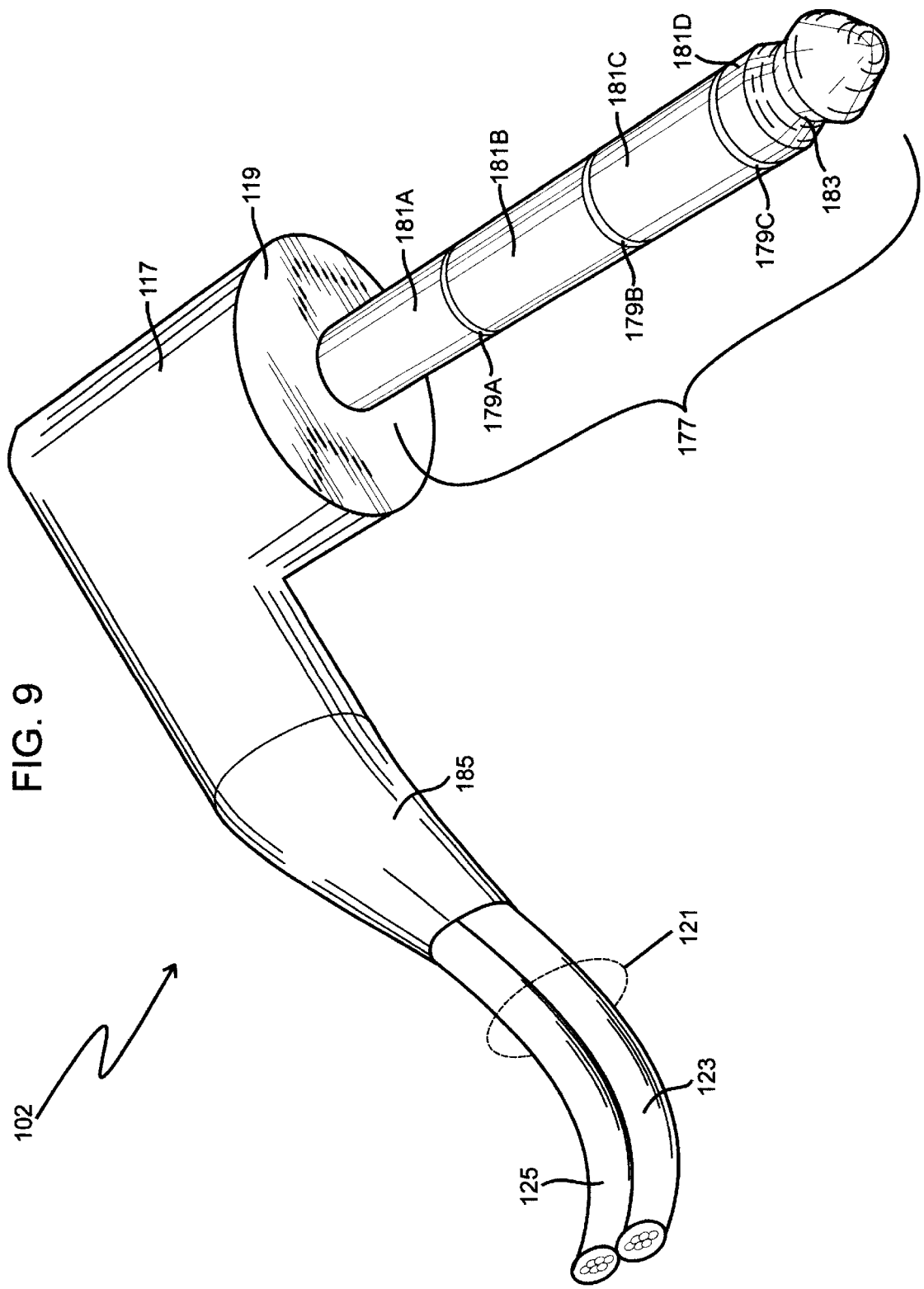
FIG. 9 depicts a multi-segmented pin-style male connector which is capable of reconfiguring power (and/or data) paths.

FIG. 9 illustrates another modality of the connector assembly that is the invention. Male plug 102 exemplifies a multi-segmented pin-style connector, similar in conformation to typical audio connectors. However, the number of segments may differ from the two or three segments normally found on audio connectors, as well as the way these segments are wired. While pin-style connector 102 is not limited by the number of segments, the connector should have a minimum of two segments. In the four-segment configuration shown in FIG. 9, only a two-conductor wire 121 is shown, as would be the case of a connector system that is intended to deliver power from an external device. Attached to conductive wires 123 and 125, is either a host device (not shown), or a peripheral such as the host device's battery pack (not shown).

The use of four conductive segments 181A–D in FIG. 9 enables an equivalent connector 102, differing only in how the four segments 181A–D are wired, to redirect power or data to a host device. For example, conductive wire 123 can be attached to conductive segment 181A, and conductive wire 125 can be attached to conductive segment 181C. Thus wired, this connector configuration may, for example, be attached to an external power supply (not shown) that delivers power to a host device (not shown).

A separate companion circuit in connector 102, in FIG. 9, in this example, can be configured so that a conductive wire 123 is attached to conductive segment 181B, while conductive wire 125 is attached to conductive segment 181D. So configured, this second interchangeable male plug 102 may be attached to an external battery charger, for example, that charges the battery in a host device (not shown). In an application where a shared ground conductor is practical, male plug 102 can be built with only three segments, one of which is a shared ground.

Embedded in a Battery Pack or Peripheral

FIG. 10A illustrates a male plug 102A that is configured with a four-wire cable. Conductive wires 123A and 125A can be, for example, attached to an external power supply (not shown) configured to deliver a controllable output voltage to a host device (not shown). Rechargeable battery pack 187 (in FIG. 10B) is assumed to be the power source of such a host device. In order to determine the correct output voltage of an external power supply, a second set of conductive wires 123B and 125B is used. This second set of wires is connected through male plug 102A and mating female receptacle 189, so that the output voltage of battery pack 187 can be read at conductive wires 123B and 125B. Conductive wires 123B and 125B serve as voltage "sense" lines that read the voltage of battery pack 187. Once that voltage is acquired, which can be done through a simple A/D converter on a processor board, the external power supply's output is configured (perhaps by software that programs the power output) to match the battery pack's voltage. This voltage is then delivered to a host device (not shown). This example of connector 102A allows an external controllable and configurable power supply to deliver a correct voltage to a host device, while simultaneously removing battery pack 187 from a host device's power circuit.

By including an N-signal switch (not shown) in conductive lines 123B and 125B (FIG. 10A), a battery-voltage reading circuit can be reconfigured to deliver an appropriate charging power signal to battery pack 187. This adds further flexibility to this interactive circuit. Thus, conductive wires 123A and 125A can be dedicated to powering a host device, while simultaneously conductive wires 123B and 125B can be dedicated to charging battery 187.

Male plug 102A's pin assembly 127 in FIG. 10A is segmented by insulators 179A, B, and C. Equivalent insulators 180A, B, and C are located between conductive segments 182A–D in FIG. 10B.

Y-Connector

The circuits created in wiring female receptacle 189 in FIG. 10B serves as a Y-connector to the battery pack and host device. Conductive wires 197 and 195 go only to the battery pack's cells 211A and B at terminal end 207 and 209. Conductive wires 199 and 193 are directed to conductive pads 203 and 213 that interface with mating electrical contacts on a host device (not shown). Thus, conductors 197 and 195 service battery cells 211A and B, while a second set of conductors 199 and 193 service a host device (not shown).

To trace the circuits referenced above in FIGS. 10A and B, an exterior power supply and related voltage-sensing circuitry (not shown) is used as a non-limiting example. The external voltage-sensing circuit related to a power supply (not shown) starts at battery 187's terminals 207 and 209. Conductive wires 195 and 197 attach to battery terminals 207 and 209 electro-mechanically at 197A and 195A respectively. At female receptacle 189, conductive wires 195 and 197 are attached to segments 182B and 182C. When pin 127 of male connector assembly 102A is inserted into female receptacle 189, female segment 182B is in contact with male pin segment 181B. From segment 181B, the voltage sensing signal travels along conductive wire 123 to the external sensing circuit (not shown). Male plug 102A's segment 181C provides a second conductive path to wire 125 of the external sensing circuit (not shown).

A second set of conductive wires 123B and 125B in FIGS. 10A and B, in this non-limiting example, are electrically attached to conductive segments 181A and 181D along segmented pin 127 in FIG. 10A. The power signal's source for this circuit is an external power supply (not shown) that is configured to the matched input of a host device (not shown). When pin 127 is inserted into female receptacle 189 of battery pack 187, pin segment 181A is electronically connected to segment 182A in female receptacle 189. A power signal travels along conductive wire 193 to contact pad 213.

Wire 125B in FIG. 10A in this circuit is electrically attached to segment 181D on male plug 102A's pin 127. When pin 127 is inserted into female receptacle 189, pin segment 181D mates to female segment 182D, so that power signal can flow along wire 199. Battery pack wire 199 terminates at contact pad 203.

The Y-connector feature of a connector assembly 102A and 189 in FIGS. 10A and B respectively, is created by an insulator 201 that is interposed between contact pads 203 and 213 in FIG. 10B. Cross-section D—D in FIG. 10B is detailed as a cross-sectional view in FIG. 11. Flexible insulator 201 FIGS. 10B and 11) resides between battery cell 211B's positive terminal 209 (onto which is electro-mechanically joined conductive wire 195 at attachment 195A). Contact pad 213, which previous to the insertion of insulator 201, was in contact with battery cell terminal 209, is now the terminus of a separate circuit created by attaching conductive wire 193 (not fully visible here) at electro-mechanical joint 193A. Contact pad 213 is exposed through the housing of the battery pack (not shown), so as to make contact with a host device's mating contacts (not shown). Thus, power signals to or from battery cell 211B occur on a separate circuit from the now independent electrical circuit to a host device, represented by contact pad 213.

As with the connector modality in FIGS. 1A–8, a jumpered plug (see FIG. 8) re-establishes the circuit between battery 211B and host device (represented by contact pad 213). When inserted, this jumpered male plug re-establishes the direct circuit between the battery pack and its host device.

In lieu of a jumpered male plug to re-establish a direct circuit between battery 187 in FIG. 10B and its host device, conductive wires 123 or 125 to external devices can have an electrical or mechanical switch. This switch closes the electrical loop when external devices are turned off (but left connected). For example, a controllable switch (microcontroller) can be employed in the external device that is closed when an external device is in the OFF state.

In FIGS. 10A and 10B, power from battery cell 211B travels along conductor 195, to female contact 182B, then into male pin 127 at contact 181B, and out to a conductive wire 123A. An external switch (not shown) can electrically connect conductive wire 123A to a conductive wire 125A. This wire is attached to contact 181A on male pin 127, which mates with contact 182A on female socket 189 (FIG. 10B). The power signal then travels along conductor 193 to contact pad 213. Thus, power from battery cell 211B can flow to its associated contact pad 213, then into an attached host device.

Size is Important

Female receptacle 189 in FIG. 10B is of a size that fits in the "valley" formed between adjacent battery cells 211A and 211B. Depending on the number of cells in a battery pack, and how they are arranged, it may be feasible to mount female receptacle 189 in other configurations, so the example shown here is not limiting. Furthermore, all connector assemblies discussed in this document and shown in the various Figures, and any variants or alternative embodiments, can be installed either in a host device as a primary (or secondary) power-input port connector, or in a battery pack 187.

Four Variables

Figure 18A:
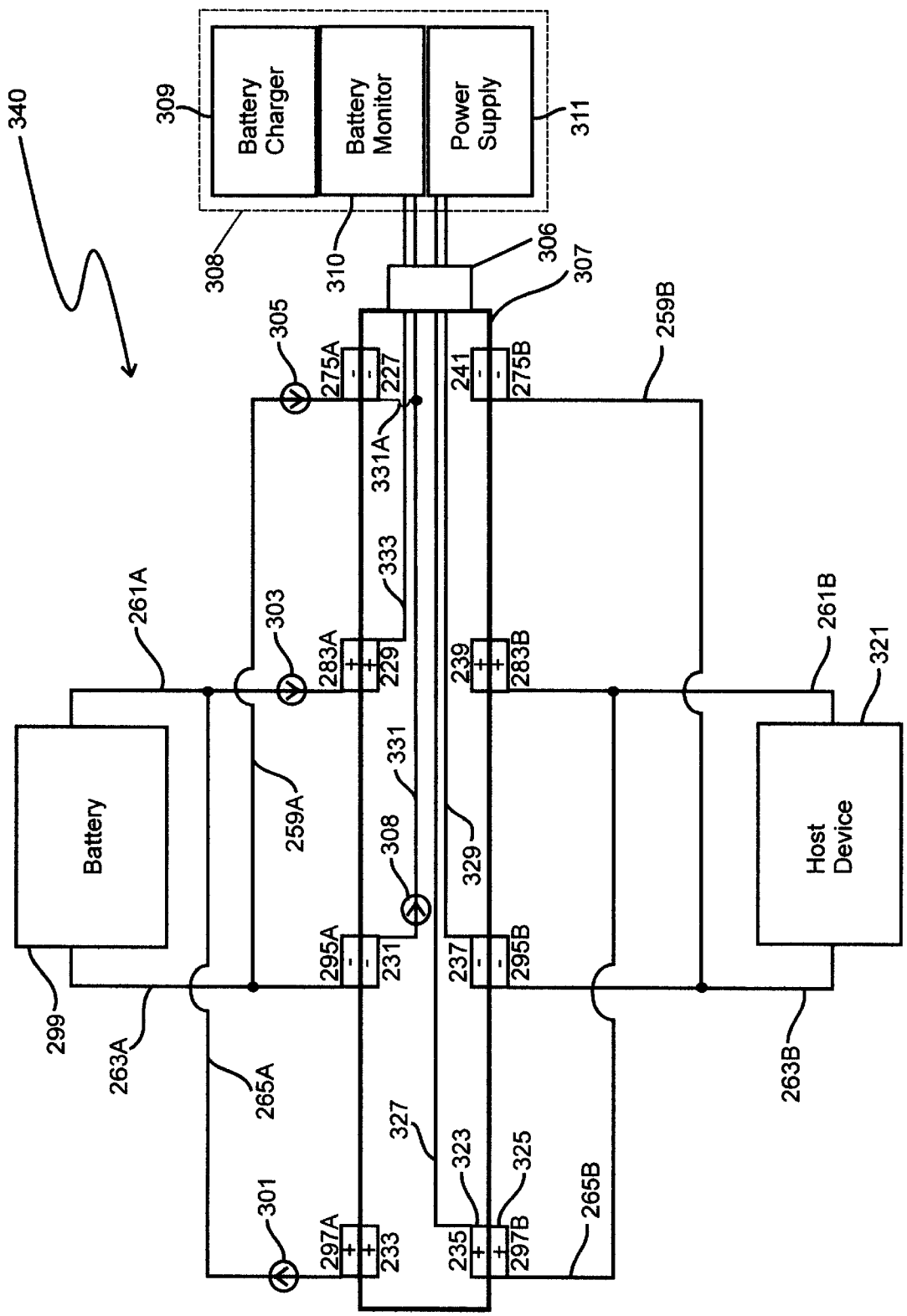
FIG. 18A is a generic block diagram depicting a host device and its associated battery power source that are wired through a connector assembly such as that illustrated in FIG. 17, with a positionable male plug in a first position so that external devices capable of charging a battery, monitoring a battery, and powering a host device, each being capable of operating independently and simultaneously.

Various embodiments of a connector assembly of the present invention are configured differently, based on four generic variables. The first variable is the specific function of any external devices. Intended external devices, and their uses, determine the configuration and wiring of a connector assembly. For example, if there are two external devices, the first functioning as a battery charger, and the second as a power supply, the routing of power signals through the male and female connector elements is specific to charging a battery, and powering a host device. If the external battery-charging device is to operate independently of the power supply device, then a connector assembly should be used which has either four electrical segments, or a connector assembly that is reconfigurable (perhaps by rotating a "key" to two discrete positions), should be employed. FIGS. 18A and B show such a two-position selector, wherein a first position (FIG. 18A) of a rotating key addresses battery 299 in a "read-only" mode, while a second position (FIG. 18B) of a rotating key addresses battery 299 with a circuit that allows battery charging.

If a battery charging function, and providing power to a host device function, are to be performed simultaneously, then a four-segmented connector assembly that has a "Y-connector" capability is called for. If a key connector approach is taken, a single rotation of the key should cause the two circuits—battery charging, and delivering power to a host device—to be engaged at one position of the rotating key. The wiring schema in FIG. 18B is appropriate for simultaneous battery charging and delivering power to a host device, so the circuits required in FIG. 18A to perform a battery read-only mode would not be required.

A four-wire cord between one or more external devices, in conjunction with a four-segmented male plug, may provide two simultaneous independent functions. FIG. 10A and B, and the related text in this document, describe a means of enabling two external devices to perform more than two functions. By the use of an insulator, as described elsewhere, as well as a "jumpered" male plug, a connector assembly comprised of a male plug 102A, and a female receptacle 189, can deliver power from an external power supply to a host device, allow battery pack 187 to still be active should the external power supply be shut-down, prevent battery charging and, finally, restore (using a jumpered male plug) the circuit between battery pack 187 and its associated host device.

The functions a connector assembly of the invention performs are not necessarily the receiving or sending of an electrical signal. A disruption of an electrical path is a function, so eliminating battery charging is considered a valid function, for example. The use of insulators, "Y-connector" branching and redirecting of electrical paths, and various means of making electrical signals flow only in one direction (e.g., diodes, switches, etc.) all combine to optimize the functional capabilities of a connector assembly of the invention.

Second Variable

The second variable relates to the number of segments on a male plug (and on a corresponding female receptacle). One of the differentiators between a connector assembly of the invention and other connector devices is an ability to create new circuits with a minimum of connector contacts. For example, FIGS. 19, 20, and 21 A–B depict a simple, two-contact male plug. In one of these connector assemblies embodiments, a rotating of the male plug creates two electrical paths, because opposing a conductive pad on the male plug is an insulator. This insulator disables a branch of a "Y-connector" that exists in the mating female, through a pair of spring contacts that self-close. Thus, in a first position of the male plug, the battery is addressed, and in a second position, the host system is addressed.

An alternative modality of this connector assembly in FIGS. 21A and B uses a simple diode to create a third electrical path, so that even if the male plug is engaged to its mating female receptacle, power can flow from the battery to its host device. This embodiment eliminates the rotating of the male plug, and the way functions achieved with this two-contact connector are enhanced. Diodes, as directing the path of electrical signals, are also illustrated in FIGS. 18A and B. Note that diodes can be incorporated in a male plug, or in the circuits created in, to, or from a female receptacle.

The connector assembly of the invention can function with at least one contact, that single contact being a jumper, as is illustrated in the male plug in FIG. 8. Reconnecting discrete paths with jumpers or terminator blocks compares to the use of diodes, but jumpers have the advantage of allowing bi-directional electrical signal flow along a circuit, whereas a diode can only establish a one-way path.

Depending on the function to be achieved, a connector assembly of the invention can function with no conductive contact elements at all. For example, if the anticipated function is to disable battery charging, a male plug 433 in FIG. 21A can achieve that function by having no conductive elements at all. A simple insulator (non-conductive) male "blade" inserted between spring contacts 417 and 419 electrically disrupts the battery-to-host circuit, creating an open circuit. This single insulator blade would, of course, have no electrical cords, but would be a sort of single-element terminator plug.

Figure 11:
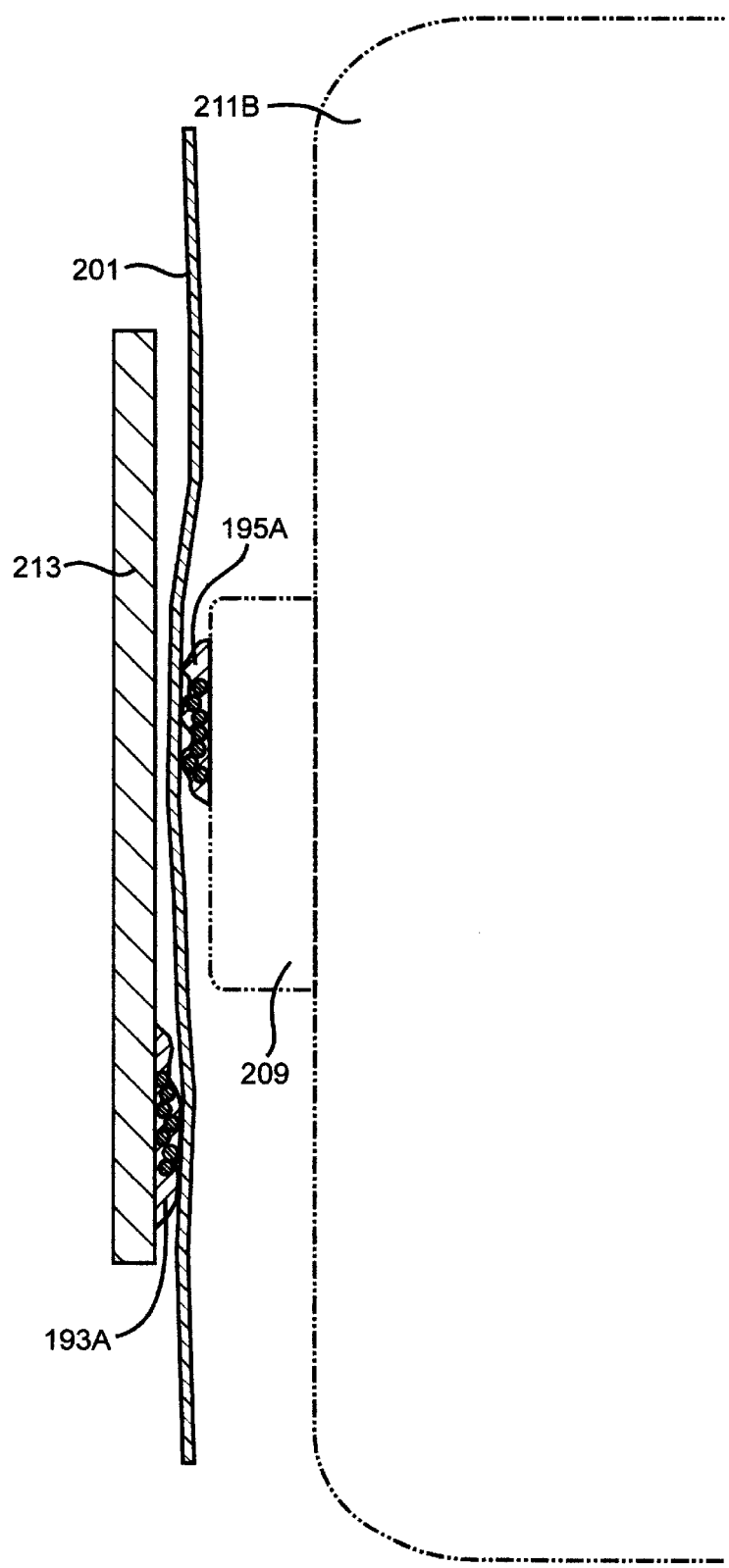
FIG. 11 is a cross-sectional view relating to the wiring and electrical paths in FIGS. 10A and 10B, showing of the detail of a battery terminal, an insulator, and the associated wiring.
Figure 12:
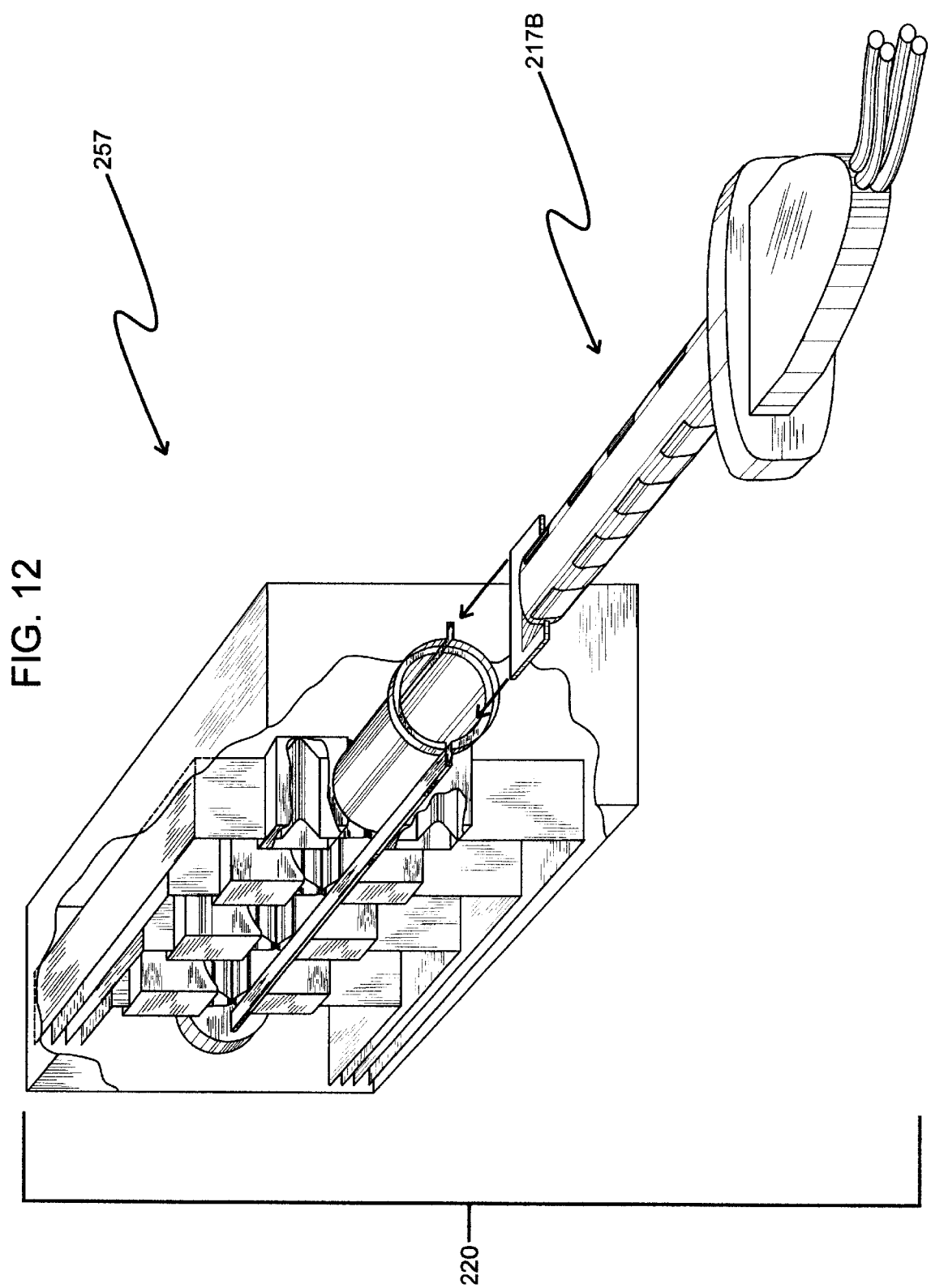
FIG. 12 depicts the two major elements—a multi-contact male plug and a mating female receptacle which has self-closing contacts—of a connector assembly that is rotated to various positions in order to create different electrical paths.

The role of insulators plays an important part of the operation of a connector assembly of the invention. FIG. 11, for example, depicts an insulator 201 inserted between a battery terminal 209, and its associated conductive contact 213. Contact 213 can be a spring clip in a battery holder, and battery terminal 209 would electrically engage it, allowing power to flow to a host device from a mating contact to 213 (not shown). By inserting insulator 201, the electrical path between a battery and its host device is disrupted. This open circuit is now a branch of a Y-connector, in effect, and the battery, or its host, can be addressed independently. Where such insulators are placed, and the number of them, is not limited to the examples shown in the figures, and in the text of this document.

Third Variable

The third variable that determines the configuration of a connector assembly and its related wiring, use of diodes, insulators, segments, rotating capabilities, etc., is the number of contacts in the battery pack-to-host circuit. Simple two-contact battery packs have been discussed relating to FIGS. 11 and 21A–B, and elsewhere. Battery packs can have multiple discrete connector contacts, some of which are for power, and others for data. "Smart" battery connector contacts typically have three data lines, and two power lines, but only four lines are required. A multi-contact male plug, such as that shown in FIGS. 13 and 14, can be used to support both power and data functions. Also, multi-segmented styles of male plugs, such as in FIGS. 1A and 10A, provide an alternative to the rotating male plug style in FIGS. 13–14. The use of insulators in such mixed-signal embodiments of a connector assembly applies to disrupting data lines, as well as power. For example, disrupting the Clock (C), or Data (D) line may be just as effective a means of temporarily disabling battery charging as is causing a power signal to be disrupted.

Fourth Variable

The fourth variable is where in the battery-to-host device's power circuitry a connector assembly is installed. A female connector may be located in an accessible area of a host device, to serve as a primary power-input jack, as depicted in FIG. 1B, for example. Most any of the embodiments of a female receptacle illustrated or discussed herein can be relocated outside a battery housing. Where the circuit between a power source (external to, or internal to a host device) and associated devices is changed by the inclusion of a female receptacle into an existing circuit is not limited to only within a battery housing. Locating a connector element in a battery pack affords a simple upgrade for existing host devices, by simply removing the present battery pack, and replacing it with one that has been upgraded with a female receptacle of the invention.

"Key" Connector

An embodiment of a connector assembly of the invention is a "key" connector, which incorporates an insulator (and/or other elements, such as diodes) and various electrical contacts into a male plug, and its associated female receptacle. A key connector does not necessarily have to rotate inside its mating female, as is the case, for example, with male key 217A in FIG. 17. A key connector 330, for example, in FIG. 20, is removed, rotated then reinserted.

The rotation of a connector can be used to align electrical contacts with corresponding mating contacts, as well as to mate an insulator with one or more electrical contacts. Connector 330 in FIG. 20 is both aligning its conductive contact 340 to either mating female contact 378, or 374, thereby activating one of two electrical paths of a Y-connector. At the same time, insulator 344 is deactivating the opposing branch of the Y-connector.

Spring-tensioned contacts are used with key-type male plugs to avoid the use of discrete "jumper" plugs or terminating blocks (see FIG. 8). By having a female connector element that uses self-closing contacts, the male key is held in place by the tension of the tensioned female contacts, and positive electrical contact is enhanced.

FIGS. 12–15B show a male plug 217 (A, B, or C) configured to physically resemble a key. Male plug 217 (A, B, or C) can be inserted into a female receptacle 257 (FIGS. 16 and 17) then rotated. Contacts within female receptacle 257 are "self-closing," so a circuit between a battery pack and its host device is automatically re-established when a male "key" is removed.

Figure 17:
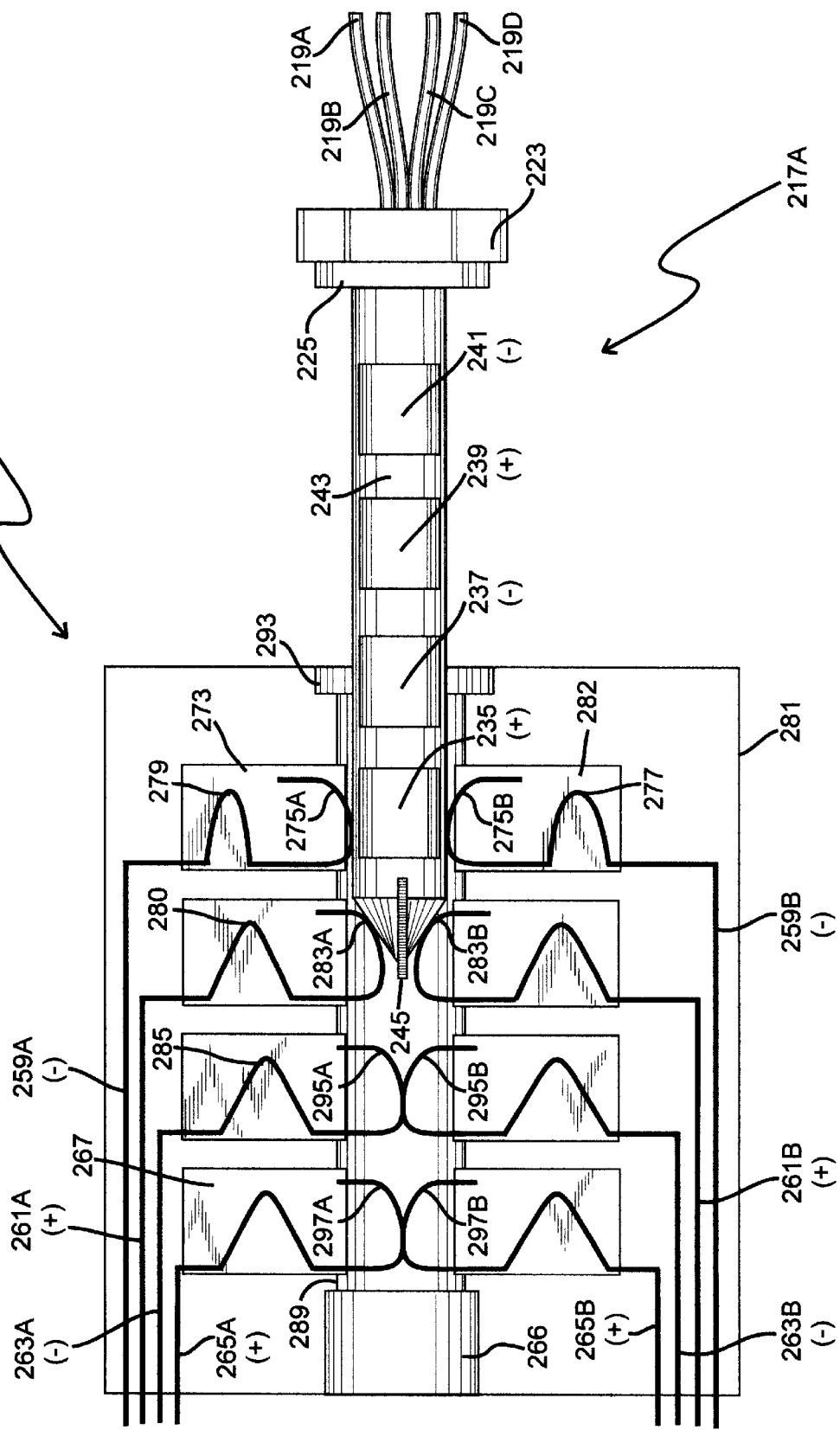
FIG. 17 is a cross-sectional view of a multi-contact female receptacle as shown in FIG. 16, depicted here with a mating male plug as illustrated in FIGS. 13 and 14 partially inserted.

Like a key in a lock, male plug 217A in FIG. 17, for example, can be rotated in at least two distinct positions. FIG. 18A shows a first position, wherein a host device 321 is capable of being powered by an external power source 311, and at the same time a battery 299 can be monitored by an external unit 310. When a key 217A is rotated from its first position to a second position, as shown in FIG. 18B, host device is still capable of being charged (albeit through a different electrical path), and battery 299 can be charged from an external charger 309. There is a third position of a male key 217A, which is suggested in FIG. 17. When male plug 217A is fully inserted and engaged with female receptacle 257, all female spring contacts are disrupted by male key 217A's insulated shaft 243. So, by inserting such a male key, and not rotating it, a full-OFF (open) state in all of the impacted electrical circuits is achieved. Thus, a key connector may be used as an effective ON/OFF switch, which alters relevant electrical wiring or paths in a multiplicity of ways.

FIGS. 13–15B show non-limiting examples of a "key-style" male plug. The primary differentiator between "keys" 217 (A, B, and C) is the mechanical method of spreading the pre-tensioned contacts in female receptacle 257 in FIGS. 12, 16 and 17. "Spade" tip 245 is shown in the two views of the same "key" 217A in FIGS. 13 and 14. Side strakes 247 afford an alignment of the key when inserted in mating female receptacle 257 in FIGS. 12, 16 and 17. Squared off back edges 247 of spade 245 latch key 217A, for example, in the female receptacle in circular chamber 266. Knob 223 allows for quick recognition of the key's rotational position. The left and right ends of knob 223 can be color coded, or labeled as in FIG. 14, to indicate the selected function, such as "Battery Charge," or "Host Power," for example.

"Key" Features

FIG. 15A shows a male "key" 217B, with no latching provision. In this embodiment, the spring tension of paired electrical contacts 297A and B, 259A and B, 283A and B, and 275A and B in female receptacle 257 (FIG. 17) constrain a key 217B. Because key shaft 243 is wider than its height (thickness), rotating the key creates even further compression of the spring-tensioned contacts in receptacle 257.

Variations of keyways, key knobs, key shaft tips, and other physical features, are not limited in any way to the configurations shown here.

Figure 13:
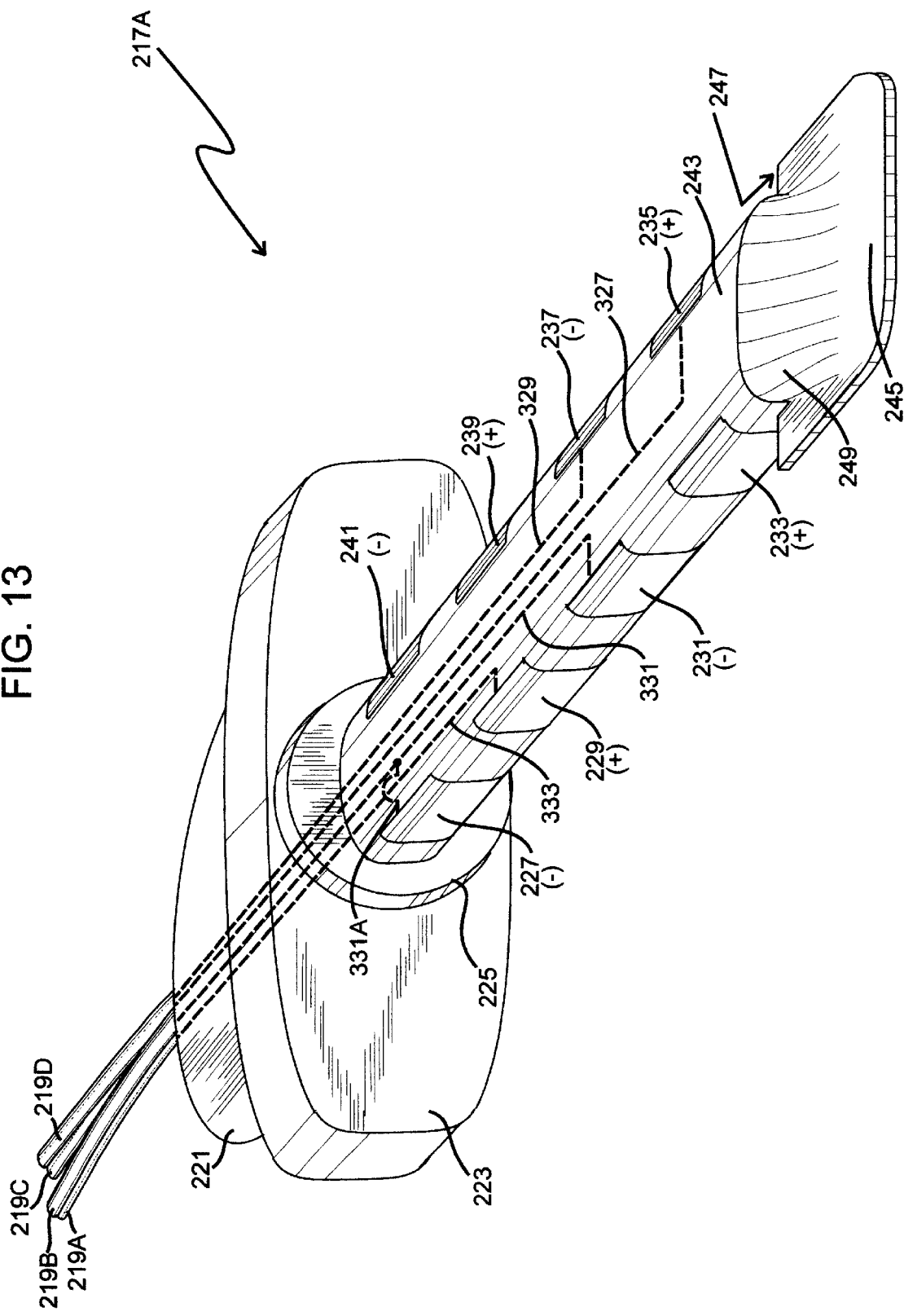
FIG. 13 is a detail view of one of the embodiments of a multi-contact male plug shown in FIG. 12 which has an alignment element that also prevents the plug from disengaging once it is inserted, and which also can be configured to provide security "key" functions.
Figure 16:
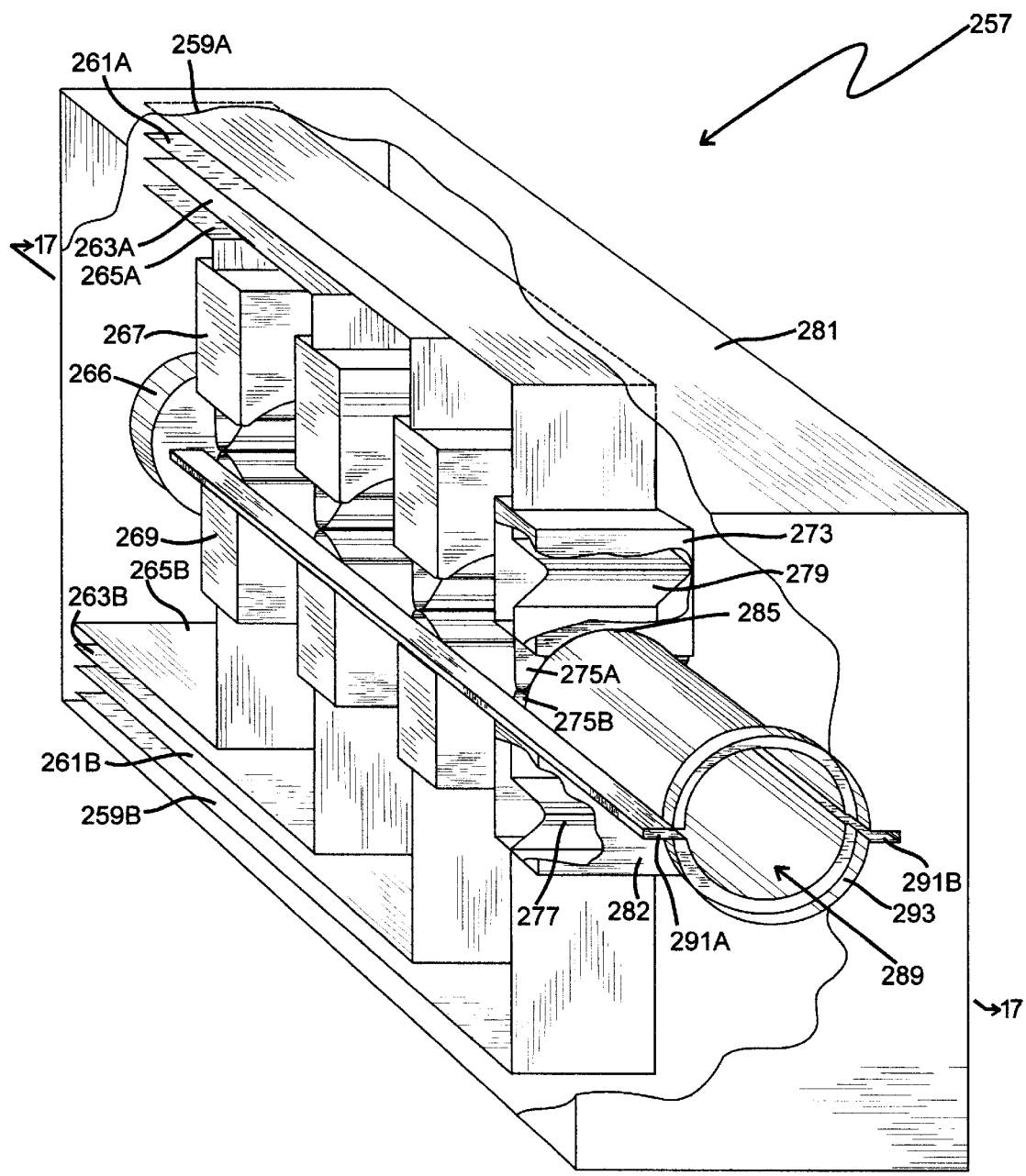
FIG. 16 depicts the internal elements of a multi-contact female receptacle, including self-closing spring contacts that re-establish original circuits when a mating male plug shown in FIGS. 13 and 14 is removed.

FIGS. 13 and 14 illustrate a male "key" 217A. A "spade" tip 245 affords a method of keeping key shaft 243 aligned during insertion and removal from a female receptacle 257 (FIG. 16). Squared back edges 247 of spade tip 245 keep key 217A from being pulled out accidentally, once it is rotated within its female receptacle 257. A cylindrical cavity 266 (FIGS. 16 and 17) captures male spade tip 245.

A disk 225 at the base of male shaft 243 in FIGS. 13 and 14 ensures that the rotation of the key is along its centerline axis. Disk 225 seats in a mating recess 293 in female receptacle 257.

Key shaft 243 (FIG. 13 and elsewhere) is composed of non-conductive material. Dimensionally, shaft 243 can be expressed in a number of embodiments. A flat, thin "blade" may be used, such as that shown in FIGS. 19–21B, but with electrical contact pads equivalent to 227, 229, 231, 233, 235, 237, 239 and 241 from FIGS. 13 and 14. Being a flat blade, the eight contacts would be placed on the top and bottom surfaces (this embodiment is not shown). Such a described thin, flat key would not rotate, of course, unless it were used as is male blade 330 in FIGS. 19 and 20, with a removal of the male key, a rotation to a second position, then a re-insertion. For a key shaft 243 that is intended to rotate within its mating receptacle, the cross-section profile can be, without being limited to, round, oval, square, or multi-sided (six sides, eight sides, etc.).

The number of contact pads used on a male key is determined by the desired function, such as battery charging, power to a host device, etc. FIGS. 13 and 14 show a key 217A with eight contact pads, because a battery pack and a host device typically require four contact pads each. For a mixed-signal application, such as both data and power for a "smart" battery and its host device, eight contacts would be allocated as four for smart battery use (two for power, and two for data), and four for power and data to a host device (two for power, and two for data). Shared power contacts are practical in some applications, so that the positive or ground conductors of a battery, an external device, and a host device can, under certain conditions, be shared. This helps to minimize the number of contacts required on a key connector.

Any key with at least two contact pads is acceptable. The spacing of contact pads 227, 229, 231, 233, 235, 237, 239 and 241 in FIGS. 13 and 14 is determined by the spacing between the mating tensioned contacts in female receptacle 257 (see FIGS. 16 and 17).

A Security "Key"

Finger hold 221 in FIGS. 13–14 can be an insertable flange (or backshell) that attaches to a mating receptacle on the end of a power/data cord, so that the entire "key" shaft is removable with handle 223. By making elements of key 217A detachable, a shared power/data cord can be used, and various keys can be employed to provide flexibility in connecting with a variety of devices.

Each unique detachable key shaft may be made to a configuration that properly mates to only one specific device. Such a security key connector assembly can be used in situations, for example, where there may be a need to have limited access to computers or other electronic equipment.

Without the right electrical security key to connect power to a host device's power circuitry, a host device (a computer, for example) cannot be turned on.

Other applications of security keys can limit in what mode host devices and their peripherals (an example of which is a rechargeable battery pack) are able to operate. An example of a restricted mode of operation for a host device (with its internal battery pack) is a laptop computer (or equivalent device) that can only be used on a commercial aircraft if its battery pack is not being charged. Configuring a key connector that, by its physical configuration, placement of contacts, and the wiring of the male and female units, renders the battery pack circuit inoperative when the key is inserted, affords passengers safety. A key 217A (FIGS. 13–14), turned to a specific rotational position, creates such security. A host device and its battery system can thus operate in unique modes by the use of a connector "key."

Self-Closing Contacts

FIGS. 16 and 17 show a generic female receptacle 257, here configured to be compatible with a male key 217A in FIGS. 13 and 14. The electromechanical action of electrical contacts 275A and B in female receptacle 257 is by the controlled upward and downward movement of conductive clips, allowing them to be electrically self-closing. Each of the eight clips shown has a bend 279, that allows its female contact to remain in contact with an opposing contact pad (275A and 275B in this example) when a male key plug 217A (FIGS. 13 and 14) is removed. When all eight spring contacts return to their closed positions, female receptacle 257 is automatically reconfigured to be electronically "transparent," i.e., all electrical signals travel paths as if connector element 257 wasn't present.

Flexible conductive clips 275A or 275B (as representative of the other six clips) in FIGS. 16 and 17, are kept aligned by pre-molded retaining cavities 273 and 282 (as representative of the other six equivalent cavities). These cavities prevent sideways and fore/aft movement of contact clips 275A and 275B. Note that the eight retaining cavities each have a curved fore and aft edge 285 (FIG. 16) that provide clearance for the shaft of a male plug 217A (FIGS. 13 and 14), as well as clearance to allow for a male plug's rotation. The alignment of these curved openings 285 creates a circular "tunnel" 289 (FIGS. 16 and 17) that runs the length of female receptacle 257, as seen in cross-sectional view E—E (FIG. 17). Tunnel 289 terminates in circular cavity 266. This cavity has a circumference large enough to clear the sweep of spade tip 245 on male plug 217A (FIGS. 13 and 14). Slotted guides 291A and B in FIG. 16 keep male plug 217A aligned as spade tip 245 passes through tunnel 289.

FIG. 17 illustrates a cross-sectional view E—E of a female receptacle 257 in FIG. 16. Male plug 217A is shown partially inserted into tunnel 289, and opposing contact clips 275A and B are already electrically disconnected. Contact clips 275A and B are seen fully compressed into their respective retainer cavities 273 and 282, which keep contact clips 275A and B from distorting or moving out of alignment with each other. Compressed bends 279 and 277 in contact strips 259A and 259B provide contact clip compression. Bends in contact strips are not the only way to provide compression of contact clips 275A and B, and any equivalent mechanism is acceptable.

The amount of compression bends 277 and 279 in FIG. 17 must provide is determined by the thickness of male plug 217A. The thickness-to-width ratio of a shaft 243 determines the amount of extension and compression traveled bends 277 and 279 must provide. These inter-related dimensions of shaft 243's thickness and width, along with the spring tension at bends 277 and 279, determine the amount of torque it will take to rotate a male plug 217A once it is fully inserted. At a given width, a thinner male plug will insert with less force, but will require greater rotational force. Larger bends 277 and 279 will give a softer feel during insertion, but at some loss of positive and accurate return-spring closure action (and the entire female receptacle 257 will grow larger). Enough thickness on male plug 217A to mount contact pads 235, 237, 239 and 241 in FIG. 17 (and sufficient thickness to run related internal wiring 219A–D) must be considered.

Paired opposing conductive strips 259A and B, 261A and B, 263A and B, and 265A and B in FIGS. 16 and 17 are expressed as flat contacts that terminate at or slightly beyond the back edge of female receptacle 257's housing.

A reasonable mounting location for a receptacle 257 in an existing battery housing is in the "valley" created by two cylindrical cells (see FIG. 10B). It may be that the orientation of a female receptacle 257 may be at 90-degrees to that shown in FIG. 17, and the spring loaded-contacts are oriented horizontally, instead of vertically. In battery packs which have yet to be designed, the depicted rectangular configuration of a female receptacle 257 would best be served by allowing space for the connector element to occupy the full height of the battery enclosure. The space issue is less problematic if female receptacle 257 is installed in a host device, e.g., laptop computer, as its primary input power jack (reference FIGS. 1A and B).

If a female connector mechanism is to be mounted in a battery pack, attention should be paid to the width of the knob 223 on male plug 217A in FIG. 13. It is undesirable to have the ends of the knob protrude above or below the thickness (height) of the battery housing when the male key is rotated. In such installations, the size and shape of knob 223 will be space- and clearance-driven.

Contact pad size is determined by the need to carry certain levels of power at an acceptable temperature rise. The spacing, size, and location of contact pads 227, 229, 231, 233, 235, 237, 239, 241 (or equivalents) on an insulated shaft 243 in FIGS. 13–15B are not limited. Contact pads can be on any exposed face of shaft 243. Contact pads do not all have to be aligned along the same face, or on opposite faces of shaft 243. Non-opposing faces can be utilized. For example, there can be contact pads on the top (or bottom) faces of a shaft 243 that activate a circuit upon insertion, with other contacts on the sides of the shaft that activate when "key" 217A (FIGS. 16 and 17) is rotated a quarter turn (assuming that shaft 243 has four sides). Other surfaces for placing conductive pads can exist at the tip of a shaft, e. g., tip 251 of shaft 243 in FIG. 15A can be conductive.

Any dimensional considerations or proportions indicated or suggested by any of the figures presented herein should only be interpreted as suggested relative sizes of parts or sub-assemblies. Actual size, shape, and proportions may differ depending on specific applications and implementations. So, too, will there be variations in mechanical guides, locking mechanisms, insertion systems, and electrical contact shapes.

Design Considerations

In fabricating contacts on a male plug, and mating contacts in a female receptacle, the current-carrying ability of the conductive materials should be sufficient to handle the power load of a host system. With laptop computers, for example, 50-Watts is not uncommon to power a host system. The "ampacity" rating (at temperature) of contacts, wires, etc., should be optimized to not create any power losses. The confined space limitations inside a typical battery pack will pose potential barriers to large-surface-area electrical contacts, or the use of heavy-gauge wiring. The use of space-saving flat metal zinc (or nickel-plated zinc) strip conductors is advantageous in routing power lines inside a battery enclosure.

If a connector assembly is to be integrated into a new battery pack at the design stage, then wire troughs and space for a female receptacle can be planned. For retrofitting existing battery packs, which cannot grow dimensionally, remolding the pack's plastic housing to allow for attaching a female receptacle and creating wiring troughs is a valid approach, but only if production quantities justify the additional cost. Since female connectors can be integrated as retrofits of existing battery packs, the emphasis on selection of conductive materials is a consideration. Anyone skilled in the art of connector design and fabrication will be able to fit any of the examples of the connector of the invention into an existing battery pack.

With existing battery packs, space inside a pack's enclosure can be created by removing older, lower-capacity battery cells, and replacing these cells with newer, smaller (and perhaps even higher energy-density) cells. Lithium-Ion cells manufactured in 1996, for example, were twice as big, and almost half as energy-dense as Li-Ion cells manufactured in 1998. Older "sub-C"-sized cells and 18 mm cells can be replaced with 17 mm cells, or even 15 mm cells, without any trade-offs (and perhaps even improvements) in total pack capacity. Substituting smaller cells creates room for a female receptacle and the related wiring, without having to modify the battery pack's plastic enclosure.

Polymer Lithium-Ion cells, with their rectangular shape and variable form factors, can also be employed in existing battery enclosures. Rectangular cells yield more energy-density per square inch. The space left as "valleys" between columns of cylindrical cells can be eliminated by using polymer cells, thus freeing up considerable room (as much as 20% of an existing battery pack's volume) for a female connector.

The modalities of a connector assembly comprised of a male plug 102, or 102A and female receptacle 189 in FIGS. 9 and 10A–B (as well as their equivalents 330 and 360 in FIGS. 19–20) lend themselves to the space limitations of a battery pack. Female receptacle 257 in FIGS. 16 and 17 looks large as drawn, but this receptacle can be reduced in size by using a flat spring-clip beam design, such as that shown in FIG. 20.

How a battery pack inserts into its bay ("cavity") in a host device is a key consideration when designing a multi-contact connector assembly. The modalities shown here illustrate battery packs that have columns of cells arranged end to end, and the columns are stacked side by side. A convenient "V" between each column of cells is available for a connector and related wiring. The battery pack itself, as suggested in FIGS. 10A and B, and FIG. 20, inserts end-wise into its battery bay, so that a connector port for the male plug is accessible along an exposed face of the battery pack.

Alternative Connector Insertion Modes

However, battery packs also insert into cavities so that the large flat surface of a pack is inserted first. This leaves not the edge of a battery housing exposed for a male plug, but the wide flat top (or bottom) surface of a battery housing is presented. Thus, from the vantage point of the internal cells, a connector inserts downward into the "valleys" between the cells, instead of into the end of a "V"-shaped valley.

A simple design for a connector assembly that inserts from the "top" or "bottom" of a battery pack comprises a wedge like that of insulator block 364 in FIG. 20. This tapered wedge is contoured to fit into the valley or trough formed between two side-by-side adjacent cells (it helps here to view the connector being discussed as being inserted through the housing base plate 362 in FIG. 20, i.e., from the bottom, upward.

On the exposed curved surfaces of such a contoured wedge are mounted slightly raised conductive contact pads that mate to conductive contacts attached to a thin insulated surface of the two battery cells. The wedge snaps into a cavity in the battery housing, so that the mating conductive pads are held to each other by the wedge snapping into its cavity in the battery housing. The contact pads on the curved surfaces of the wedge can be slightly "sprung" away from the concave surface, so that they compress when engaged against their mating equivalents along the convex surfaces of the cells.

The conductive pads attached to the cells can be, for example, comprised of a flex board made of polyester or mylar, with exposed conductive areas matching those on the form-fitted wedge. Conductive traces on the flex board route power to the appropriate cell attachment points, or exposed battery contacts on the outside face of the housing. Such flex-boards may be mounted with double-sided tape, or thin foam tape, so that the foam compresses slightly when the contoured wedge snaps in place, thus assuring adequate contact-to-contact pressure.

For battery packs that use flat, surface-mounted contacts on the outside surface of the battery pack to interface with a host device, a membrane switch approach can be employed. This connection is established between a host device and a battery enclosure. Non-smart batteries that have no data contacts, but only two or three small exposed contact pads on an exposed area of the pack's housing, can be upgraded to a multi-contact interface with an externally-attached connector. Using heavy-duty power membrane switches, a section of the membrane is inserted between the battery pack housing and the mating contacts in the host device.

The host-side interface typically has spring clips that mate to the flat pads on the battery pack, pressing against the battery pack's flat contact pads to ensure conductivity. By inserting an appropriately-sized membrane switch between the battery pack and the host device's mating contacts, an interrupted circuit is created that separates the battery contacts electro-mechanically from their mating contacts in the host device. This membrane switch is different from traditional ones, because it has exposed electrical contacts on both sides, instead of outer layers that are insulators. The center insulator layer is sandwiched between two surfaces that have exposed conductive spots, to prevent power (or data) from flowing from battery to host.

Conductive traces route the power and/or data from the depressed membranes to an appropriate place on the battery housing to allow an attached cable to an external device. This is consistent with my U.S. patent application Ser. No. 09/105,489 as filed previously as U.S. Provisional Patent Application No. 60/051,035, dated Jun. 27, 1997, and U.S. Provisional Patent Application No. 60/055,883, dated Aug. 15, 1997. Reference also U.S. Provisional Patent Application No. 60/114,412, dated Dec. 31, 1998, and U.S. Provisional Patent Application No. 60/114,398, dated Dec. 31, 1998.

The use of a membrane switch connector interface covers the varied location and spacing of battery enclosure contacts. By having an area of this membrane construct that can be simply overlaid on the exposed contact area of a battery pack, an unskilled person can attach this connector assembly to a battery pack without concern for properly aligning electrical contacts. The membrane switch is attached to the contact interface surface of a battery pack inserted in its cavity within a host device. A host device's spring contacts depress only those membrane switch coordinates that match the location of the actual electrical (or data) contacts. Those switch coordinates in the membrane that are not depressed when a battery pack puts pressure against a host device's spring contacts are ignored. Thus, a "one-size-fits-all" battery/host connector interface is created that does not have to be custom matched in electrical contact spacing and location for every battery pack.

Corner Connectors

Another approach is to use "corner connectors." AMP (Harrisburg, Pa.) manufactures positionable right-angled connectors that can be mounted on corners of devices (reference AMP "Battery Interconnect System" Application Specification document #114-24005). The limiting factor on a battery housing is that the cylindrical cells do not provide a fully unobstructed corner. There is more volumetric open area between two adjacent cells, than along the outside edge of the last column of cells. However, there is sufficient space along an edge of a battery housing, parallel to a column of cells, to insert a customized version of an angled corner connector. The AMP units are blade-style connectors, so the blade contour would be unusual, in having a curved edge to match the curvature of the cell.

Blade-style connectors do offer functionality within the wedge-shaped space between two columns of cells, as well. The shape of wedge 364 in FIG. 20, or wedge element 189 in FIG. 10B, allow for a male connector that resides within a battery housing, its blades pointing upward from the valley formed between two adjacent cells. A mating female receptacle is attached to an external power or data cord. This approach allows for a more compact male plug within the confines of the battery housing, while the larger insertable female receptacle is configured in the shape of a wedge. Of course, the more traditional approach of a mounted female receptacle within a battery pack, and a male plug connector attached to an external cord, is acceptable as well.

Cables and Muxes

For battery packs that install by inserting their larger top or bottom surfaces into a battery cavity (instead of sliding end-first into a battery bay), the issue of cabling is important. If the battery cavity is located on the bottom face of a host device, such as the underside of a laptop computer, then a round cord exiting from beneath the host device is not acceptable. There may not be enough clearance under a host device to route a round cable. Ribbon cables, or flex boards, are used in these situations. For power delivery, several of the 28-gauge conductors can be tied together to deliver sufficient conductivity.

FIGS. 12–15B illustrate a modality of the connector of the present invention that uses four-conductor wire, so as to monitor a battery, while simultaneously delivering power to a host device. The same functionality can be achieved by incorporating an N-signal switch that responds to the application of power by switching a pair of power pins. A switch so configured can be used to establish a junction between a battery and a host device, so that a Y-connection is created. This switch responds to the current flow from a battery along one branch of the Y-connector, so that it closes a circuit between an external power source and a host device. The presence of a battery in the circuit automatically triggers the flow of power between an external power device and a host device. Should the battery be removed, loss of power to the N-signal switch causes it to go open between the external power source and the host device. This adds an additional layer of safety to the connector system.

For low-voltage or data signal switching, for example, a Maxim (Sunnyvale, Calif.) MAX 4518 serves an example of the type of multiplexer used in a connector circuit to eliminate excessive conductors. Modifying the MAX 4518 so that it is driven by the simple application of a power signal only requires jumpers from pin 2 (EN) to pin 14 (V+), and a second jumper across pin 4 (NO1) and pin 15 (GND). Thus configured, a single power supply voltage (here from the battery) will trigger all four of this analog muxes' channels. The 4518 will operate with up to a 15 VDC maximum input. This is within some battery pack output voltages. For higher voltages, power FETs are used. The MAX 4518 can be over-voltage protected with external blocking diodes (consult the MAXIM data sheet # 19-1070). An upstream voltage regulator, preferably one with a wide range of input voltages, can be used with the MAX 4518.

EXAMPLES OF CONNECTOR ASSEMBLY CONFIGURATIONS

Because a multiplicity of elements may be integrated into an individual embodiment of a connector assembly, such as insulators, jumpered plugs, self-closing spring contacts, rotatable male plugs, segmented conductors, etc., two non-limiting examples of typical connector assemblies are presented here, to assist in understanding the inter-relationship of various elements.

First Example

A detailed description of a rotatable "key" male plug and an electrically self-closing female receptacle provides a non-limiting example of an effective upgrade to a host device, its associated battery pack, and several external devices. The connector assembly depicted here adds functionality that was not originally designed into the host device, or its battery. The external devices in this example may or may not have been designed specifically for the host device. These include here an external power supply, an external battery charger, and a battery monitoring device. These may be separate devices, or integrated together but capable of functioning autonomously. The following discussion is for purposes of illustrating specific implementations of the connector assembly of the invention, and it does not limit the possible construction, internal workings, elements, or uses for such a connector assembly.

FIGS. 13 through 14 illustrate two views of a male plug 217A. A mating female receptacle 257 is shown in FIGS. 16 and 17. FIGS. 18A and B diagram some of the possible circuits resulting from the use of the connector assembly.

Male plug 217A in FIGS. 13 and 14 is configured with contact pads 227, 229, 231 and 233 on one face of male plug's shaft 243. A second set of contacts 241, 239, 237 and 235 is mounted to directly oppose the first contact set. A set of four conductive wires 219A–D delivers power signals to various contacts. For this example, wire 219A is addressed to contact 229 along conductor 333. Wire 219B is connected electrically to its contact 231 along internal conductor 331. Wire 219C addresses contact 235 along internal conductor 327, and wire 219D is electrically active at its contact 237, along internal conductor 329. Also contact 227 is connected, via a shunt 331A to conductor 331, being thus electrically the same as contact 231.

In other embodiments of a connector assembly, the four wires could be for data, or used as mixed-signal data and power conductors. Adjacent to the identifying numbers of electrical contacts in both FIGS. 13 and 17 are call outs that identify the polarity or other functions available at each wired contact pad or contact clip. These are here to assist in following the various electrical paths, and in understanding the functions of the elements of the connector assembly of the invention.

In FIG. 13, contact pad 229 is identified as "229 (+)," and contact pad 231 is labeled "231 (−)." Note that, while contacts pads 231 (−) and 237(−) are aligned along shaft 243 as an opposing pair, the two paired contact pads 229(+) and 235(+) are not opposite each other along the length of shaft 243. Contact pads 227(−) and 241(−) are spatially opposing, but pad 227(−) is jumpered to pad 231 (−) via a shunt 331A to internal conductor 331(−). These relationships between contacts will become clearer when the circuits in FIGS. 18A and 18B are discussed.

FIG. 17 shows a male plug 217A (as described above in reference to FIG. 13) partially inserted into its mating female receptacle 257. When male plug 217A is fully inserted, male contact pad 235(+) will be aligned with (but not yet electrically conductive to) female spring contacts 297A and B. Male contact pad 237(−) will be aligned with female contacts 295A and B. Male contact pad 239(+) will be with female contacts 283A and B. Lastly, male contact pad 241(−) will be aligned with opposing female contacts 275A and B. The four opposing male contacts 233(+), 231(−), 229(+), and 227(−) (not visible in this view) are also aligned with the same female spring contacts.

A First Rotated Position

Once inserted, male plug 217A (FIG. 17) is rotated clockwise 90-degrees (as viewed from the cord end), to its first position (not shown). Contact pad 235 becomes electrically conductive with female clip 297A, then a power signal flows along internal conductor 265A, at the terminus of which is a battery terminal (+) (not shown). Opposing male pad 233 on shaft 243 (reference FIG. 13) is now in electrical contact with female contact 297B. Contact pad 233 is not electrically active, as can be seen in FIG. 13, as there is no internal conductor to that contact pad. Pads 239, and 241 are also not electrically conductive.

To continue in this first position of rotation, male pad 237 (FIG. 13) becomes electrically conductive with female clip 295A, and power can flow along internal conductor 263A to a battery (−) (not shown). Opposing male pad 231 on shaft 243 is now in electrical contact with female contact 295B, and then along internal conductor 263B, to a host device (−) (not shown).

Further, male pad 239 comes in contact with female contact 283A. But, because pad 239 is not electrically active in male plug 217A (FIG. 13), no power can flow along female internal conductor 261A. Opposing male pad 229 on shaft 243 is now in electrical contact with female spring clip 283B. Clip 283B is conductive along internal conductor 261B, which goes to a host device (+) (not shown).

Male pad 241 becomes electrically conductive with female clip 275A, but no power flows because pad 241 is not electrically connected within male shaft 243 (FIG. 13). Opposing male pad 227 is now electrically in contact with female spring clip 275B, so that a power signal can flow along internal conductor 259B, to a host device (−) (not shown). It has been noted that male pad 227 is jumpered internally to pad 231, within male shaft 243 (FIG. 13).

FIG. 18A shows, in a generic diagrammatic view, the above-described conductive paths created when a male plug 217A (FIG. 13) is in its first rotated position in a female receptacle 257 (FIG. 17). Three generic devices are shown in FIG. 18A: a host device 321, the host device's associated battery 299, and an integrated multi-function external device 308. External device 308 has available a power supply 311, to service host device 321. To service battery 299, external device 308 also is has a battery-monitoring device 310. Battery charging device 309 is not employed in the circuit shown in FIG. 18A. As will be seen, the various capabilities of the multi-function device 308 are enabled by a connector assembly 340 as shown in FIG. 18A.

Tracing the Electrical Paths

The circuits created by a male plug 217A (FIG. 17) in its first rotated position are best understood by tracing the electrical paths. Starting at power supply 311 in FIG. 18A, which has a first conductor 327 in male plug 307. This conductor allows a power signal to flow to male pad 235, which is in electrical contact with female contact 297B. Power then flows along conductor 265B to conductor 261B, then to a host device 321. Note that male plug 307's pads 239 and 241 are inactive.

To continue in FIG. 18A, from host device 321, the circuit continues along path 263B, to female clip 295B, then to male pad 237, then along conductor 329 to power supply 311. This circuit between power supply 311 and host device 321 is independent of the battery circuit shown, so the host device is now powered, without associated battery 299 being charged.

On the battery side of the connector circuit (FIG. 18A) an electrical path is created when a male plug 217A (FIG. 17) is in the first rotational position described above. This path is for monitoring battery 299, at external device 310. From external battery monitor 310, a conductor 333 within male plug 307 provides a path to male pad 229, which is electrically in contact with female clip 283A, then along conductor 261A to battery 299. From the battery along conductor 263A to female clip 295A, which is in contact with male pad 231, and finally along conductor 331 back to battery monitor 310.

Thus, with male plug 217A (FIG. 17) in its first position (FIG. 18A), a host device 321 is powered from external power supply 311, while a battery 299 is independently being monitored from a battery monitor 310. By providing these separate functions through a single connector assembly, external devices are optimized by performing two independent functions simultaneously.

A Second Rotated Position

FIG. 18B shows in a generic diagrammatic view the electrical conductive paths created when a male plug 217A (FIG. 13) is in its second rotated position in a female receptacle 257 (FIG. 17). Three generic devices are shown in FIG. 18B: a host device 321, the host device's associated battery 299, and an integrated multi-function external device 308. External device 308 has available a power supply 311, to service host device 321. To service battery 299, external device 308 also is has a battery-charging device 309. Battery monitoring device 310 is not employed in the circuit shown in FIG. 18B. As will be seen, the various capabilities of the multi-function device 308 are enabled by a connector assembly 342, as shown in FIG. 18B.

The circuits created by a male plug 217A in its second rotated position are best understood by tracing the electrical paths, starting at a power supply 311 in FIG. 18B, which has a first conductor 333 in male plug 307. Conductor 333 allows a power signal to flow to a male pad 229, which is in electrical contact with a female contact 283B. Power then flows along conductor 261B to host device 321. Note that a secondary circuit branches along conductor 265B to female clip 297B, then to male pad 233 but, in this connector configuration, male pad 233 is not electrically active, as indicated in FIG. 13.

To continue, from host device 321 (FIG. 18B), the circuit continues along path 263B, to female clip 295B, then to male pad 231, then along conductor 331 to power supply 311, thus completing a circuit between a power supply 311 and a host device.

An alternative electrical path from host device back to power supply 311 (FIG. 18B) is along conductor 263B, then along conductor 259B, to female contact 275B, where attaching to male pad 227 allows power to flow across shunt 331A, to power line 331, then back to power supply 311. Diode 307 in power line 331 is avoided by using this alternative electrical path, so that the voltage drop from diode 307 is not a consideration.

These circuits from power supply 311 to host device 321 (FIG. 18B) are independent of the electrical circuit for battery 299, so a host device is now powered without associated battery 299 being charged.

Battery Charging Circuit

On the battery side of the circuits created by placing a male plug 217A (FIG. 17) in its second rotation position, FIG. 18B provides an electrical path for charging a battery 299. From external battery charger 309 conductor 329 within male plug 307 provides a path to male pad 237, which is electrically in contact with female clip 295A, then a charging signal travels along conductor 263A to battery 299. From battery 299, the charge signal flows along conductor 261A, then branching along the conductor 265A to female contact 297A, which is in electrical contact with male pad 235, and finally along conductor 327 to battery charger 309.

Thus, with male connector 217A in its second position of rotation (FIG. 18B), a battery 299 is charged from an external battery charger 309, while a host device 321 is independently and simultaneously powered from external power supply 311.

Defining External Devices

FIGS. 18A and B diagrammatically represent a typical implementation of a two-position rotating "key" connector 307. Such a connector assembly as that illustrated in FIG. 17 is shown between battery 299 and host device 321. These circuits have been discussed in various places throughout this document, especially in reference to male plug 217A (FIGS. 13 and 14), and mating female receptacle 257 (FIGS. 16 and 17). Male plug 307 is shown in FIG. 18A in one position, then shown again in FIG. 18B as rotated 180-degrees. The eight contact pads 227, 229, 231, 233, 235, 237, 239 and 241 are number identified to match the labels in FIG. 13. So, too, are mating contact clips 275B, 283B, 295B, 297B, 297A, 295A, 283A and 275A numbered to match those shown in FIG. 16 for female receptacle 257. The circled arrows 301, 303, 305, and 308 indicate the direction of flow of a power signal to or from battery 299. Diodes are placed in these power lines to ensure that power only flows in the indicated direction.

Focusing on external device assembly 308 in FIGS. 18A and B, these are attachable to connector circuits 340 or 342. The three indicated elements are a "battery monitor," a "power supply," and/or a "battery charger."

Battery Monitor

Battery monitor 310 (FIGS. 18A and B) is characterized as a device (or circuit within another device) that performs a data acquisition function, namely acquiring voltage readings from a battery 299. An A/D converter and a simple processor are the key elements in this device. The processor has a data I/O which interfaces with a power supply 311. A battery monitor 310 uses this data I/O to communicate battery 299's voltage (read both without a load, then with resistance in the line) to configurable-voltage power supply 311.

Battery monitor 310 (FIG. 18A) uses both a load and no-load sampling of battery 299's output voltage to ascertain whether battery 299 is in a relative state of full-charge, or almost completely discharged. Should battery 299 be fully charged, its no-load output voltage can be substantially higher than its manufactured design output voltage. For example, a battery pack manufactured as "12 VDC" may read nearly 14-volts output under no-load sampling, even though it has less than 40% remaining capacity, but that output voltage may drop to less than 10.5-volts when tested under load. A fully charged battery would not likely read less than 12-volts output when sampled under the same load. Since battery output may cover a range of voltages, depending on the load vs. no-load sampling results, software in battery monitor 310 uses a look-up table and an algorithm to determine what the manufacturer's design voltage is for battery 299.

Software attempts to accurately define an optimized operating input voltage for host device 321 in FIGS. 18A and B. Depending on its battery input-voltage design parameters, host device 321 can have a Vmin operating voltage well below the 12-volt rating of its battery 299. If the designer of host device 321 was striving for maximum battery-operating time, the Vmin battery voltage may be set low, to use every last coulomb of battery 299's capacity. With a Ni-Cad battery, this Vmin voltage cut off can be set as low as approximately 8 VDC. The spread between a battery 299's no-load and load voltage test results is a reasonable indicator of the remaining fuel reserves in the battery. If both Vmin and Vmax are depressed, then it's highly probable that the battery is near exhaustion. Another indicator is how long it takes for a battery 299 to recover from a load test.

All commonly used battery chemistries exhibit an accelerated voltage drop-off curve near the lower limits of their capacity, although the slope or rate of voltage drop may vary. So, reading under-load samples over time, or for a sustained amount of continuous time, are also somewhat valid probative procedures for evaluating the remaining capacity in the battery pack.

Of course, if battery 299 (FIGS. 18A and B) is a smart battery, and if there are data lines available, battery monitor 310 can simply poll the battery's data registers for information about its fuel gauge reading. However, even smart battery technology, with its sophisticated fuel gauges, is not very accurate when it comes to determining the amount of energy reserves remaining in a battery. Error rates are sometimes 10–20%. Knowing this, host device manufacturers tend to allow an adequate margin of capacity in a battery at the prescribed Vmin battery shut-down voltage.

Know Where the Key Is

The relevance of knowing the approximate capacity reserves of battery 299 in circuit 340 (FIG. 18A) is related to connector 307. If battery 299 is about to reach a state of near depletion, then battery monitor 310 is limited in the tests it can perform for data acquisition. Continued voltage sampling under load will produce variable results. Since one of the functions battery monitor 310 serves is to identify the position of rotating "key" connector plug 307, it is important that all externally attached devices, e.g., power supply 311, be continuously aware of at which of the two positions "key" connector plug 307 is set.

One method of verifying that male plug 307 is positioned so that circuit configuration 340 in FIG. 18A is selected, as opposed to circuit 342 in FIG. 18B, is to continuously monitor the presence of battery 299 on conductors 331 and 333 connected to battery monitor 310. Although highly unlikely, a battery that is so discharged that it may no longer deliver even a no-load output voltage for a reasonable period of time may jeopardize the reliability of detecting connector 307's position. Should there be a lack of readable battery voltage at battery monitor 310, and key connector plug 307 is rotated by the end user to the position shown in FIG. 18B, power supply 311 could be delivering an inappropriate power signal to battery 299, instead of to host device 321 (FIG. 18A). Thus, knowing how reliably, and for what amount of time, battery 299 will deliver a readable output voltage is important to the operation of connector circuit 340 and 342.

The operation of battery monitor 310 (FIG. 18A) is such that it shuts down power supply 311 if an abnormal voltage reading occurs. In the situation just described, where a battery 299 was incapable of sustaining a minimum voltage under load, battery monitor 310 delivers a shut-down command to power supply 311.

Fortunately, battery monitor 310 in FIGS. 18A and B has a redundant system for verifying the position of key connector 307. Power supply 311 is comprised of an output current sensor circuit, which is accessible to battery monitor 310. Any change in the load on power supply 311's output is detected as an indicator that male plug 307 has been either rotated or disconnected. The sensitivity of this current sensor is such that even a momentary absence of resistive load is considered sufficient to shut down power supply 311's output.

Power supply 311 (FIGS. 18A and B) operates on information provided by battery monitor 310. Specifically, the proper input voltage of host device 321 is sent to power supply 311 as a Vref value. Power supply 311 is capable of matching Vref as a function of its voltage-sense feedback loop. Being a controllable switching power supply, it can output whatever voltage battery monitor 310 commands. Specific information about the operation and characteristics of a power supply 311 is available in United States Provisional Patent Application No. 60/065,773.

Battery Charger

A battery charger 309 (FIG. 18B) may also be available in an attached external device construct 308. In such an assembly, the role of battery monitor 310 is similar to that already described in conjunction with power supply 311. Battery monitor 310 gathers data about battery 299, and the position of male plug 307 (both are inter-related, as indicated previously). Once the presence of a battery 299, and the appropriate connectivity to it via male plug 307, are verified, battery monitor 310 determines the appropriate charge type. Charge type is based on battery chemistry, and number of cells at a known specific voltage. Other tests are done to verify not only the type of battery, but the condition of the battery pack to accept a charge. This procedure may include a sophisticated impedance test, and perhaps even some cell balancing for Li-Ion batteries. These tests are essential because Ni-Cad charge characteristics, voltages and charge rates vary considerably from the method used to charge Li-Ion cells. Information about impedance testing is available from Cadex Electronics Inc. (Burnaby, BC, Canada).

It is possible to have both a battery charger 309 (FIGS. 18A and B) and a power supply 311 integrated in a multi-purpose external device assembly 308. In such a modality, battery 299 can be charged simultaneously with power delivery to host device 321. This embodiment reflects the same functions normally available to a battery 299 and its host device 321 when a male plug 307 is removed. In other words, the primary circuit between host device 321 and battery 299, as they were configured when manufactured, is re-established.

An Application of a Rotating Connector

With data acquisition capabilities provided by a battery monitor device 310 (FIG. 18A), a battery 299's power parameters can be acquired by an external battery monitor. A connector assembly 340, of which a male plug is rotated to its first position, makes it possible to confirm that a battery pack 299 is present and available. Furthermore, that battery is known to not be receiving a charge, because the battery terminals are connected to an external data acquisition device 310, and not to a charger 309. As long as battery monitor device 310 is occupying battery 299, there can be no battery charging activity. By constantly polling battery 299, battery monitor device 310 can keep track of battery 299's non-charging state. Connector plug 217A has been positioned to create an electromechanical redirection of battery 299's circuit. There is no path for host device 321 to access its battery 299, while male connector 307 is in its first position. (See discussions elsewhere about using diodes in circuits like those in FIGS. 18A and 18B, to allow a battery to deliver power to its associated host device, while a connector assembly of the invention is in use. A diode approach can be incorporated into the two circuits shown here, and anyone skilled in the art can provide such additional diode circuitry).

Having confirmed that battery pack 299 in FIG. 18A is in a non-chargeable mode, external power supply 311 can safely apply power to host device 321 at contact pads 237 and 235 on male plug 307. These contact pads are, in this first "key" position, mated to contact clips 295B and 297B in female receptacle 257 (FIG. 17). Battery monitor 310 may communicate its acquired battery power parameters to power supply 311, so that the power supply can configure its output signal based on that of battery 299. Since battery 299 is associated with and matched to host device 321, a correct input voltage for host device 321 is assured by basing the output of external power supply 311 on the acquired power parameters of battery 299. Battery monitor device 310 may have a processor, with the ability to configure the power output of a power supply 311.

Note that host device 321 in FIGS. 18A and B receives its power through circuits which—when male plug 217A is retracted—directly connect battery 299 to its host device 321. Female receptacle 257, in FIGS. 16 and 17, has self-closing contacts. When no male plug 217A is present, electrical signals pass through female receptacle 257, as if it wasn't in the circuit between a battery 299 and its host device 321.

The power path from battery 299 is along conductor 261A (FIG. 18B), through female contacts 283A and 283B (which, now that male plug 307 has been withdrawn, are now electrically connected together). The power signal then flows to conductor 261B, and then to host device 321. The second power path between battery 299 and host device 321 is along conductor 263A, to female contact 295A, which is now electrically connected to opposing spring-loaded contact 295B, then through conductor 263B, and to host device 321. Thus, host device 321 is powered independent of its battery 299 when a male plug 307 is inserted, then host device 321 is powered by its battery 299 when male plug 307 is removed.

Safety Considerations

Should the operator of a host device 321 rotate key 307 a full 180-degree from its present second position (FIG. 18B) back to its first position, there will be an immediate change of state in the battery voltage monitoring circuit (FIG. 18A). The electrical circuits in FIG. 18B have monitoring device 310 connected to host device 321, instead of to battery 299.

Monitoring device 310 monitors the output of power supply 311 in the circuit of FIG. 18B. As soon as male plug 307 is rotated away from its second position, monitoring device 310 sees an open circuit on lines 327 and 329. In this state, battery monitoring device 310 would read 0-volts on the open circuit. Monitoring device 310 immediately issues a shut-down command to power supply 311. This loop created between a battery, and a battery monitoring device that configures the output voltage of a power supply, provides inherent safety, since the power supply will always shut down when a male plug 307 is in any other position than that shown in FIG. 18A.

In FIG. 18A, battery charging cannot occur, because diodes control the direction of power flow as indicated by arrows 303, 305 and 308. In FIG. 18B, contact pads 235 and 237 on male plug 307, along with diode 301, ensure that charging can be performed. Diode 307 (FIG. 18A) is in powerline 331 and is a part of male plug 307, so it is removed from the battery-to-external-device circuit when male plug 307 is rotated from the position shown in FIG. 18A, to that in FIG. 18B.

Comparing the two circuits depicted in FIGS. 18A to 18B, external battery charger 309 does deliver power to a circuit shared by a battery 299 and its host device 321. Should battery charger 309 be active when male plug 307 is in its position shown in FIG. 18A, diodes 308, 303 and 305 prevent power from flowing to internal conductors 263A and 261A.

As FIGS. 18A and B illustrate, in order to create a new circuit, a connector assembly of the invention in which a male plug 217A and a mating female receptacle (FIG. 17), requires at least one switchable electrical line, male contact pad, or self-closing female contact to change its electrical connection. There may be other than power signals addressed by a rotating "key"-style connector assembly, for example, the Clock, or Data signals available to a "smart" battery. As has been seen, there need not be any such data signals present. If data signals are present, one or more of them may be used, without limitation, for the proper functioning and operation of the connector of the present invention.

Interrupted Data Lines and "Virtual" Data Lines

To disable battery charging, for example, any of the connectors shown (but not limited to those shown or equivalents) can effectively interrupt and reroute a data line. In a smart battery circuit, for example, rerouting a Clock, or Data line will disrupt the link between a host device's charging circuit, battery selector, or keyboard controller—the disruption of any one of which is sufficient to prevent battery charging. A battery cannot effectively communicate its request to be charged if Clock or Data lines are not available. The data lines communicate in conjunction with the "−" negative power ground in the SMBus Smart Battery Bus topology, so even intervening a connector assembly of the invention on a powerline will have an impact on battery data communications.

But data transfer is not always limited to the use of cables and connectors. Wireless data is available in the form of radio frequency (RF) or infrared (Ir). This is relevant, in this example, to the elimination of conductors between an external third device, such as a battery monitor (or a battery monitor coupled to an external power supply). A smart battery data line can be physically interrupted and rerouted using a "key" connector like any shown here, for example.

Most smart battery data communications require three or four conductors. Smart battery/host connectors typically have five contacts. To disrupt all five lines with a connector such as that shown in block diagrams 340 and 342 in FIGS. 18A and B would require 10 conductors, with five conductors from a battery pack to an external device, and an additional five lines from another external device to a host device. While adding two more contact pads to a male plug 307 in FIG. 18A isn't impractical, it does create a substantially longer male "key," as well as a more complex female receptacle. Further, the cumbersome cables that might result from routing 10 mixed-signal lines to external devices are not desirable.

In some battery and host data communications implementations, data continuity to a host device may have to be maintained, so that the host system does not "see" a battery (or equivalent) present. The host device may refuse to turn ON, or it may lose track of its battery's "fuel gauge" readings. A wireless link can be established so that, even though the physical data circuit between a battery and its associated host device has been disrupted temporarily, a substitute data telemetry link can be used.

Alternative Electrical Paths

Alternative data paths can be created. One implementation of an alternative bidirectional data path has a multicontact key connector in a small external module (a PC Card or dongle, for example), into which data lines are routed. The power lines pass through the module. The purpose of this module is to acquire data from a smart battery over standard conductors, but to not have to reroute those conductors to either a host device, or an external device, such as a power supply. The module performs data acquisition functions (especially easy if a National Instrument (Austin, Tex.) DAQ card, or equivalent, is used). Another alternative is to use a dongle configured like a Micro Computer Control (Hopewell, N.J.) SMBus monitor, that converts SMBus smart battery data to $I^2C$, or RS-232.

A number of infrared wireless dongles use a standard RS-232 interface for serial port communications, so those skilled in the art of wireless communications should have no difficulty in creating such a wireless data link.

Computer-readable data is then output to a radio transmitter, or to an infrared port. An external device, such as a charger or power supply, shares data with the wireless module. Software filters the data stream coming from a host device and/or a smart battery, looking for data relevant to battery charging. It may see requests from the smart battery, for example, to be charged. An external module would, in that situation, send a wireless signal back to a module, with a message for the smart battery advising it that the charger is not available. That "faux" information from an external device is then routed internally to a rotating connector 307 in FIGS. 18A and B, and fed into a battery pack's data circuit.

Malfunctions, such as spurious data on the smart battery bus that is misunderstood as a request to battery charge, are handled by having an external power supply (which is attached at the battery connectors in the host device, and not at the host device's power input jack), send "faux" data to a module previously described, which is routed to a host device through a connector such as the ones illustrated here. Viewed in one way, an external power supply's data intervention into a battery-to-host interface is one of emulating a battery when communicating to a host, and emulating a host when communicating to a battery. The task is, in this example, to prevent battery charging, so one approach is to send appropriate misinformation to a host system, that emulates a malfunctioning battery. Data sent to a battery emulates host messages which indicate that charging functions are not available.

In context of SMBus-based smart batteries, the host receives information from an external power source that the temperature level in a battery is exceeding a pre-set alarm level, for example. That will disable a charger. A battery can receive alarm or alert states, which indicate a "no-charge-available" condition in the host system.

Another hypothetical scenario that could potentially cause an inappropriate battery charger activation in a host device might be that a male plug such as 307 shown in FIGS. 18A and B could be inserted during an ongoing charging activity between a host 321 and its battery 299. This is another highly remote situation, since the insertion of a male plug 307 will disrupt all of the power and data lines. FIG. 17 shows a male plug 217A in the process of being inserted. The insulated plug shaft 243 disrupts each female spring clip as the male plug is inserted. At the point when male plug 217A is fully inserted, and before the male plug is rotated, all lines are disrupted, so a host device would see this event as the same as if the battery had been removed (all power and data conductors open). It would take an inordinate malfunction for a host device's smart battery charging circuit to keep functioning after any one of the four power/data lines was disrupted, and for a charger to still be outputting a power signal after all four lines had been disrupted would be a significant improbability. Only when male plug 217A is rotated are any circuits created, and none of those circuits depicted in FIGS. 18A or B directly connects a battery 299 to its host device 321.

The issue of a host system turning on a charging circuit while an external device is using those same battery lines to input power to a host system is moot. The probability of this happening is very remote, for two reasons. First, the host device is not drawing power from its normal power input jack, but instead it is drawing power from what it perceives is a battery. There is no acknowledged power source connected to the host device that indicates available power to charge a battery, i.e., there is no AC/DC adapter or wall adapter connected to the power input jack of the host device. This makes any possibility of a host device being able to charge a battery essentially zero. Second, there is no request for a charge activity from a battery, so a host's charging circuit has no valid reason to turn on the charging circuit.

Thus, in situations where the number of data lines is excessive enough to make wired communications to and from an external device impractical, wireless data comm links serve as an alternative to wired data conductors. The role of a connector assembly is the same . . . to create new data (and perhaps power) paths that are available to an external device.

Default Mode

As previously discussed, to restore a host device 321 in FIG. 18A or 18B and its battery 299 to its original configuration (i.e., so that a battery can directly power and/or communicate with a host device), it is only necessary to remove "key" connector 307. Opposing female contacts 275A and B in female receptacle 257 (FIG. 17) automatically close when male plug 217A is retracted. A direct circuit between a battery and its host device is then re-established. In the embodiments discussed wherein only powerlines are rerouted through a multi-contact male plug 217A, power connections are restored directly between a battery and its host device. In FIG. 17, female contact clips 295A and 295B (−), and contact clips 283A and 283B (+) in female receptacle 257 are reconnected as the "default" mode.

In FIGS. 18A and B, an N-signal power switch 306 is shown that reduces the number of conductors required to external device construct 308. To operate switch 306, voltage from battery 299 enters the switch along power lines 331 and 333. Power applied to switch 306 causes it to close internal switch contacts that control power lines 327 and 329. Male plug 307 is rotated into the position shown in circuit 340, so that power can flow from battery 299 to switch 306 along conductors 331 and 333. When a switch 306 is present in circuits 340 or 342, the continuation of power lines 331 and 333 between switch 306 and external device construct 308 does not exist. Switch 306, therefore, is installed in the base of a key connector. Thus, only two wires run between male plug 307 and any external devices, when a switch 306 is present in the circuit.

Implementing a switch 306 in the circuit provides an alternate safety mechanism that ensures that rotating male plug 307 is in the position shown in FIG. 18A. Voltage from battery 299 to switch 306 indicates that male plug 307 is in this position. If male plug 307 were rotated to the position shown in FIG. 18B, there would be no voltage on power lines 331 and 333 from battery 299, so the switch's control of power lines 327 and 329 would not be available. This essentially disables the link between power supply 311 and host device 321. In this modality, when male plug 307 is in the position indicated in FIG. 18B, external power module 308 cannot power host device 321, nor deliver a power signal to battery 299. Therefore male plug 307's function when in the position indicated in FIG. 18B is to entirely turn off any power from both external devices 308, as well as internal power between battery 299 and host device 321.

An example of an application for such a switch, which eliminates any possibility of battery charging, would be in an aviation situation, where the use of a connector assembly 340/342 in FIGS. 18A and B is appropriate. Connector assembly, as shown in configuration 342, creates electrical paths in FIG. 18B that allows the use of an external charger 309, to charge a battery 299. By including a switch 306, this second position of a male plug 307 is defeated, so that no charging can occur. Airlines would distribute such an N-signal switch-enabled male plug 307, preferably with an attached power cord specific to airline use. Passengers having a non-switch-enabled male plug 307 (which would charge batteries) would not be able to use their connector embodiment on a plane, as only the aircraft version would attach to airplane power systems.

N-Signal Switches in "Blade" Connectors

Another application for an N-signal power switch is for a variant of a male plug 330 (FIGS. 19–21B). As drawn in FIG. 20, male plug 330 operates in a two-position mode, being first inserted into female receptacle 360 with its blade side 356 upward. Then male plug 330 is removed, rotated 180-degrees to a second position so that its blade side 358 faces upward, and then reinserted. By the use of two N-Signal switches described herein, and a variant of a male plug 330, this two-step process changes to only a single plug insertion.

A male plug 433 (FIGS. 21A and B) incorporates two N-signal switches, and is also modified to have a second conductive surface 437 that replaces insulator 443, so that there are now three conductors on plug 433's "blade" assembly. While not shown, this second conductive surface is labeled 437A for purposes of this non-limiting example, and it includes an associated insulator equivalent to 438.

A first N-signal switch has conductors 437 and 435 to into female receptacle 414, and conductors 441 and 439 on its opposite side (to external devices). Conductors 435 and 441 are electrically the same, e.g., as a through-line, for example. Conductor 439 is switchable by either the first N-signal switch, or the second N-signal switch, to create an electrical path to either conductive surface 437, or 437A. A second switch contact is available which addresses the newly-created opposing conductive surface 437A.

When this alternative embodiment of a connector 433 is inserted into female receptacle 414, power from a battery source 413 flows to female contact 417, then to newly-created conductive surface 437A. A second power path from the opposite battery terminal flows along conductor 411, then along branch 425 to contact 421, and is transferred to male plug center blade conductor 435, which is a shared conductor to the first N-signal switch. The power signal from battery 413 now activates the first N-signal switch so that it creates an electrical path between conductor 439 and conductive surface 437.

Thus, connector 433 (FIGS. 21A and B) in its first position described above, causes a first N-signal switch to direct a power signal from an external device to the appropriate conductors. The electrical path from an external device is now along a non-switch path from conductor 441 to center blade conductor 435, to female conductive element 421, then continuing along conductor 425 to conductor 407 to finally contact pad 405 on battery housing 450. The switched path created by a first N-signal switch being activated from battery source 413 allows a power signal from an external device to flow from male plug 433's conductor 439 to the N-signal switch, where the path is switched to plug's conductive surface 437. Conductive surface 437 is in contact with female spring contact 419, so that a power signal continues along conductor 427, to contact pad 429 on battery housing 450.

A Second Switch

A second N-signal switch is wired to be the mirror image circuit of the first N-signal switch. The second switch gets its power from male plug 433's conductive surface 437 (FIGS. 21A and B), and shared center conductor 435. When conductive surface 437 is in contact with female spring contact 417 in receptacle 414, power from battery 413 actuates the second switch in male plug 433, causing it to create a path from plug conductor 439 to opposing conductive surface 437A, so that power from an external device always flows to the opposite conductive surface on the male "blade" to the one that is wired with an N-signal switch, i.e., the switch that is electrically in the battery 413's power path when male plug 433 is inserted into receptacle 414.

By the use of a first and second N-signal switch, each wired to actuate by a battery-side power signal, and to then direct the power path from an external device to the male plug's conductive surface (437 or 437A) (FIGS. 21A and B) opposite the conductive surface in use by the N-signal switch and battery 413. This approach eliminates the need to remove and rotate a male plug 433.

Without a battery source 413 to actuate either N-signal switch, no power will flow into the tip of a male plug 433 (FIGS. 21A and B). This is an added safety feature, should a connector assembly design require that some conductive element of male plug 433's blade be exposed where it can be shorted, or touched by a user.

This circuit also requires the presence of a battery cell power source 413 in a battery pack 450, in order for power to flow on male conductive surfaces 437, or 437A. If battery cells 413 were not present in a battery pack 450, male connector 433 would not allow any power to flow into female receptacle 414. This is a redundant safety feature.

A diode-protected path between each N-signal switch and male plug 433's conductor 439 is required, so that an external device can acquire battery cells 413's power parameters, for purposes of configuring the output of an external power supply. A bleed resistor across the diode will allow a non-diode-depressed voltage to be available to the external power supply. This eliminates the need to calculate out the error of the diode's voltage drop. This bleed resistor approach can be used in some other diode applications discussed throughout this document.

A Second Example
A Battery Pack-Specific Connector

A host device and its associated battery pack present a well-suited environment for a connector assembly that can, by the insertion or removal of its male element, create or reconfigure circuits.

Battery packs, with either primary or rechargeable cells, are typically removable. So, if a connector can be fitted into the confines of an existing battery pack, and the newly-created circuits achieved by doing so can be defined in the battery pack itself, then the use of such devices is dramatically enhanced. Consumers can simply acquire such an upgraded battery pack, and install it in place of an existing battery pack. Manufacturers of host devices are able to offer an accessory product that enhances the usefulness and functionality of their host devices, without having to modify existing host devices already in consumers' hands.

Because batteries do wear out, consumers will—sooner or later—require a replacement battery pack. For example, today's Lithium-Ion battery cells claim about 500 charge/discharge cycles. In reality, the average battery user can expect only about 300. That usually equates to the battery's storage capacity starting to show signs of decreased run time in approximately 1–1.5 years. The user's awareness of decreased capacity may happen even sooner, especially with cellular phone battery packs. Reduced talk time or wait time is often noticed quickly by a cellular phone user. But, whatever the application, battery-powered device users inevitably are required to replace a worn-out battery.

The "Blade" Connector

Figure 19:
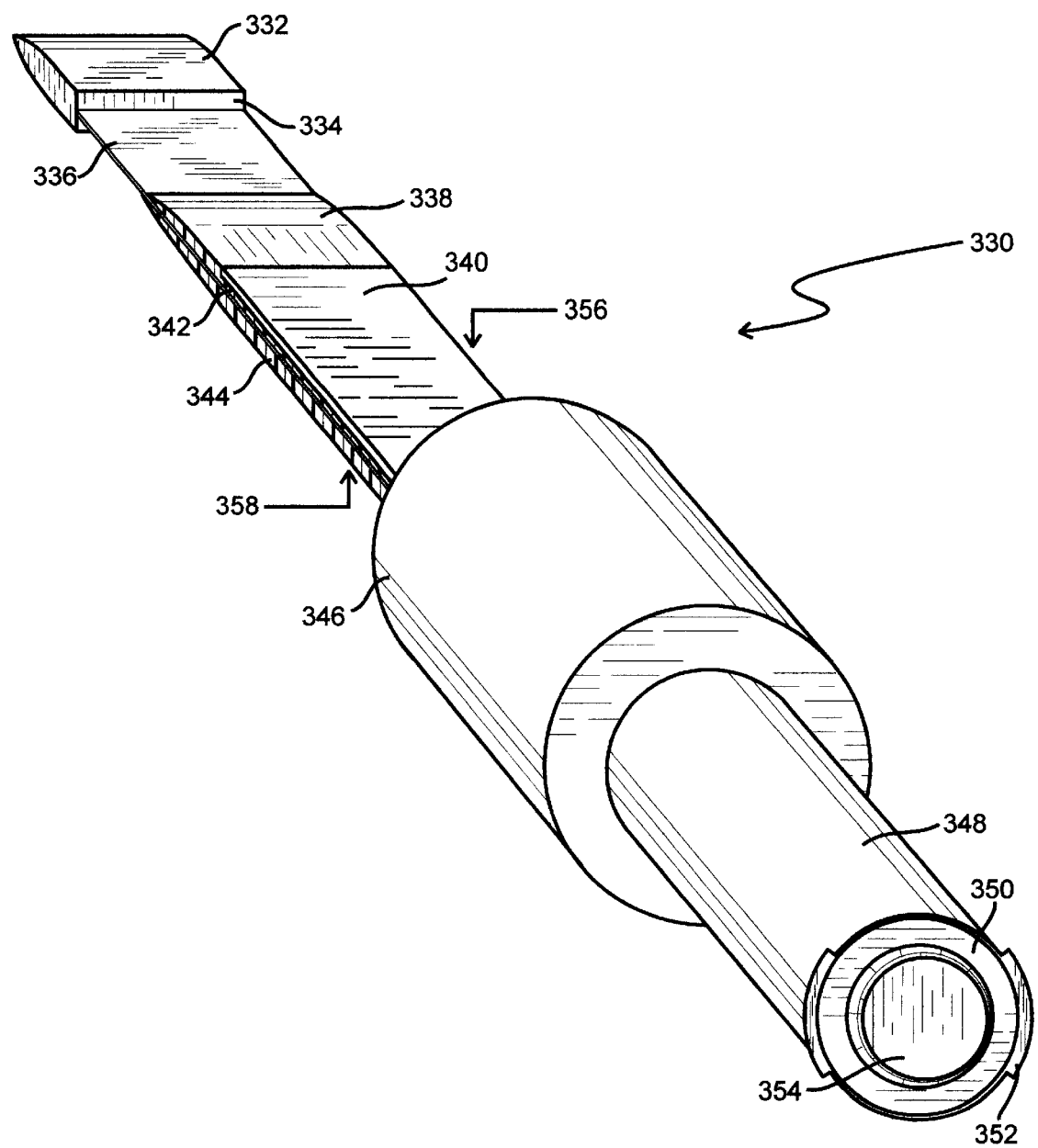
FIG. 19 depicts a detailed view of a two-conductor male plug which has two modes of operation that create a battery bypass circuit within a battery pack.

The connector assembly described here has characteristics and features which make it suitable to battery pack modalities. It can be built inexpensively, typically without exotic materials, in a compact size small enough to be integrated into existing battery packs. Furthermore, the connector in FIGS. 19 and 20 is simple to use, requiring (in one of its embodiments) no rotating of its male plug (see FIGS. 21A and B).

Connector assembly 381 in FIG. 20 is comprised of two elements, male plug 330 and female receptacle 360. As expressed in FIGS. 19 and 20, this connector assembly is optimized to fit the space restrictions of a typical cylindrical-cell battery pack. It's low height profile and compact overall configuration adapt well to the limited available space in the "valley" between two adjacent cells (cells not shown). The curvature 366 of insulator wedge 364 conforms to a battery cell case contour, so that wedge 364 fits between two cells (this configuration can also be seen in female receptacle 189 in FIG. 10B). By utilizing conductive strips 368A, 380 and 382A, overall height requirements are minimized (compare this to conductors 259A and others for female receptacle 257 in FIG. 16).

The insertable male plug 330 is comprised of a thin "blade," compared to the thicker shaft of key connector 217A and B in FIGS. 13–15A. Insertable male plug 330 in FIG. 19 is comprised of at least two conductors. This blade is not limited to its two insertion positions. The "Circuit Diagram" section below discusses an embodiment of a male plug 330 that does not have a second position, and that requires no rotation. Plug 330 differs from a "key" connector 217A in that it can be removed, rotated 180-degrees, then reinserted into female receptacle 360 in FIG. 20. Key connectors 217A and B are not removed, but are rotated while inserted.

Plug 330 can perform different power (or data) functions, depending on which way it is inserted. If inserted with its side 356 facing upward, as shown in FIGS. 19 and 20, plug 330 creates a conductive path to a battery cell (or cell cluster).

If removed, rotated 180-degrees, then re-inserted so that blade side 358 (FIGS. 19 and 20) is facing upward, plug 330 creates a path to power a host device (not shown) via a battery housing's external contact pads. Thus, in the two-step operation described, a first step provides a circuit only to a battery, while a second step provides a circuit only to a host device.

Electrical Paths

The internal wiring and associated elements for female receptacle 360 in FIG. 20 can be better understood by referencing the information related to FIGS. 9, and 10A–B. A slightly different wiring scheme from that shown in FIGS. 10A–B is employed in female receptacle 360 (FIG. 20). A lead from a battery cell cluster (not shown), and the conductive lead from the mating external contact pad on a battery housing (not shown) are tied together at conductive strip 382B.

Leads from the opposite polarity circuit, i.e., one from the battery cell cluster, and the other from its associated external contact pad on the battery pack housing, are separated. The lead from the battery cells is now connected to conductive strip 380, while the negative lead from the battery housing's contact pad is attached to conductive strip 368B. Thus, for example, the circuit between the positive side of a battery (cell or cluster) is connected to its associated exposed battery pack housing contact (this is the typical connector interface between a battery pack and its host device) in the usual way. This power line then has a shunt attached to conductive strip 382B (FIG. 20). Thus configured, if the battery terminal selected was positive, both the positive connector on the battery pack that interfaces with the host's mating connector, and conductive strip 382B in FIG. 20 are wired to the battery's positive terminal.

Continuing the example, a conductor from a battery's negative terminal now runs to conductive strip 380. A second conductor from a battery pack's negative housing contact (that mates with a host device's connector) is attached to conductive strip 368B in FIG. 20. Thus, the negative circuit in this non-limiting example is from the negative battery cell terminal to conductive strip 380, then to female connector contact 378. Connector contact 378 is spring-loaded, so that it makes electrical contact to opposing spring-loaded female contact 374, so that power (or data) flows along conductive strip 368B, which then is wired to the battery pack's exposed connector (negative contact). As such, a female connector 360 can, by breaking contacts 378 and 374, disrupt one of the battery leads between a battery (cell or cluster) and the external housing contact to which that battery terminal had previously been wired.

Thus configured, the two negative leads are joined electro-mechanically at contacts 378 and 374 (FIG. 20), to form a complete circuit within the battery pack. Without a plug 330 inserted, the wiring within a battery pack renders it operational as if there were no modifications to it. In the example given, battery power flows along two joined positive leads, one from the battery terminal to the connector that mates to the host device, and a second lead from the battery terminal to the center pin contact 382B of female receptacle 360. Each of the two negative leads are reconnected by the closure of contacts 378 and 374. Electrically, when contacts 378 and 374 are closed, the battery cells deliver power to the exposed contact pads on the exterior of the battery housing as if the cells were wired directly to those external contact pads. Essentially, female receptacle 360 is electrically invisible to both a host device and the battery pack, when no male plug 330 is present.

Male Plug

The relationship of conductive and non-conductive elements on the blade of plug 330 in FIG. 19 is important to a connector assembly 381's operation. Spade tip 332 is tapered to facilitate insertion of the blade into female receptacle 360 (FIG. 20). The back edge 334 of spade tip 332 catches on the back face of receptacle contact 384. This prevents male plug 330 from easily disconnecting to prevent male plug's spade tip 332 from shorting against upper beam 380, a thin insulator 388 is laminated to conductive strip 380.

A conductive center layer 336 runs the entire length of male plug 330 (FIG. 19). This center conductor is attached to spade tip 332 at the front end of male plug. 330, and terminates in conductive tip 354 at the cable end of connector 330. This center layer transfers power (or data) signals from female receptacle contact 384, through male plug 330, and into a conductive wire (not shown) that attaches at contact terminal 354.

On the blade element of male plug 330 in FIG. 19, an insulator 338 separates conductive center layer 336 from conductive layer 340 along the length of the blade. A tapered ramp at the front end of insulator 338 creates a smooth transition for female spring contact 378 in FIG. 20. The length of this ramp is to be minimal enough to keep the surface of spring contact 378 from shorting by making contact with both conductive layers 336 and 340 simultaneously. The length of this ramp at the front of insulator 338 is to be kept as short as practical, since spring contact 378 and its opposing contact 374 are electrically disconnected during the transition of this insulated ramp. Material used for ramp 338, as well as for insulator 344, should be of a type that does not cause deposition on female contacts 378 and 374. The length between element 332 and the front edge of conductor 340 is dimensionally related to the spacing between receptacle contact 384, and contacts 374 and 378. The blade is insulated at the point of insulator ramp 338 during insertion, when conductive spade tip 332 makes electrical contact with receptacle contact 386, at which point in the insertion process neither contacts 374 or 378 can be allowed to short against center layer 336. By controlling the relationship of when point 332, or the front edge of conductor 340 first makes electrical contact with a mating female contact 374, or 378, a staged insertion can be achieved.

Once contacts 374 and 378 in female receptacle 360 (FIG. 20) are electrically insulated from central layer 336 along the blade length of male plug 330, either of the two negative contacts 374 or 378 can be allowed to make electrical contact with conductive surface 340 on plug 330. Note that conductive surface 340 is also electrically isolated from conductive center layer 336 with a thin insulator 342. This may be accomplished by continuing ramp insulator 338 as a thin layer, or with an insulator layer separate from the material used for the ramp section of insulator 338. The total thickness of the blade in male plug 330 should be kept as minimal as practical. Excessive thickness can result in surface material wear at female contacts 378 and 374. Also, the return spring action of female contacts 378 and 374 may not result in proper closure, if a thick male blade overspreads the spring beams.

Opposing the conductive surface 340 of plug 330 in FIG. 19 is a non-conductive layer 344. This insulator layer's function is to prevent a power (or data) signal delivered to center layer 336 when mated with receptacle contact 384/386 in FIG. 20 from shorting on conductive blade element 336 of plug 330 when in contact with either receptacle contact 374 or 378 (depending on which rotational orientation 356 or 358 plug 330 is in at the time of insertion).

Insulator layer 344 acts electrically to distinguish one or the other branch of a Y-connector created by either of two receptacle contacts 374 and 378 (FIG. 20). In use, when insulator surface 344 of plug 330 is in contact with receptacle contact 374, the opposing receptacle contact 378 is conductive by being in contact with conductive surface 340 of plug 330. When thus configured, a conductor from a battery cell cluster (not shown) is wired to conductive strip 380 in FIG. 20. Since plug 330 is inserted in orientation 356 (as drawn), a battery cells' power signal travels along conductive strip 380 of female receptacle 360, to spring contact 378. The power signal then transfers to conductive surface 340 on the blade of plug 330, and then to outer conductive surface 348 of connector 330's attachment shaft.

A second and opposite-polarity power signal from a battery's cell cluster travels along conductive strip 382A (FIG. 20), to its contact area 384/386. This power signal transfers to male plug 330's conductive center layer 336, at spade tip 332, then along the length of plug 330 as conductive layer 336, terminating at conductive tip 354.

In this configuration, with plug 330 inserted into female receptacle 360 in plug orientation 356 (FIG. 20), battery cells are accessible by an external device (not shown) such as a battery monitor, for example. In this configuration, a battery's power parameters can be acquired by an external device. A discussion of the function of the battery monitor and other external devices can be found in the text relating to FIGS. 18A and B.

Post-Rotation Paths

Plug 330, when retracted from female receptacle 360 in FIG. 20, then rotated axially 180-degrees, orients plug's conductive surface 340 in electrical alignment with receptacle contact 374 in FIG. 20. Insulator surface 344 of plug 330 is now reoriented to interface with receptacle contact 378. Receptacle contact 374 is wired to the negative contact pad of the battery's housing (not shown).

The electrical path created in this configuration has its power source external to a male connector 330 (not shown). Power delivered from an external device to male plug 330's contact 354 (FIG. 19) flows along conductive layer 336, then to conductive spade tip 332. When male plug 330 is inserted into female receptacle 360, center contact 384/386 is now in contact electrically with spade tip 332, so that power flows along conductive strip 382A to its terminus at 382B. A conductor (wire or flat strip) within a battery pack takes the power from terminus 382A to a terminal of a battery cell (or cell cluster) within the battery pack. The same conductor is also electrically attached to a contact that is associated to the host device.

The other part of the electrical path from an external power source is seen in FIG. 20 starting at conductive outer barrel 348 of male plug 330, which is connected to conductive surface 340. When male plug 330 is inserted into female receptacle 360 with this orientation (side 356 upward), power flows into spring contact 378, then along conductive strip 380, at the termination of which is attached a suitable conductor to continue the power path to the opposite terminal of the battery.

Thus, there is a path created between an external device and a battery. Note that female contact 374 (FIG. 20) is in contact with male plug's insulated surface 344, thus disabling the flow of power to conductive strip 368A, which leads to the host device. Thus, only a battery and an external device are electrically connected, and a host device is disconnected from both a battery and an external device.

An alternative power path is created when connector 330 in FIG. 20 is rotated, so that its 358 side (bottom, as shown here) faces upward. This orientation places conductive surface 340 facing downward. This path starts in FIG. 20 at conductive barrel 348, then power flows to conductive surface 340. When male plug 330 is inserted into female receptacle 360, conductive surface 340 now electrically addresses female spring contact 374 (instead of spring contact 378, which now is against insulator surface 344 of male plug 330, and therefore electrically disconnected). From spring contact 374, power flows along riser 372, then contact strip 368A to strip terminus 368B. From this terminus a conductor routes the power to a contact on the connector that mates with the host device. Thus, there is an electrical path created between an external device and a host device, while the circuit between the host device and its battery is disabled, as is the circuit between the external device and the battery.

Effectively, the battery is bypassed, and is no longer a part of any active electrical circuit. The circuit thus created by rotating plug 330 (FIG. 20) can now deliver a power signal from an external device, for example a power supply, through the battery housing (bypassing the battery cells) and to the positive and negative contact pads on the battery housing. When the battery pack is in its battery bay in a host device, a complete electrical circuit is created between an external power supply and the host device, with that power signal passing through the battery pack, without affecting the battery cells.

Details of female receptacle 360 in FIG. 20 include an insulator 370 that overlays conductive strip 368A, to protect from a potential short should contact 384/386 deflect downward sufficiently to make electrical contact with conductive strip 368A. Another detail is a pair of barrier walls, of which one is shown as element 376A. This, and the corresponding wall (not shown for clarity), restrains the sideways movement of contacts 386, 374 and 378, as well as preventing sideways movement of the blade of male plug 330.

An attaching shaft 348 allows plug 330 (FIGS. 19 and 20) to be interchangeable with other plugs, using a standard bayonet-style mounting system. Two flanges 352 fit into slots in a mating cord-end female receptacle (not shown), much the way an automotive lamp is installed, by a rotational twist. The outer layer of shaft 348 is conductive, and is electrically connected to conductive element 340 on the blade assembly. An insulator layer 350 electrically separates the two conductive elements 348 and 354.

In summary, connector assembly 381 in FIG. 20 represents a manually-rotated male plug 330 that, in one orientation, can deliver power to (or acquire analog or digital information from) a battery cell cluster in its battery housing. By removing male plug 330, then rotating it axially 180-degrees and reinserting it, a new electrical circuit is created within the battery pack, which makes accessible a host device, through the battery pack. The functionality of connector assembly 381 is similar to that of the plug and receptacle assembly illustrated in FIG. 12 (and detailed in additional FIGS. 13–18B), but connector assembly 381 achieves this functionality with only two conductors on male plug 330. The reduced size and number of contacts and related wiring make this embodiment of the connector assembly that is the invention well-suited for installation within a battery pack.

Circuit Diagram

FIGS. 21A and B show a representation of connector assembly 400, with conductive paths created by a male plug 433 and its mating receptacle. Male connector 433 (shown enlarged in FIG. 21A) has an enclosure 436 around its "blade" assembly, to protect the multi-layered blade from damage, and to reduce any potentials of electrical shock (even though this modality is of a low-voltage connector).

Figure 21B:
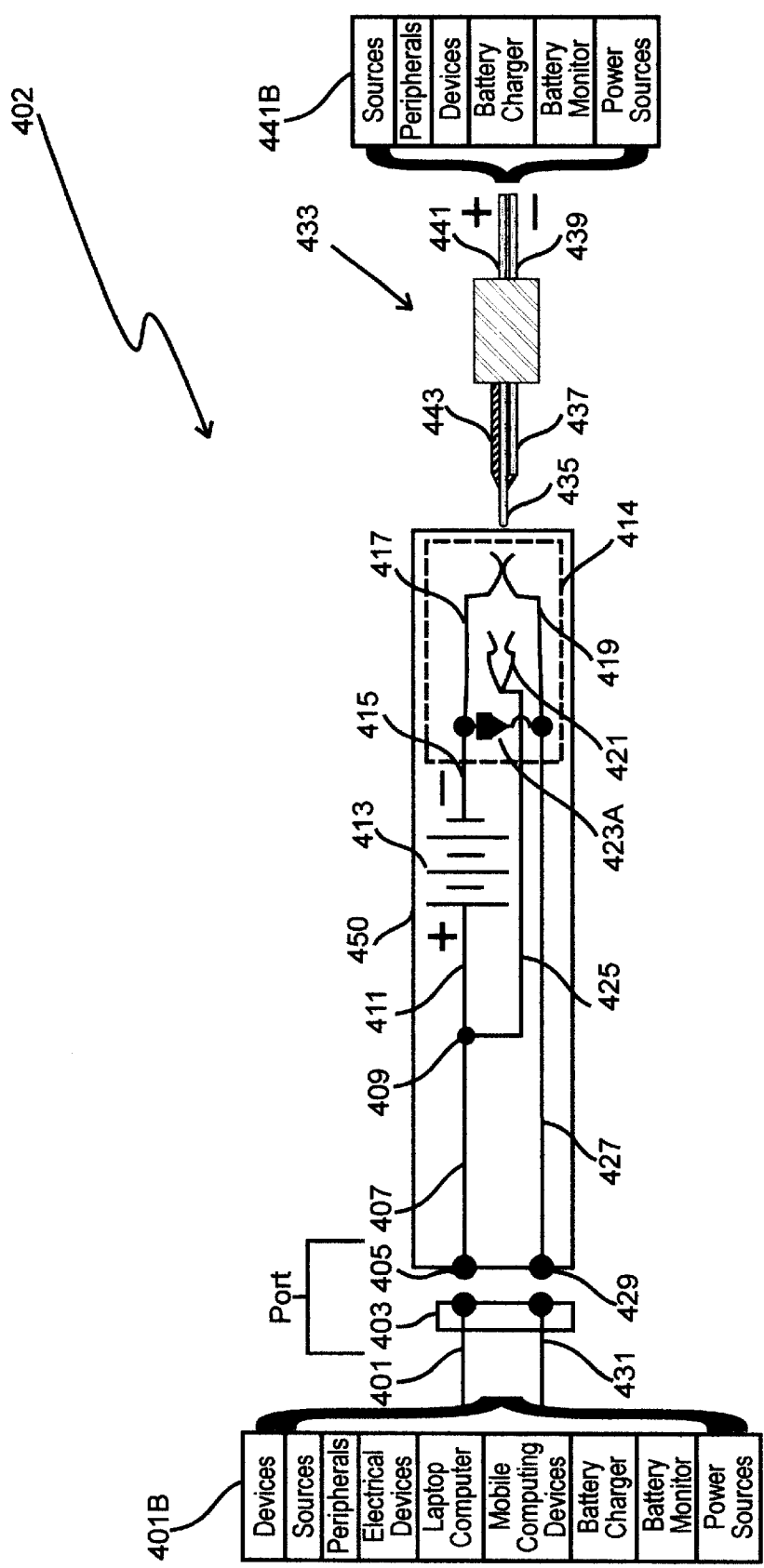
FIG. 21B is a generic diagram that shows a re-configured original conductive path that from the removal of a male connector in FIG. 21A.

Female receptacle 414 in FIG. 21A incorporates a diode 423, which eliminates the need to remove, rotate and reinsert a male blade 433, as previously described in FIGS. 19 and 20. Diode 423 allows power from battery 413 to flow between conductor 415 and conductors 419 or 427. However, power cannot flow in the direction of battery 413, so that a power signal from either a host system (not shown), or an external power source (not shown), cannot travel a path to battery 413 while male plug 433 is inserted. Once male plug 433 is removed, as shown in FIG. 21B, power to a battery 413 can flow across spring contact beams 419 and 417. The diode voltage drop is eliminated by contacts 417 and 419 becoming the dominant electrical path, so that power flows around diode 423, not through it. Diode 423 in FIGS. 21A and B serves the same purpose as diodes 303, 305, and 308 in FIGS. 18A and B, so that the flow of power to or from a battery (or an external power source) can be directionally controlled.

The operation of a connector assembly 400 in FIG. 21A can be illustrated in an example, wherein an external power source is a power supply which includes a voltage comparator circuit. The power supply can configure its output voltage according to one or more acquired power-related parameters. There may be an A/D converter, so that acquired analog information can be output to a controller/processor which configures the power supply's output.

In such a example, it would be beneficial to know the power parameters of the host device, so that the external power supply could be configured to match these power parameters. This can be done by sampling the voltage (and perhaps the current) of battery 413 in FIG. 21A. Battery 413 resides in a battery pack 450. Since battery 413 (which may have a number of cells arranged in a multiplicity of parallel or serial cell configurations), is the matched power source of the host device, an external power source need only match the power output parameters of a battery 413, in order to deliver a correct power signal to the host device.

The voltage parameters of a battery 413 can be sampled using connector assembly 400 in FIG. 21A. From the negative terminal of battery 413, a battery-voltage power signal travels along conductor 415, through diode 423, then along spring-loaded contact beam 419, where the power signal is transferred to male connector 433's conductive layer 437, then exiting along conductor 439 to an external power source.

Battery 413's positive terminal produces a power signal that flows along conductor 411 (FIG. 21A), then along intersecting conductor 425, to a spring-loaded conductor 421, which mechanically and electrically holds the conductive tip 435 of male plug 433. The power signal then flows through male connector 433 along its conductor 441, then out to an external power supply. The external power supply is thus able to read the voltage of a battery 413 and, if necessary, place a line load on the battery's output to read battery voltage under load. Voltage readings would be slightly depressed by diode 423 being in the circuit, but this slight voltage drop can be compensated for in the calculations done in the external device's controller/processor.

A Hall-effect device, or other methods of reading current known to those skilled in the art, can be used to acquire battery 413's current-delivery parameters, but these may not be necessary to the proper operation of the external power source.

Dominant-Voltage Effect

The output voltage of an external power supply has to be greater than the output voltage of battery 413 (FIGS. 21A and B). If not, battery 413's higher voltage will be dominant, and the battery will power the host device, instead of power coming from the external power supply. The dominant-voltage effect allows battery 413's power signal to immediately become available through diode 423, should the external power supply ever lose power. Thus, the host device's battery 413 remains a viable alternative source of power, even when male plug 433 is still inserted in its mating receptacle.

Once the external power source has acquired voltage information from a battery 413, a power supply that can configure its output voltage sets its output power signal to the optimal parameters, and then delivers that power to the host device. From the power supply, a power signal (positive pole) travels to male connector 433 (FIG. 21A) along its conductor 441, which is electrically tied to a blade center conductor 435 that is captured electrically by a spring-loaded conductive element 421, then the power signal flows along conductor 425 inside battery pack 450, where it transitions to a conductor 407, and then into battery pack 450's connector contact 405. Since battery pack 450 is inserted in the battery compartment of its associated host device, host device connector 403 transfers the power signal to conductor 401 inside the host device.

The negative power signal from the external power supply flows into male connector 433 in FIG. 21A along conductor 439, then to conductive surface 437, where female receptacle 414's spring contact 419 transfers the power signal to conductor 427, then at battery pack 450's connector contact 429, the power signal is transferred host device's connector 403, and finally along conductor 431 in the host device. Note that diode 423 prevented the power signal from flowing into battery 413.

Thus, without having to remove, rotate and reinsert male plug 433, connector assembly 400 in FIG. 21A allows power to flow both from battery 413 to an external power source, while battery power can also flow to its associated host device and, without reconfiguring the connector, power from an external device can also flow to a host device, but not to battery 413.

When male plug 433 is removed from receptacle 414 in battery pack 450, as illustrated diagrammatically in FIG. 21B, diode 423 becomes electrically transparent, as a negative-polarity power signal from battery 413 flows along conductor 415 and through spring contact 417, where the closed circuit formed by contacts 417 and 419 allow power to flow on to conductor 427, to battery pack 450's contact 429 that mates with its associated host device, so that host device's connector 403 transfers power to conductor 431.

The positive terminal of battery 413 (FIG. 21B) puts a power signal on conductor 411 and 407, directly to battery pack 450's contact 405 that mates with its associated host device, so that host device's connector 403 transfers power to conductor 431.

SUMMARY AND SCOPE

The benefits of a connector assembly that creates different electrical paths when a male plug is inserted or removed may, for example, include (but are not limited to) the following:

1) Diminish the need to be charging a battery pack when an external power source is available. By not charging a battery every time a host device is connected to an external source of power, the life expectancy of the battery is increased. Since most rechargeable battery-powered electronic devices automatically charge their batteries when external power is connected, the use of a connector that disables the battery charge function increases the useful life of the battery, thus reducing total operating cost.

2) Some locations may not find battery charging practical. Battery charging can consume 20–40% of the entire load schedule of a host device's power requirements. If a car's battery is low, operating a host device such as a laptop that is powered from the dashboard outlet could result in a stranded motorist.

3) Some transportation locations may not be suitable for battery charging. There is some risk in charging batteries, especially high-density Lithium-Ion batteries. An airline, or cruise ship operator, for example, may wish to limit the risk of an onboard battery-related fire or explosion. A simple and cost effective method would be to use battery packs and power cords that have a connector which disables the charge function, while still allowing an external power supply to power the host device only.

4) Extended-run-time external battery packs can be used to supplement a host-device's associated battery. These extra-high-capacity battery packs connect to a host device's existing power input jack. So configured, the external battery pack most likely is dedicating some of its stored energy to charging the host device's battery. This occurs because host systems are designed to charge the associated battery whenever external power is available. As a power source, a host device usually does not distinguish an external battery from an AC/DC wall adapter, for example, so the extended-run-time battery loses its effectiveness by having to relinquish some amount of its stored energy to charging the host's battery. By using a connector as defined herein, the external battery pack can be routed through the host device's existing battery pack and, by doing so, the charging circuits with the host device are temporarily disabled while the external battery source is in use. This enhances the run-time of the external battery pack, and also eliminates inefficient energy transfers between the two batteries.

These non-limiting examples of applications for a connector assemblies such as those described in this document show some real-world uses.

Basic Design Parameters

Some of the design parameters achieved by the connector assemblies discussed herein include:

1) Small package size, especially for the female receptacle, since available space within battery packs is limited.
2) Straightforward way to integrate a female connector into an existing battery pack, or to install the receptacle in a new battery pack design in a way that doesn't require an inordinate amount of extra tooling or assembly.
3) Inexpensive
4) Simplicity of use Ramifications A number of advantages of the connector assembly of the present invention become evident:

(a). A simple, low-cost connector can be used to electrically separate two devices, or a host device and its power system.

(b). By isolating the battery source, or a peripheral, from the original host device, new circuits are created that allow external power sources or battery chargers to perform more safely because the battery voltage can be verified before that external power is applied to a host device.

(c). Because the male plug can function as a "key" that has more than one position, additional circuits or wiring configurations can be created to perform specialty functions or operations.

(d). As a "key," the male connector can be interchangeable at the end of a power or data cord, to afford access control to equipment or electronic devices.

(e). With very small form factors, the connector can be embedded inside a battery pack, to make it a self-contained device that has a special power or data interface to external power or charging devices, or monitoring equipment. This can be accomplished without having to rewire or otherwise modify the host device. By replacing the existing battery pack with one configured with the connector, the functionality of both the battery and host device is enhanced, without permanent reconfigurations to either the battery pack or host device.

(f). The connector can be used as a replacement for an existing input power jack with minimal modifications or rewiring.

(g). Problems in changing both male and female connectors on electronic devices that have incompatible external adapter output voltages are no longer necessary. Instead, the female receptacle is simply wired in a different configuration, and a new male plug is used to differentiate the two incompatible external adapters. Any fear of possible mismatched voltages between external power adapters and host devices is eliminated.

(h). In certain modalities of the connector that use a female connector that self-closes to reinstate a circuit, the need for an ON/OFF power switch in conjunction with a power input jack is eliminated. The male plug is configurable to turn the host device on when the plug is inserted into the female receptacle.

(i). Certain modalities of the connector can be equipped with a latching mechanism that secures the male and female assemblies, an important feature for devices like laptops that are often moved around the local area in industrial or service applications.

(j). In certain environments, host devices that automatically charge their batteries when external power is applied can be easily modified by inserting a battery pack that has the connector installed. Thus configured, the host device is rendered compliant.

(k). Monitoring battery charging can be done by an external device attached to the connector.

(l). Simultaneous battery monitoring and power delivery from an external device can be done without modifying the internal circuitry of the host device.

(m). By installing an N-signal switch that switches in response to applied power signals, and locating that switch in either the male or female assemblies of the connector, battery monitoring and power delivery can occur with a two-conductor cable that shares more than two contacts in the connector.

Although the description above contains many specificities, these should not be construed as limiting the scope of the invention, but as merely providing illustrations of some of the presently preferred embodiments of this invention. For example, the diodes in the female receptacle of FIGS. 21A and B can also be used on all other females, and the diode in male plug 307 (FIGS. 18A and B) also has uses in all other male plugs.

Thus, the scope of the invention should be determined by the appended claims and their legal equivalents, rather than by the examples given.

Thus, a method and apparatus for transferring electrical signals including power and input/output information among multiple electrical devices and their components is described in conjunction with one or more specific embodiments. The invention is defined by the claims and their full scope of equivalents.

What is claimed is:

1. A connector assembly for transfer of electrical signals among a plurality of selectable sources, devices, or peripherals, said connector assembly comprising:

a selectively positionable connector plug comprising a conductive pin having one or more selectively conductive sections and one or more selectively insulated sections; and a connector receptacle for receiving said positionable connector plug, said receptacle comprising one or more conductive contacts for receiving said one or more selectively conductive or selectively insulated sections of said positionable conductive pin;

wherein at least one selectable position of the positionable connector plug aligns said one or more selectively conductive sections and at least one of said selectively insulated sections of said pin with said receptacle's one or more conductive contacts for selectively engaging at least one of said conductive sections with at least one conductive contact, and at least one of said insulated sections with at least one conductive contact, thereby causing the transfer of one or more electrical signals between at least one of said plurality of selectable device, sources, or peripherals thereof attached to said selectively positionable connector plug and at least one of said plurality of selectable devices, sources, or peripherals attached to said connector receptacle.

2. The connector assembly of claim 1, wherein said one or more conductive contacts are pre-tensioned to form at least a first closed circuit; and said positioning of said conductive pin aligns said one or more selectively insulated sections to engage said receptacle's pre-tensioned conductive contacts for disrupting at least said first closed circuit; said positioning of said pin also aligns one or more selectively conductive sections to engage said receptacle's pre-tensioned conductive contacts for forming at least a second closed circuit.

3. The connector assembly of claim 2, wherein a selecting of a first position of said positionable connector plug aligns said one or more selectively conductive sections and at least one of said selectively insulated sections of said pin with said receptacle's one or more conductive contacts for selectively engaging at least one of said conductive sections with at least one conductive contact, and at least one of said insulated sections with at least one conductive contact; whereby the selecting of said first position causes a device selected from among a plurality of selectable devices, sources or peripherals to transfer one or more particular electrical signals along said second closed circuit.

4. The connector assembly of claim 3, wherein a selecting of a second position of said positionable connector plug aligns said one or more selectively conductive sections and at least one of said selectively insulated sections of said pin with said receptacle's one or more conductive contacts for selectively engaging at least one of said conductive sections with at least one conductive contact, and at least one of said insulated sections with at least one conductive contact; wherein the selecting of said second position causes a source selected from among a plurality of selectable devices, sources or peripherals to transfer one or more particular electrical signals to said selected device accessible along said second closed circuit.

5. The second position of claim 4, wherein said selected device is an electrical device and said selected source is a power source.

6. The connector assembly of claim 1, wherein said at least one of said plurality of selectable devices, sources or peripherals attached to said connector plug is an electrical device and said at least one of said plurality of selectable devices, sources or peripherals attached to said connector receptacle is a battery.

7. The second closed circuit of claim 4, wherein said selected device is a power source and said selected source is a battery.

8. The connector assembly of claim 1, wherein said at least one of said plurality of selectable devices, sources or peripherals attached to said connector plug is a battery charger and said at least one of said plurality of selectable devices, sources or peripherals attached to said connector receptacle is a battery.

9. The connector assembly of claim 1, wherein said selected device is a battery and said selectable source is a battery monitor.

10. The connector assembly of claim 1, wherein one or more of said plurality of selectable devices, sources, or peripherals includes:
   one of said plurality of selected devices being a battery-powered electrical device;
   a first source being a battery; and
   a second source being a power source other than the battery of said first source.

11. The apparatus of claim 1, wherein one or more of said plurality of selectable devices, sources, or peripherals includes:
   one of said plurality of selectable devices, sources, or peripherals being a battery having an interface port accessible to an electrical device for transferring electrical signals, the battery being attached to said connector receptacle;
   the electrical device accessing said connector receptacle at the battery interface port; and
   a power source capable of transferring electrical signals, the power source being attached to said positionable connector plug;
   wherein mating said positionable connector plug to said connector receptacle disengages access for transferring electrical signals between the battery and the electrical device, and the mating also engages access for transferring electrical signals between the power source and the electrical device.

12. The connector assembly of claim 1, wherein the electrical signals being transferred are either analog or digital.

13. The connector assembly of claim 12, wherein one or more of said electrical signals are selectively transferred among said one or more selected devices, sources, or peripherals based on one or more of said analog or digital signals as control signals.

14. The connector assembly of claim 13, wherein said one or more electrical signals are adjusted based on one or more of said analog or digital signals as control signals.

15. An apparatus for transfer of electrical signals among one or more selectable devices, sources, or peripherals, said apparatus comprising:
   a connector receptacle for transferring said electrical signals of one or more devices, sources, or peripherals selected from among said selectable devices, sources, or peripherals;
   said receptacle including two normally-closed spring-loaded beams terminating at selectable first and second opposing contacts, so that a conductor of the first opposing contact accesses at least a first of the one or more selected devices, sources, or peripherals, while a conductor of the second opposing contact is capable of accessing a second of the one or more selectable devices, sources, or peripherals;
   said receptacle further includes a separate third contact having a conductor accessible to both the first and second devices, sources, or peripherals;
   a configurable connector plug for electrically interconnecting at least a third device, source, or peripheral selected from among said selectable devices, sources, or peripherals;
   said plug having an insulator and a first conductive segment, both segments being so positioned as to selectively attach the insulator segment to either the first self-opposing contact of the receptacle in a first selected configuration, or to the second self-opposing contact of the receptacle in a second selected configuration;
   either selected configuration thereby also electrically coupling the first conductive segment at the plug to the remaining non-selected opposing contact of the receptacle;
   said configurable plug further having a separate second conductive segment being so positioned as to electrically couple to the separate third contact of the receptacle, and
   respective conductors of the first and second conductive segments of the plug for attaching at least the third device, source or peripheral,
   wherein said first configuration of the plug is followed by said second configuration, so that electrical signals are transferred among the first, second, and third selected devices, sources, or peripherals.

16. The apparatus of claim 15, wherein at least one of said first or second selected configurations of said connector plug causes said electrical signals to be selectively transferred between either at least one of the said first or second selected devices, sources, or peripherals attached at said receptacle and said third selected device, source, or peripheral attached at said plug.

17. The apparatus of claim 15, which further includes a device for controlling the flow of electrical signals strapped across said spring-loaded beams, causing only an outward electrical flow from said first device, source, or peripheral at said receptacle; wherein said first selected configuration of said connector plug causes said second selected device, source, or peripheral to be accessible for transfers of electrical signals between said first and second selected devices, sources, or peripherals, and further transfers between said first and third devices, sources, or peripherals and said second and third selected devices, sources, or peripherals.

18. The configuration of claim 17, wherein said first selected device, source, or peripheral is an electrical device; said second selected device, source, or peripheral is a battery monitor and said third selected device, source, or peripheral is a battery charger.

19. The configuration of claim 17, wherein said second selected device, source, or peripheral is an electrical device and said first selectable device, source, or peripheral is a battery.

20. The configuration of claim 17, wherein said second selected device, source, or peripheral is a mobile computing device and said third selected device, source, or peripheral is a power source.

21. The first configuration of claim 17, wherein said one or more selectable devices, sources, or peripherals include:
   one of said selected devices, sources, or peripherals being a battery;
   a second selected device, source, or peripheral being a battery-powered electrical device; and
   a third selected device, source, or peripheral being a power source other than the battery of the first selected device, source, or peripheral.

22. The apparatus of claim 15, wherein the electrical signals are either analog or digital.

23. A connector assembly for transfer of electrical signals among one or more selected devices, said connector assembly comprising:
   a configurable connector plug comprising a conductive pin having one or more conductive segments that are selectively configured for transferring electrical signals;
   the plug further comprising an insulator segment so positioned along the length of the pin as to oppose at least one of the conductive segments in an alignment that exposes both the insulator and conductive segments for attaching to selective segments of a connector receptacle;
   the connector receptacle for receiving said connector plug comprising contacts for selectively attaching to said one or more selectively configured conductive or insulator segments of said connector plug;
   wherein upon mating of the configured connector plug and the connector receptacle, said one or more electric signals are transferred between said connector plug's one or more selectively configured conductive segments and said connector receptacle's mating contacts and, therefrom, transferred selectively among each of the one or more selected devices that are electrically accessible to the plug and receptacle.

24. The connector assembly of claim 23, wherein the connector assembly is reconfigured for selecting a device from among interconnected devices to be inaccessible for transferring electrical signals, wherein:
   said connector plug presents said insulator segment for attaching to a receptacle contact that previously attached to plug's said opposing conductive segment, so that the receptacle contact becomes electrically inactive, thereby causing electrical signals of at least one from among the one or more interconnected devices to be inaccessible.

25. An apparatus for redirecting a transfer of electrical signals at an electrical device, comprising:
   first source of electrical signals having conductors coupled to contacts accessible to a port at the electrical device;
   a receptacle attached to said conductors for providing access to a second source of electrical signals, comprising self-closing contacts along at least one of said conductors for establishing a closed connection between the first source and the electrical device; and
   a configurable plug for attaching the second source of electrical signals to the receptacle, comprising at least one of one or more insertable contacts having opposing conductive and insulated surfaces, each accessible to the self-closing contacts at the receptacle;
   wherein a first configuration of the inserted plug causes the self-closing contacts at the receptacle to be separated so that the plug contact's insulated surface couples to the self-closing contact directed to the first source, thereby disengaging said first source from the contacts accessible to said port at the electrical device; and further
   wherein said plug contact's conductive surface couples to the self-closing contact directed to the electrical device, thereby engaging said second source to the contacts accessible to said port at the electrical device;
   thereby redirecting a transfer of electrical signals between said second source and the electrical device, instead of said first source.

26. The apparatus of claim 25, wherein the first source is a battery and the second source is a power source, so that electrical signals for transfer between said battery and said electrical device are disengaged when said power source is attached to said receptacle, and instead said electrical signals transfer between said power source and said electrical device.

27. The apparatus of claim 25, wherein a second configuration of said configurable plug causes the self-closing contacts to be separated so that said plug's insulated surface couples to the self-closing contact directed to the electrical device, disengaging said second source from the contacts accessible to said port at the electrical device; and further
   wherein said plug's conductive surface couples to the self-closing contact directed to the first source, engaging said second source to said first source;
   thereby redirecting a transfer of electrical signals between said second source and the first source, instead of said electrical device.

28. The apparatus of claim 27, wherein the first source is a battery and the second source is a power source, so that electrical signals for transfer between said second source and said electrical device are disengaged when said power source is attached to said receptacle, and instead said electrical signals transfer between said power source and said battery.

29. The apparatus of claim 27, wherein said plug's conductive surface couples to the self-closing contact directed to said first source as a battery, thereby electrically connecting said battery to said second source as a power source that configures its controlled output based on electrical signals transferred between said battery and said power source.

30. The apparatus of claim 27, wherein in said plug's second configuration its conductive surface couples to the self-closing contact directed to said first source as a battery for electrically connecting said battery to said second source as a power source that configures its controlled output based on electrical signals transferred between said battery and said power source;
   wherein after said plug is reconfigured in a first configuration so that its insulated surface couples to the self-closing contact directed to said battery; and
   said plug's conductive surface couples to the self-closing contact directed to said electrical device for directing said power source's configured output to said electrical device;

thereby said electrical device is powered from said power source without charging said battery.

31. The apparatus of claim 30, wherein a device for controlling the direction of electrical flow is strapped across the conductors coupled to the self-closing contacts, directing said electrical flow only toward said battery; thereby eliminating said first plug configuring.

32. The apparatus of claim 30, wherein said power source is embedded in a transportation vehicle and said battery is for powering a mobile computing device.

33. The apparatus of claim 30, wherein said power source is an external power-conversion module and said battery is for powering a mobile computing device.

34. The apparatus of claim 27, wherein said transferred electrical signals are analog or digital.

35. The apparatus of claim 29, wherein upon said plug is reconfigured so that its conductive surface couples to the self-closing contact directed to said electrical device, thereby directing said power source's configured output to said electrical device.

36. The apparatus of claim 25, wherein said receptacle is installed in a battery housing.

37. The apparatus of claim 25, wherein said receptacle is installed in an accessible area of said electrical device, replacing a power-input jack.

38. The apparatus of claim 25, wherein said electrical signals for transfer are analog or digital.

39. A connector assembly for transfer of electrical signals among one or more selected devices, said connector assembly comprising:

a configurable connector plug comprising a flat conductive surface aligned longitudinally with a flat insulator surface on opposing faces of the plug so that each surface engages one of a pair of pre-tensioned opposed contacts at a receptacle;

said plug further including an elongated isolated contact centrally positioned between said insulator and conductive surfaces, said isolated contact and conductive surface being accessible by conductors to a first selected device for transferring electrical signals;

a connector receptacle interposed along a first conductor electrically coupling a second and third selected device, said receptacle having a pair of opposing spring-loaded beams, each with a pre-tensioned contact electrically engaged to the other, so that a first pre-tensioned contact accesses the second selected device, and a second pre-tensioned contact accesses the third selected device; and the receptacle further including at least a third isolated contact interposed along a second conductor that electrically couples the second and third devices, whereby mating the connector plug to the receptacle opens the first pre-tensioned contact to engage said plug's insulator surface, thereby electrically isolating said second selected device from said third selected device and, further, whereby said mating opens the second pre-tensioned contact to selectively engage said plug's conductive surface and the isolated contact of said plug engages said receptacle's third isolated contact, thereby electrically coupling said first device to said third device, so that electrical signals are no longer transferred between said second and third selected devices but, instead, are now transferred between said first and third devices.

40. The connector assembly of claim 39, wherein said electrical signals are power signals and a device for controlling the direction of electrical flow is strapped across the receptacle's opposing beams, so that power signals are capable of flowing outward from said second device to said first pre-tensioned contact; and thereby said power signals are accessible to both said first and third selected devices.

41. The connector assembly of claim 39, wherein a reconfigured connector plug is mated to said receptacle so as to open the engaged contacts of the opposing beams, so that said second pre-tensioned contact selectively engages said plug's insulator area and, thereby, electrically isolates said third selected device; and further, said first pre-tensioned contact selectively engages said plug's conductive surface and, thereby, partially couples said first selected device to said second selected device; and further the isolated contact of said plug engages said receptacle's third isolated contact, thereby fully coupling said first selected device to said second selected device, so that electrical signals are no longer transferred between said first and third selected devices and, instead, one or more electrical signals are now transferred between said first selected device and said second selected device.

42. An apparatus for redirecting a transfer of electrical signals at an electrical device, comprising:

a first source of electrical signals having conductors electrically coupled to contacts accessible to a port at said electrical device;

a receptacle attached to said conductors for providing access to a second source of electrical signals, comprising self-closing contacts along at least one of said conductors for establishing a closed connection between the first source and the electrical device; further including a device for controlling the direction of electrical flow strapped across the conductors to the self-closing contacts for providing access to electrical signals directed only from said first source; and a plug for attaching said second source of electrical signals to the receptacle, comprising at least one of one or more insertable contacts having opposing conductive and insulated surfaces, each accessible to the self-closing contacts at the receptacle;

wherein the plug's at least one insertable contact opens the receptacle's self-closing contacts, so the plug contacts insulated surface couples to the self-closing contact along the conductor directed to the first source, disengaging said first source from the contacts accessible to said port at the electrical device; and further wherein said plug contact's conductive surface couples to the self-closing contact along the conductor directed to the electrical device, engaging said second source to the contacts accessible to said port at the electrical device;

thereby redirecting a transfer of electrical signals between said second source and the electrical device, instead of said first source, while said device for controlling the direction of electrical flow provides said second source and the electrical device access to electrical signals from said first source.

* * * * *